(12) United States Patent
Xi et al.

(10) Patent No.: US 12,375,007 B2
(45) Date of Patent: Jul. 29, 2025

(54) INVERTER POWER ASSEMBLY

(71) Applicant: Atlas Copco (Wuxi), Compressor Co., Ltd., Jiangsu (CN)

(72) Inventors: Wenjie Xi, Jiangsu (CN); Jiawei Xu, Jiangsu (CN)

(73) Assignee: Atlas Copco (Wuxi) Compressor Co., Ltd., Jiangsu (CN)

( * ) Notice: Subject to any disclaimer, the term of this patent is extended or adjusted under 35 U.S.C. 154(b) by 308 days.

(21) Appl. No.: 17/914,393

(22) PCT Filed: Apr. 1, 2021

(86) PCT No.: PCT/CN2021/084892
§ 371 (c)(1),
(2) Date: Sep. 26, 2022

(87) PCT Pub. No.: WO2021/197409
PCT Pub. Date: Oct. 7, 2021

(65) Prior Publication Data
US 2023/0114922 A1  Apr. 13, 2023

(30) Foreign Application Priority Data

Apr. 1, 2020 (CN) .......................... 202020462983.1
Feb. 9, 2021 (CN) .......................... 202120366611.3

(51) Int. Cl.
*H02M 7/00* (2006.01)
*H05K 7/14* (2006.01)
*H05K 7/20* (2006.01)

(52) U.S. Cl.
CPC ........ *H02M 7/003* (2013.01); *H05K 7/14324* (2022.08); *H05K 7/14329* (2022.08); *H05K 7/20927* (2013.01)

(58) Field of Classification Search
CPC .............. H05K 7/20927; H05K 1/182; H05K 7/14324; H05K 7/14329; H05K 1/0263;
(Continued)

(56) References Cited

U.S. PATENT DOCUMENTS 8,503,209 B2  8/2013  Tokuyama et al.
8,971,041 B2  3/2015  Sharaf et al.
(Continued)

FOREIGN PATENT DOCUMENTS

CN     103872924 A    6/2014
CN     204290687 U    4/2015
(Continued)

OTHER PUBLICATIONS

International Search Report in corresponding PCT Application No. PCT/CN2021/084892, dated Jun. 25, 2021.
(Continued)

*Primary Examiner* — Adam B Dravininkas
(74) *Attorney, Agent, or Firm* — BACON&THOMAS, PLLC

(57) ABSTRACT

An inverter power assembly includes: a mounting frame; a power module mounted on the mounting frame; and a capacitor electrically connected to the power module. The inverter power assembly has the power module mounted on the mounting frame and the capacitor electrically connected to the power module, which leads to a simple and compact structure and a reasonable arrangement for the entire inverter power assembly.

17 Claims, 31 Drawing Sheets

(58) Field of Classification Search
CPC .......... H05K 2201/10272; H05K 2201/10757; H05K 7/2089; H05K 7/209; H05K 7/1432; H05K 7/20254; H05K 7/20936; H05K 7/20872

See application file for complete search history.

(56) References Cited

U.S. PATENT DOCUMENTS

| | | |
|---|---|---|
| 10,418,766 B2 | 9/2019 | Jiang |
| 2004/0062005 A1 | 4/2004 | Pfeifer et al. |
| 2009/0021971 A1* | 1/2009 | Korich ............... H05K 7/20927 363/141 |
| 2013/0104592 A1* | 5/2013 | Cottet ............... H05K 7/14325 62/407 |
| 2013/0107455 A1* | 5/2013 | Cottet ............... H02M 7/4835 361/694 |
| 2014/0022727 A1* | 1/2014 | Bertotto ............... H01L 23/473 361/689 |
| 2016/0309623 A1* | 10/2016 | Lei ........................ B60L 58/10 |
| 2016/0309624 A1* | 10/2016 | Lei ..................... H05K 7/20927 |
| 2017/0223875 A1 | 8/2017 | Tsuyuno et al. |
| 2017/0265337 A1* | 9/2017 | Lei ....................... H02M 7/5387 |
| 2018/0140263 A1 | 5/2018 | Jung |

FOREIGN PATENT DOCUMENTS

| | | |
|---|---|---|
| CN | 207150407 U | 3/2018 |
| CN | 108075672 A | 5/2018 |
| CN | 207475418 U | 6/2018 |
| CN | 212850219 U | 3/2021 |
| WO | WO2019158390 A1 | 8/2019 |

OTHER PUBLICATIONS

Supplemental European Search Report cited in corresponding Appln. No. EP21779113 dated Jul. 31, 2024.

* cited by examiner

A" –A"

INVERTER POWER ASSEMBLY

CROSS-REFERENCE TO RELATED APPLICATION

The present application claims priority to Chinese Patent Application No. 202020462983.1, titled "INVERTER POWER ASSEMBLY", filed by ATLAS COPCO (WUXI) COMPRESSOR CO., LTD., on Apr. 1, 2020, and Chinese Patent Application No. 202120366611.3, titled "Heat Sink", filed by ATLAS COPCO (WUXI) COMPRESSOR CO., LTD., on Feb. 9, 2021, both of which are hereby incorporated by reference in their entireties.

FIELD OF THE INVENTION

The present disclosure relates to the technical field of inverters and, more particularly, to an inverter power assembly.

BACKGROUND OF THE INVENTION

The inverter power assembly includes a power module and a capacitor, and the capacitor is electrically connected to the power module. However, in the existing inverter power assembly, an arrangement of the power module and the capacitor is often unreasonable, which makes it impossible to select relatively large specifications for the capacitor, and when the capacitor is electrically connected to the power module, there are more connecting components, resulting in a complex structure and a bulky volume of the entire inverter power assembly. In addition, a cooling structure of the power module is usually mounted on a mounting frame together with the power module, which will also lead to the bulky volume of the inverter power assembly.

SUMMARY OF THE INVENTION

The present disclosure aims to solve one of the above technical problems in the related art at least to a certain extent. In view of this, the present disclosure proposes an inverter power assembly, which has a simple and compact structure.

The inverter power assembly according to an embodiment of the present disclosure includes a mounting frame, a power module mounted on the mounting frame, and a capacitor electrically connected to the power module, the mounting frame includes: a mounting underframe and at least one mounting branch-arm. The mounting branch-arm is arranged on the mounting underframe, and the power module is mounted on the mounting branch-arm.

The inverter power assembly according to an embodiment of the present disclosure, by mounting the power module on the mounting frame and then electrically connecting the capacitor with the power module, can make the entire inverter power assembly have a simple, compact structure and reasonable arrangement.

Furthermore, the mounting branch-arm and the mounting underframe are provided therein with cooling chambers in communication with each other.

Specifically, the cooling chamber includes: an underframe cooling chamber located in the mounting underframe and a branch-arm cooling chamber located in the mounting branch-arm. The branch-arm cooling chamber is in communication with the underframe cooling chamber.

Furthermore, a partition plate is arranged in the branch-arm cooling chamber, the partition plate divides the branch-arm cooling chamber into a branch-arm inlet chamber and a branch-arm outlet chamber, and the partition plate is separated from an inner top wall of the branch-arm cooling chamber, in such a manner that the branch-arm inlet chamber and the branch-arm outlet chamber are in communication with each other at top of the branch-arm cooling chamber.

Specifically, the mounting underframe is provided with a first medium port and a second medium port that are in communication with the underframe cooling chamber, one of the first medium port and the second medium port is a medium inlet, and the other is a medium outlet.

Alternatively, the first medium port, the underframe cooling chamber, the branch-arm inlet chamber, the branch-arm outlet chamber, and the second medium port are connected in series to form a medium passage therebetween.

Specifically, there is a plurality of mounting branch-arms, and the branch-arm outlet chamber of the mounting branch-arm located at an upstream side of the medium passage is in communication with the branch-arm inlet chamber of the adjacent mounting branch-arm at a downstream side of the medium passage through the underframe cooling chamber.

According to some embodiments of the present disclosure, the mounting frame further includes a capacitor support element having one end fixed on the mounting branch-arm and the other end adapted to support the capacitor.

According to some embodiments of the present disclosure, the mounting frame further includes a mounting upper-frame arranged at top of the mounting branch-arm and adapted to support the capacitor, and the power module is located between the mounting upper-frame and the mounting underframe.

Further, the mounting upper-frame, the mounting branch-arm and the mounting underframe are provided therein with cooling chambers that are in communication with each other.

Specifically, the cooling chambers include: an underframe cooling chamber located in the mounting underframe, an upper-frame cooling chamber located in the mounting upper-frame, and a branch-arm cooling chamber located in the mounting branch-arm. The branch-arm cooling chamber is in communication with the upper-frame cooling chamber and the underframe cooling chamber.

According to some embodiments of the present disclosure, the branch-arm cooling chamber is a single-channel chamber structure.

According to some embodiments of the present disclosure, a partition plate is provided in a chamber of the branch-arm cooling chamber, the partition plate divides the branch-arm cooling chamber into a plurality of branch-arm sub-chambers, and each of the branch-arm sub-chambers is in communication with the upper-frame cooling chamber and the underframe cooling chamber.

According to some embodiments of the present disclosure, the mounting underframe is provided with a first medium port in communication with the underframe cooling chamber, the mounting upper-frame is provided with a second medium port in communication with the upper-frame cooling chamber, one of the first medium port and the second medium port is a medium inlet, and the other is a medium outlet.

Alternatively, the second medium port, the upper-frame cooling chamber, the branch-arm cooling chamber, the underframe cooling chamber, and the first medium port are connected in serial to form a medium passage.

Further, there is a plurality of the mounting branch-arms, a bottom end of the branch-arm cooling chamber of the mounting branch-arm in communication with the second medium port is in communication with a bottom end of the branch-arm cooling chamber of the adjacent mounting branch-arm through the underframe cooling chamber, a top end of the branch-arm cooling chamber of the mounting branch-arm that is in communication with the first medium port is in communication with a top end of the branch-arm cooling chamber of the adjacent mounting branch-arm through the upper-frame cooling chamber, and the branch-arm cooling chambers of the other two adjacent mounting branch-arms are in communication with each other in series through the upper-frame cooling chamber or through the underframe cooling chamber.

Alternatively, the mounting upper-frame is parallel to the mounting underframe.

Alternatively, the mounting branch-arm is perpendicular to the mounting underframe.

According to some embodiments of the present disclosure, a plurality of fins is provided in the branch-arm cooling chamber, the plurality of the fins has one end connected to the partition plate and the other end connected to a chamber wall of the branch-arm cooling chamber, and a fin sub-chamber is formed between two adjacent ones of the fins.

Alternatively, the plurality of the fins is parallel to each other.

According to some embodiments of the present disclosure, the mounting underframe includes a first underframe and a second underframe. The mounting branch-arm is set up on the first underframe and the second underframe.

Further, cooling chambers in communication with each other are provided in the mounting branch-arm, the first underframe and the second underframe.

Specifically, the cooling chambers include: a first cooling chamber located in the first underframe, a second cooling chamber located in the second underframe and a branch-arm cooling chamber located in the mounting branch-arm. The first cooling chamber and the branch-arm cooling chamber are in communication with the second cooling chamber.

According to some embodiments of the present disclosure, the first underframe is provided with a first medium port in communication with the first cooling chamber, the second underframe is provided with a second medium port in communication with the second cooling chamber, one of the first medium port and the second medium port is a medium inlet, and the other is a medium outlet.

Alternatively, there is a plurality of the mounting branch-arms, and the plurality of the branch-arm cooling chambers is arranged in parallel between the first cooling chamber and the second cooling chamber.

According to some embodiments of the present disclosure, the first underframe is provided with a first underframe interface in communication with the first cooling chamber, the second underframe is provided with a second underframe interface in communication with the second cooling chamber, the mounting branch-arm is provided with a branch-arm first interface and a branch-arm second interface that are in communication with the branch-arm cooling chamber, the branch-arm first interface is in communication with the first underframe interface, and the branch-arm second interface is in communication with the second underframe interface.

According to some embodiments of the present disclosure, at least one side surface of two reversely arranged side surfaces of each of the mounting branch-arms is mounted with the power module.

According to some embodiments of the present disclosure, one of the mounting branch-arm and the power module is provided with a positioning protrusion, and the other is provided with a positioning recess adapted to position and mate with the positioning protrusion.

According to some embodiments of the present disclosure, the capacitor is located on top of the mounting frame.

Further, the inverter power assembly further includes: a first polar plate and a second polar plate. The first polar plate and the second polar plate are arranged at an end of the power module, and both the power module and the capacitor are electrically connected to the first polar plate and the second polar plate.

Further, the capacitor has a first terminal and a second terminal, the first terminal is adapted to be electrically connected to the first polar plate, and the second terminal is adapted to be electrically connected to the second polar plate.

Further, a first capacitor connecting portion is provided on the first polar plate, and the first terminal is electrically connected to the first capacitor connecting portion. A second capacitor connecting portion is provided on the second polar plate, and the second terminal is electrically connected to the second capacitor connecting portion.

Specifically, the first capacitor connecting portion and the second capacitor connecting portion are configured as plate-shaped structures located between the capacitor and the mounting frame.

According to some embodiments of the present disclosure, the power module has a first busbar and a second busbar, the first busbar is electrically connected to the first polar plate, and the second busbar is electrically connected to the second polar plate.

Further, the first polar plate is provided with a first polar piece, and the first polar piece extends towards the power module and is adapted to be electrically connected to the first busbar. The second polar plate is provided with a second polar piece, and the second polar piece extends towards the power module and is adapted to be electrically connected to the second busbar.

Further, the first busbar has a first busbar adapter end plate, and the first polar piece and the first busbar adapter end plate are fixedly connected by a first bolt. The second busbar has a second busbar adapter end plate, and the second polar piece and the second busbar adapter end plate are fixedly connected by a second bolt.

The inverter power assembly according to some other embodiment of the present disclosure includes a mounting frame, a power module mounted on the mounting frame, and a capacitor electrically connected to the power module, the mounting frame is configured as a flat mounting frame, and at least one side surface of two reversely arranged side surfaces of the mounting frame is mounted with the power module.

Specifically, the two reversely arranged side surfaces are side surfaces having the largest area of the shown mounting frame.

Alternatively, one of the at least one side surface and the power module is provided with a positioning protrusion, and the other is provided with a positioning recess adapted to position and mate with the positioning protrusion.

In some other embodiment according to the present disclosure, the mounting frame comprises: a housing, the cooling chamber is formed in the housing, and the housing is provided with a connecting hole; a fixing member, the fixing member is installed in the cooling chamber, and the fixing member is provided with a fixing hole arranged directly opposite to the connecting hole, and the connecting member is adapted to pass through the connecting hole to fit to the fixing hole in order to fix the power module to the housing.

Further, a heat exchange member is provided in the cooling chamber.

Specifically, the heat exchange member comprises at least one fin, and the at least one fin and the fixing member are arranged in the cooling chamber.

Further, the number of the fixing member is at least one, and the at least one fixing member and the at least one fin are distributed alternatively.

According to some embodiments of the present disclosure, the number of both the fixing hole and the connecting hole is at least one, and the at least one fixing hole is in one-to-one correspondence to the at least one connecting hole.

Further, the fixing member is structured into a strip shape, and there are a plurality of the fixing holes, and the plurality of the fixing holes are sequentially arranged spaced apart along a length direction of the fixing member.

Specifically, the fixing member is constructed as a metal strip, and the fixing member is suitable for being fixed to an inner wall of the cooling cavity by brazing.

According to some embodiments of the present disclosure, the housing comprises an upper cover, a lower cover and a side frame, the upper cover and the lower cover are respectively used to close upper and lower ends of the side frame to define the cooling chamber, and the connecting hole includes an upper connecting hole provided on the upper cover.

Further, the connecting hole further comprises a lower connecting hole provided on the lower cover.

Alternatively, the fixing hole is configured as a through hole and/or a blind hole penetrating in the thickness direction of the fixing member, the connecting member includes an upper connecting member, and the upper connecting member penetrates the upper connecting hole and the fixing hole to fix a first power module to the housing.

Specifically, the connecting member further comprises a lower connecting member, and the lower connecting member penetrates the lower connecting hole and the fixing hole to fix a second power module to the housing.

Alternatively, the fixing hole is configured as a through hole penetrating along the thickness direction of the fixing member, and the connecting member penetrates the upper connecting hole, the fixing hole and the lower connecting hole to fix a first power module and/or a second power module to the housing.

Alternatively, the fixing hole comprises an upper fixing hole provided on an upper surface of the fixing member and/or a lower fixing hole provided on a lower surface of the fixing member, and the upper fixing hole and/or the lower fixing hole are configured as blind holes; wherein the connecting member includes an upper connecting member and/or a lower connecting member, the upper connecting member penetrates the upper connecting hole and the upper fixing hole to fix a first power module to the housing, and the lower connecting member penetrates the lower connecting hole and the lower fixing hole to fix a second power module to the housing.

According to some embodiments of the present disclosure, characterized in that, an outer side wall of the side frame is provided with a first medium port and a second medium port, one of the first medium port and the second medium port is a medium inlet and the other one is a medium outlet, two ends of the fixing member are spaced apart from an inner side wall of the side frame, and the heat exchange member is formed therein a from heat exchange flow channel communicating from the first medium port to the second medium port.

Further, the first medium port is the medium inlet and the second medium port is the medium outlet, an inner side surface of at least one of the upper cover and the lower cover is provided with a diversion plate, the diversion plate is located at an end of the heat exchange member close to the first medium port, and the diversion plate is configured to be inclined from the first medium port towards a direction close to the second medium port.

According to some embodiments of the present disclosure, there is a cooling chamber in the mounting frame.

Further, a partition plate is provided in a chamber of the cooling chamber, the partition plate divides the cooling chamber into a first cooling sub-chamber and a second cooling sub-chamber, and the partition plate is separated from another inner side wall of the cooling chamber, so that the first cooling sub-chamber and the second cooling sub-chamber are in communication with each other at a side of the cooling chamber.

Further, the mounting frame is provided with a first medium port in communication with the first cooling sub-chamber and a second medium port in communication with the second cooling sub-chamber, one of the first medium port and the second medium port is a medium inlet, and the other is a medium outlet.

Alternatively, the first medium port, the first cooling sub-chamber, the second cooling sub-chamber, and the second medium port are connected in serials to form a medium passage.

According to some embodiments of the present disclosure, a plurality of fins is provided in a chamber of the cooling chamber, the plurality of the fins has one end connected to the partition plate and the other end connected to a chamber wall of the cooling chamber, and a fin sub-chamber is formed between two adjacent ones of the fins.

According to some embodiments of the present disclosure, the capacitor is located on top or bottom of the mounting frame.

According to some embodiments of the present disclosure, the inverter power assembly further includes: a first polar plate and a second polar plate. The first polar plate and the second polar plate are arranged at an end of the power module, and both the power module and the capacitor are electrically connected to the first polar plate and the second polar plate.

Further, the power module has a first busbar and a second busbar, the first busbar is electrically connected to the first polar plate, and the second busbar is electrically connected to the second polar plate.

According to some embodiments of the present disclosure, the first polar plate is provided with a first polar piece, and the first polar piece extends towards the power module and is adapted to be electrically connected to the first busbar. The second polar plate is provided with a second polar piece, and the second polar piece extends towards the power module and is adapted to be electrically connected to the second busbar.

Further, the first busbar has a first busbar adapter end plate, and the first polar piece and the first busbar adapter end plate are fixedly connected by a first bolt. The second busbar has a second busbar adapter end plate, and the second polar piece and the second busbar adapter end plate are fixedly connected by a second bolt.

According to some embodiments of the present disclosure, the inverter power assembly further includes: a first terminal board and a second terminal board. The capacitor has a first terminal and a second terminal, the first terminal is adapted to be electrically connected to the first terminal board, and the second terminal is adapted to be electrically connected to the second terminal board.

Further, the first polar plate is adapted to be electrically connected to the first terminal board, and the second polar plate is adapted to be electrically connected to the second terminal board.

Further, the first terminal board achieves an electrical connection with the first polar plate through the first polar piece, and the second terminal board achieves an electrical connection with the second polar plate through the second polar piece.

According to some embodiments of the present disclosure, the mounting frame has a first side surface facing the capacitor, and the first side surface is provided with the power module. The first terminal board has a first terminal piece, and the first terminal piece, the first polar piece extending towards the first side surface, and the first busbar adapter end plate on the first side surface are fixedly connected through the first bolt. The second terminal board has a second terminal piece, and the second terminal piece, the second polar piece extending towards the first side surface, and the second busbar adapter end plate on the first side surface are fixedly connected by the second bolt.

Further, the mounting frame has a second side surface facing away from the capacitor, and the second side surface is provided with the power module. The first polar piece extending towards the second side surface and the first busbar adapter end plate on the second side surface are fixedly connected by the first bolt. The second polar piece extending towards the second side surface and the second busbar adapter end plate on the second side surface are fixedly connected by the second bolt.

According to some embodiments of the present disclosure, the mounting frame has a plurality of mounting areas located in the same plane, a plurality of the power modules is mounted in a tiled manner in the corresponding mounting areas, and the capacitor is arranged on a side of the plurality of the power modules facing away from the mounting frame.

According to some embodiments of the present disclosure, the power module includes: a substrate, wherein a first side of the substrate has a first side surface, the substrate is mounted on the mounting frame, or the substrate is a part of the mounting frame; a tablet structure located at the first side of the substrate; a plurality of stacked busbars; a power structure pressed against the first side surface by the tablet structure and having a plurality of pins each connected to a corresponding busbar and electrically insulated from the remaining busbars.

Further, a holding structure is further included and configured to hold the tablet structure at the first side of the substrate.

According to some embodiments of the present disclosure, the power structure includes: a first power structure and a second power structure. The first power structure and the second power structure are spaced apart. The tablet structure includes: a tablet body and a tablet arm. The tablet arm is connected to the tablet body and used to press the power structure. The tablet arm includes: a first tablet arm and a second tablet arm. The first tablet arm is used to press the first power structure, and the second tablet arm is used to press the second power structure. The tablet body is located between the first power structure and the second power structure.

Specifically, the first power structure has a first connecting leg, the second power structure has a second connecting leg, the first connecting leg and the second connecting leg are respectively located on opposite outer sides of the first power structure and the second power structure, and the tablet body is located between opposite inner sides of the first power structure and the second power structure.

Alternatively, the tablet body is formed as a recessed groove structure recessed towards the first side surface, an opening of the tablet body faces away from the first side surface, the first tablet arm and the second tablet arm are respectively connected to two ends of the opening of the tablet body, and the first tablet arm and the second tablet arm extend in directions facing away from each other.

According to some embodiments of the present disclosure, the busbars include: a first busbar, a second busbar and a third busbar. An end of the first busbar is provided with a first busbar adapter end plate, an end of the second busbar is provided with a second busbar adapter end plate, the first busbar adapter end plate and the second busbar adapter end plate are located at the same end and arranged side by side, and another end of the third busbar opposite to the first busbar adapter end plate is provided with a third busbar adapter end plate.

The additional aspects and advantages of the present disclosure will be partly given in the following description, and some will become obvious from the following description or be learned through practice of the present disclosure.

Figure 1:
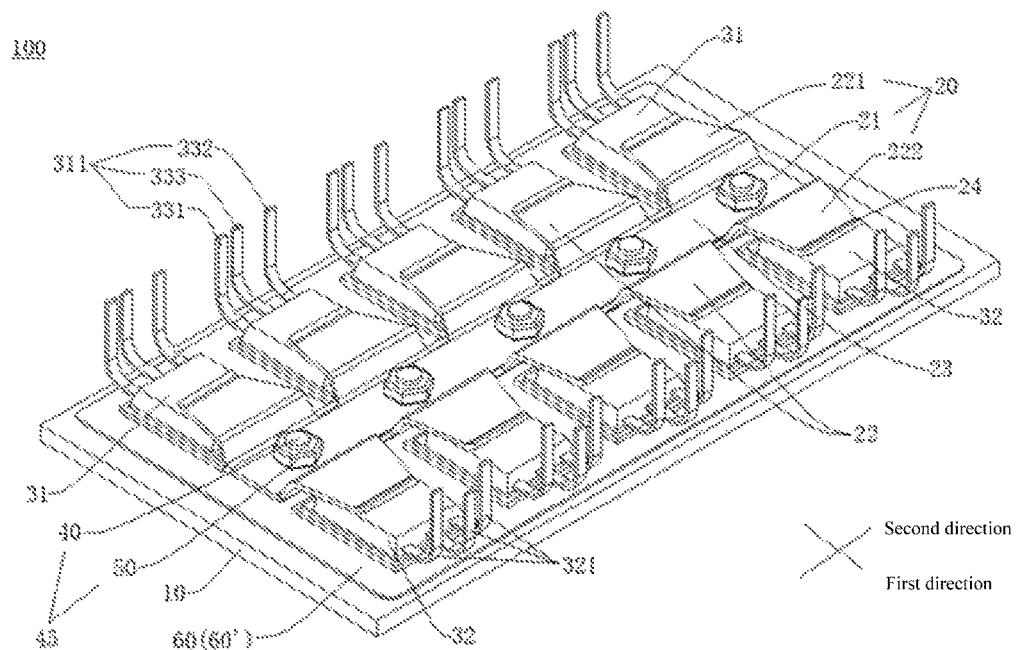
FIG. 1 is a perspective assembled schematic view of a power unit.

REFERENCE SIGNS power module 10000, power unit assembly 1000, power unit 100, substrate 10, tablet structure 20, tablet body 21, tablet body positioning hole 211, tablet arm 22, first tablet arm 221, second tablet arm 222, tablet connecting portion 23, bending section 24, power structure 30, first power structure 31, first connecting leg 311, second power structure 32, second connecting leg 321, first pin 331, second pin 332, third pin 333, holding structure 45, first holding structure 40, second holding structure 50, positioning sheet 60, positioning opening 61, annular positioning rib 62, positioning sheet through hole 63, heat-insulation structure 60', first busbar 201, first busbar connecting portion 2011, first busbar adapter end plate 2012, first busbar body 2013, first busbar connecting portion through hole 2014, second busbar 202, second busbar connecting portion 2021, second busbar adapter end plate 2022, second busbar body 2023, second busbar connecting portion through hole 2024, third busbar 203, first busbar connecting portion 2031, third busbar adapter end plate 2032, third busbar body 2033, third busbar connecting portion through hole 2034, driving circuit board 2000; inverter power assembly 20000, mounting frame 3000, capacitor 3003, first terminal 30031, second terminal 30032, first polar plate 3006, first polar piece 30061, first bolt 30062, first capacitor connecting portion 30063, first polar plate 3007, second polar piece 30071, second bolt 30072, second capacitor connecting portion 30073, positioning protrusion 3008, first terminal board 3017, first terminal piece 30171, second terminal board 3018, second terminal piece 30181, mounting underframe 4001, first underframe 40011, first underframe interface 400111, second underframe 40012, second underframe interface 400121, mounting branch-arm 4002, partition plate 40021, fin 40022, branch-arm first interface 40023, branch-arm second interface 40024, mounting upper-frame 4003, capacitor support element 4004, cooling chamber 4005, underframe cooling chamber 40051, branch-arm cooling chamber 40052, branch-arm inlet chamber 400521, branch-arm outlet chamber 400522, branch-arm sub-chamber 400523, upper-frame cooling chamber 40053, first cooling sub-chamber 40054, second cooling sub-chamber 40055, first medium port 4006, second medium port 4007 sealing ring 4008;

housing 1a, upper cover 11a, upper connecting hole 111a, lower cover 12a, lower connecting hole 121a, side frame 13a, diversion plate 133a, fixing member 2a, fixing hole 21a, upper connecting member 41a, lower connecting member 42a, first power module 51a, and second power module 52a.

DETAILED DESCRIPTION OF THE INVENTION

The embodiments of the present disclosure will be described in detail below, examples of the embodiments are shown in the accompanying drawings, and same or similar reference numerals indicate same or similar elements or elements having same or similar functions all the way. The embodiments described below with reference to the accompanying drawings are exemplary, and intended to explain the present disclosure, but should not be understood as a limitation to the present disclosure.

In the description of the present disclosure, it should be understood that orientations or positional relationships indicated by the terms "longitudinal", "lateral", "length", "width", "thickness", "upper", "lower", "front", "rear", "left", "right", "vertical", "horizontal", "top", "bottom", "inner", "outer" and the like are based on orientations or positional relationships shown in the drawings and are only for the convenience of describing the present disclosure and simplifying the description, rather than indicating or implying that the referred device or element must have a specific orientation and be constructed and operated in a specific orientation, and therefore it cannot be understood as a limitation of the present disclosure.

In the present disclosure, unless otherwise clearly stipulated and limited, terms such as terms "installation", "in communication with", "connected", "fixed" should be understood in a broad sense, for example, it can be fixed connection, detachable connection, or integrated into one piece; it can be a mechanical connection, an electrical connection, or it can be communication with each other; it can be direct connection or indirect connection through an intermediate medium, and it can be communication of interiors of two components or an interaction relationship between two components. For those of ordinary skill in the art, the specific meaning of the above terms in the present disclosure can be understood according to specific circumstances.

A power module 10000 according to an embodiment of the present disclosure will be described in detail below with reference to FIGS. 1 to 16.

Referring to FIGS. 1-4 and 6-16, the power module 10000 according to the embodiment of the present disclosure may include a power unit assembly 1000 and a driving circuit board 2000. Alternatively, the driving circuit board 2000 is located above the power unit assembly 1000.

The power unit assembly 1000 may include: a power unit 100, and a plurality of stacked busbars, and the power unit 100 may include: a substrate 10, a tablet structure 20 and a power structure 30. The substrate 10 has a first side surface at a first side (i.e., an upper side in FIG. 2) thereof, the tablet structure 20 is located at the first side of the substrate 10, and the power structure 30 is pressed against the first side surface of the substrate 10 by the tablet structure 20.

By pressing the power structure 30 against the first side surface of the substrate 10 using the tablet structure 20, the power structure 30 can be firmly and reliably mounted on the substrate 10.

The power structure 30 has a plurality of pins, and each pin is connected to a corresponding busbar and electrically insulated from the remaining busbars, so that a good insulation performance can be ensured between the pin and the other busbars. The pin and the corresponding busbar can be connected either through punching or directly.

For the power module 10000 according to the embodiment of the present disclosure, the power structure 30 is pressed against the substrate 10 by the tablet structure 20, and the pin of the power structure 30 is connected to the corresponding busbar and electrically insulated from the other busbars, leading to a compact structure and a high integrated level for the whole power module 10000.

Referring to FIGS. 1 to 5, the power unit 100 further includes a holding structure 45 configured to hold the tablet structure 20 at the first side of the substrate 10.

Referring to FIGS. 1 to 5, the holding structure 45 includes a first holding structure 40. The first holding structure 40 extends from the substrate 10 in a direction facing away from the first side surface, and penetrates the tablet structure 20. The tablet structure 20 is held at the first side of the substrate 10 by the first holding structure 40, such that the power structure 30 is held at the first side of the substrate 10 by the tablet structure 20 pressing the power structure 30. In other words, referring to FIG. 2, the first holding structure 40 penetrates the tablet structure 20 from bottom to top, and the tablet structure 20 is held at the first side of the substrate 10 by the first holding structure 40. That is, when the first holding structure 40 penetrates the tablet structure 20, a relative position between the tablet structure 20 and the substrate 10 is determined, and the first holding structure 40 can play a role in positioning the tablet structure 20.

In some unshown embodiments, the tablet structure 20 can also be directly fixed, such as welded, on the substrate 10, while the holding structure 45 is eliminated, thereby facilitating reducing the number of connecting components and thus reducing a weight of the power unit 100.

Figure 2:
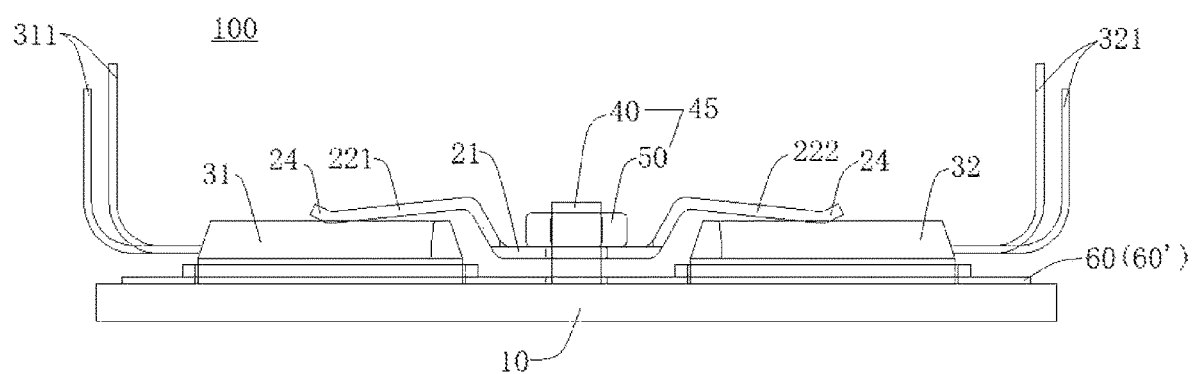
FIG. 2 is an assembled side view of a power unit.

Further, referring to FIGS. 1 to 4, the holding structure 45 further includes a second holding structure 50. The second holding structure 50, through being fitted and connected to the first holding structure 40, makes the tablet structure 20 be held at the first side of the substrate 10. The second holding structure 50 is connected to the first holding structure 40 at a side of the tablet structure 20 facing away from the substrate 10. As shown in FIG. 2, the second holding structure 50 is connected to the first holding structure 40 at an upper side of the tablet structure 20, and there is a wide space at an upper side of the tablet structure 20, leaving an operation space for installation and disassembly of the second holding structure 50. The tablet structure 20 is sandwiched between the second holding structure 50 and the substrate 10, and the power structure 30 is sandwiched between the tablet structure 20 and the substrate 10.

In the description of the present disclosure, terms "first" and "second" are only used for descriptive purposes and cannot be understood as indicating or implying relative importance or implicitly indicating the number of technical features indicated. Thus, the features defined with the "first" and "second" may explicitly or implicitly include one or more of these features. In addition, unless otherwise specifically defined, "plurality" means at least two, such as two, three, etc.

In the embodiment shown in FIGS. 1 to 4, the first holding structure 40 is configured as a columnar structure, the second holding structure 50 is configured as a ring structure, with which the columnar structure is sleeved, and the tablet structure 20 is sandwiched between the second holding structure 50 and the substrate 10, to prevent the tablet structure 20 from being separated from the substrate 10.

Specifically, the first holding structure 40 is perpendicular to the first side surface of the substrate 10, and the first holding structure 40 has a free end far away from the substrate 10, and the first holding structure 40 is sleeved with the second holding structure 50 in a rotatable manner from the side of the tablet structure 20 facing away from the substrate 10, thereby facilitating a quick connection or detachment between the second holding structure 50 and the first holding structure 40.

In some alternative embodiments, the first holding structure 40 is configured as a screw rod having external threads, the second holding structure 50 is configured as a nut having internal threads, and the nut is fitted to the screw rod by screwing, to facilitate installation and disassembly of the tablet structure 20.

Referring to FIGS. 1 to 4, the second holding structure 50 is pressed against the side of the tablet structure 20 facing away from the substrate 10, and the second holding structure 50 can exert on the tablet structure 20 a pressing force towards the substrate 10, to prevent the tablet structure 20 from shaking, thereby leading to the more reliable connection between the tablet structure 20 and the substrate 10.

Figure 3:
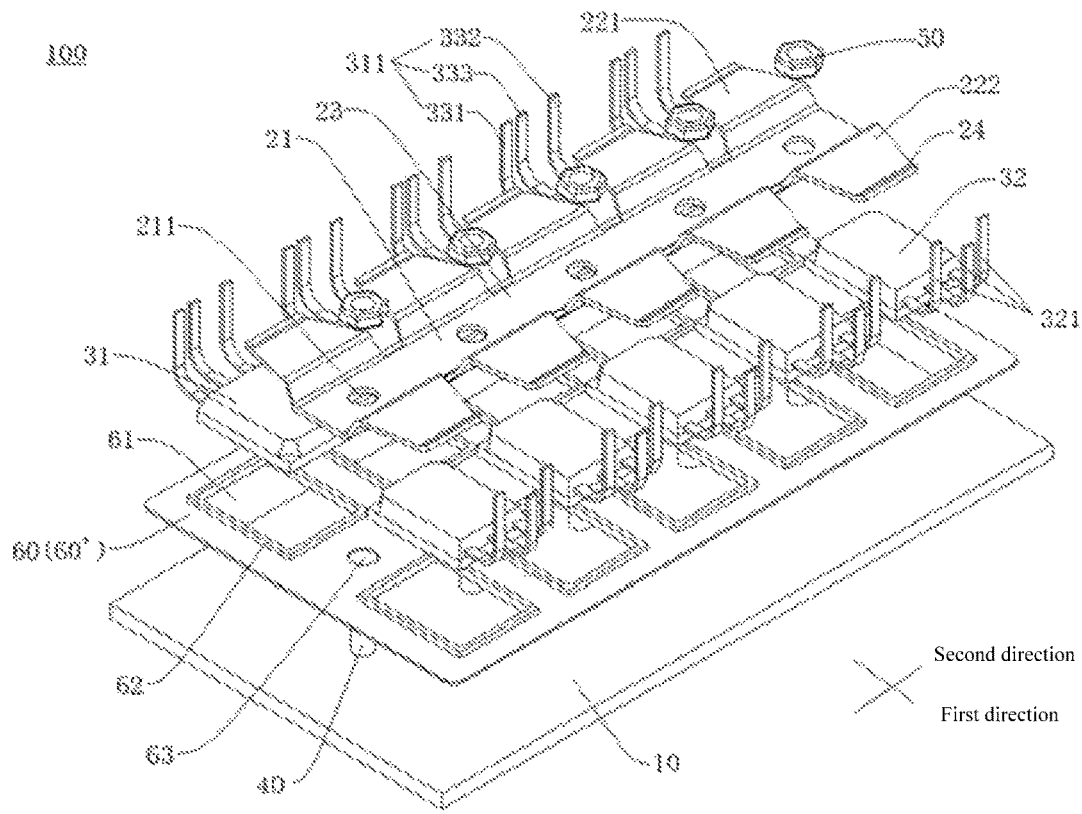
FIG. 3 is a perspective exploded schematic view of a power unit.
Figure 4:
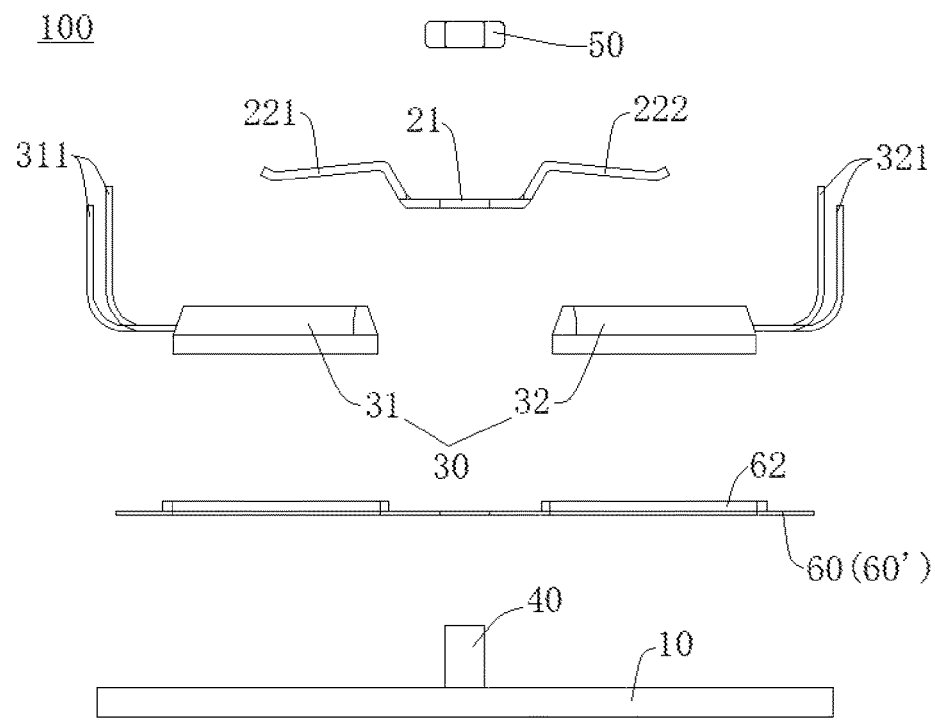
FIG. 4 is an exploded side view of a power unit.

Referring to FIGS. 1 to 5, the tablet structure 20 includes a tablet body 21 formed as a recessed groove structure recessed towards the first side surface. An opening of the tablet body 21 faces away from the first side surface. Referring to FIGS. 2 and 4, the tablet body 21 is formed as a recessed groove structure that is recessed downward, and the opening of the tablet body 21 faces upward.

Further, at least a part of the second holding structure 50 is located in the recessed groove of the tablet body 21, and an end surface of the free end of the first holding structure 40 facing away from the substrate 10 (that is, an upper end surface of the first holding structure 40) is also located in the recessed groove, such that a distance between the end surface of the free end of the first holding structure 40 facing away from the substrate 10 and the substrate 10 can be shortened, and a distance between the second holding structure 50 and the substrate 10 can be shortened. Thus, the holding structure 45 is located in the recessed groove of the tablet body 21 as much as possible, which can reduce a dimension of the power unit 100 in a height direction and form relatively large usable space above the tablet structure 20, thereby facilitating leaving an installation space for other components and thus preventing mutual interference during the installation.

In an embodiment shown in FIG. 2, an entirety of the second holding structure 50 is located in the recessed groove, and the upper end surface of the first holding structure 40 is also located in the recessed groove, so that the dimension of the power unit 100 in the height direction can be further reduced.

Referring to FIG. 2, an overlapping dimension of the second holding structure 50 and the power structure 30 in a thickness direction of the power structure 30 exceeds half of a thickness of the second holding structure 50, such that the second holding structure 50 can be located in the recessed groove of the tablet body 21 as much as possible, thereby further reducing the distance between the second holding structure 50 and the substrate 10.

Referring to FIGS. 1 to 3 and 5, the second holding structure 50 is pressed against a tablet body bottom wall of the tablet body 21, the first holding structure 40 penetrates the tablet body bottom wall, and a tablet body positioning hole 211 fitted to the first holding structure 40 is formed in the tablet body bottom wall, so that after the first holding structure 40 penetrates the tablet body positioning hole 211 on the tablet body bottom wall, the tablet structure 20 can be preliminarily positioned, to facilitate subsequently using the second holding structure 50 to fix the tablet structure 20.

Figure 5:
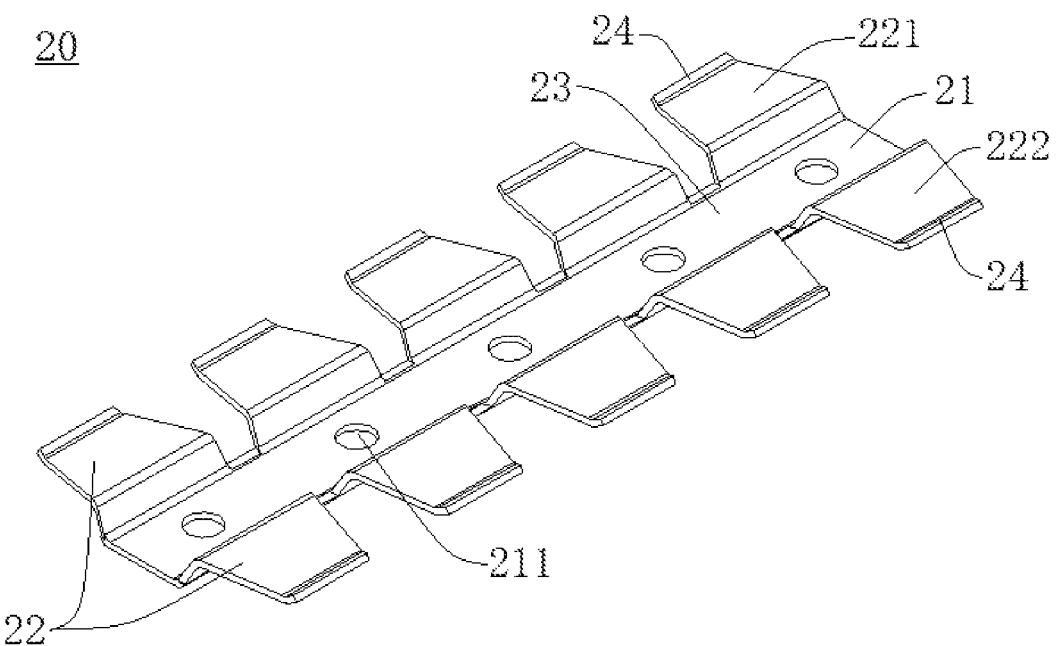
FIG. 5 is a perspective schematic view of a tablet structure.

Referring to FIG. 5, the tablet structure 20 includes a tablet body 21 and a tablet arm 22. The tablet arm 22 is connected to the tablet body 21. Referring to FIGS. 1 to 2, the tablet arm 22 is used to press the power structure 30, and the power structure 30 is sandwiched between the tablet structure 20 and the substrate 10.

Referring to FIGS. 1 to 4, the power structure 30 may include a first power structure 31 and a second power structure 32 that are spaced apart from each other. The tablet arm 22 includes a first tablet arm 221 and a second tablet arm 222. The first tablet arm 221 is used to press the first power structure 31, the second tablet arm 222 is used to press the second power structure 32, the tablet body 21 is located between the first power structure 31 and the second power structure 32, and the holding structure 45 is also located between the first power structure 31 and the second power structure 32.

Further, the first power structure 31 has a first connecting leg 311, the second power structure 32 has a second connecting leg 321, the first connecting leg 311 and the second connecting leg 321 are respectively located on opposite outer sides of the first power structure 31 and the second power structure 32, and the tablet body 21 is located between opposite inner sides of the first power structure 31 and the second power structure 32.

Alternatively, an angle between a direction along which the first connecting leg 311 protrudes from the first power structure 31 and a direction along which the second connecting leg 321 protrudes from the second power structure 32 is 180 degrees. That is, pins of the first connecting leg 311 and the second connecting leg 321 are both provided outwards, leaving a middle space between the first power structure 31 and the second power structure 32, which allows the holding structure 45 to fix the tablet structure 20 on the substrate 10 from the middle space.

The pins of the first connecting leg 311 and the second connecting leg 321 each include: a first pin 331, a second pin 332 and a third pin 333. Each of the pins is adapted to be electrically connected to the driving circuit board 2000 or a corresponding busbar.

Referring to FIGS. 2 and 4, the first connecting leg 311 protrudes from the first power structure 31 towards left, and the second connecting leg 321 protrudes from the second power structure 32 towards right, and an angle between the two directions is 180 degrees, such that it is possible to prevent an interference between the first power structure 31 and the second power structure 32 due to a relatively close distance between the first connecting leg 311 and the second connecting leg 321 when the first connecting leg 311 and the second connecting leg 321 face towards each other. Moreover, when the first power structure 31 and the second power structure 32 are connected to the corresponding busbar or driving circuit board 2000, the first connecting leg 311 and the second connecting leg 321 both face outward, and there is plenty of space to facilitate corresponding operations.

Referring to FIGS. 1 and 3, the first power structure 31 and the second power structure 32 are spaced apart in a first direction of the substrate 10, for example, facing towards each other. There is a plurality of the first power structures 31 arranged on the substrate 10 in a second direction of the substrate 10, a plurality of the second power structures 32 arranged on the substrate 10 in the second direction, and a plurality of tablet structures 20 arranged along the second direction. The first direction and the second direction are perpendicular to each other. The holding structure 45 is configured to hold the plurality of the tablet structures 20 at the first side of the substrate 10. When the substrate 10 is rectangular, the first direction may be a width direction of the substrate 10 and the second direction may be a length direction of the substrate 10.

Further, the plurality of the first power structures 31, the plurality of the tablet structures 20, and the plurality of the second power structures 32 are in one-to-one correspondence in the first direction. A pair of oppositely arranged first power structure 31 and second power structure 32 can be pressed against the substrate 10 by the same tablet structure 20.

In some embodiments, the plurality of the tablet structures 20 may be mutually independent.

In the embodiments shown in FIGS. 1, 3 and 5, the plurality of the tablet structures 20 is connected into one piece by a tablet connecting portion 23, such that an assembly process of the plurality of the tablet structures 20 is saved, thereby facilitating improving an assembly efficiency of the power unit 100. Moreover, the tablet structures 20 connected into one piece can press a plurality of the power structures 30 concurrently, leading to a high crimping efficiency. The one-piece tablet structure 20 is pressed against the substrate 10 by two or more of the holding structures 45.

Further, the tablet connecting portion 23 is connected between the tablet bodies 21 of two adjacent tablet structures 20, and a width of the tablet connecting portion 23 may be equal to a width of the tablet body 21.

In the embodiment shown in FIGS. 1, 3 and 5, the tablet structure 20 includes a tablet body 21 and a tablet arm 22. The first holding structure 40 penetrates the tablet body 21, the tablet arm 22 is connected side by side with the tablet body 21 in the first direction of the substrate 10, and the tablet arm 22 is used to press the power structure 30. There is a plurality of the tablet structures 20 connected to each other in the second direction of the substrate 10, and the first direction and the second direction are perpendicular to each other.

Further, the tablet arm 22 may include: a first tablet arm 221 and a second tablet arm 222 that are symmetrically connected to both sides of the tablet body 21. In addition, the tablet bodies 21 of two adjacent ones of the tablet structures 20 are connected to each other through the tablet connecting portion 23.

Referring to FIGS. 2, 4, and 5, the tablet body 21 is formed as a recessed groove structure recessed towards the first side surface, the opening of the tablet body 21 faces away from the first side surface, the first tablet arm 221 and the second tablet arm 222 are respectively connected to two ends of the opening of the tablet body 21, and the first tablet arm 221 and the second tablet arm 222 extend in directions facing away from each other. Referring to FIGS. 2 and 4, the tablet body 21 is formed as a recessed groove structure that is recessed downward, the opening of the tablet body 21 faces upward, the first tablet arm 221 extends to the left, and the second tablet arm 222 extends to the right.

In some alternative embodiments, the power unit 100 of the power module 10000 may further include: a positioning portion for positioning the power structure 30 on the substrate 10, to ensure that a position of the power structure 30 on the substrate 10 is accurate, to prevent the power structure 30 from shaking randomly on the substrate 10.

In the embodiments shown in FIGS. 1 to 4, the positioning portion includes: a positioning sheet 60. The positioning sheet 60 is provided with a through positioning opening 61 matching the power structure 30. For example, an outer peripheral surface of the power structure 30 and the positioning opening 61 are both rectangular, the power structure 30 is positioned in the positioning opening 61, and a bottom of the power structure 30 is directly attached to the substrate 10. The substrate 10 can be a metal substrate 10, heat of the power structure 30 can be transferred to the substrate 10, and a cooling device or a heating device may be provided under the substrate 10 to cool or heat the power structure 30.

Alternatively, as shown in FIGS. 3-4, the positioning sheet 60 is also provided with an annular positioning rib 62 surrounding the positioning opening 61, and the annular positioning rib 62 matches the outer peripheral surface of the power structure 30. The annular positioning rib 62 protrudes from a surface of the positioning sheet 60, so that positioning firmness of the power structure 30 can be increased, thereby leading to the better positioning effect.

In the embodiments shown in FIGS. 1 to 4, the positioning sheet 60 is an insulating positioning sheet, and the positioning sheet 60 is adhesively fixed to the first side surface of the substrate 10.

Referring to FIGS. 1 and 3, the positioning sheet 60 is provided with a positioning sheet through hole 63 for matching the first holding structure 40 and allowing the first holding structure 40 to pass through to form positioning fitting, and after the first holding structure 40 passes through the positioning sheet through hole 63, the positioning sheet 60 can be initially positioned. The first holding structure 40 passes through the positioning sheet through hole 63 on the positioning sheet 60 and the tablet body positioning hole 211 on the tablet body 21 to be connected to the second holding structure 50, so as to fix the positioning sheet 60 and the tablet structure 20 between the second holding structure 50 and the substrate 10.

In some alternative embodiments, the power unit 100 may further include a heat-insulation structure 60' provided on the first side surface of the substrate 10 in a form of surrounding the power structure 30. The heat-insulation structure 60' is located between the power structure 30 and the substrate 10, and the heat-insulation structure 60' can separate the power structure 30 from the substrate 10, to prevent the heat of the power structure 30 from affecting the components under the substrate 10 while preventing heat under the substrate 10 from being transferred upward to the power structure 30.

In some alternative embodiments, the first side surface of the substrate 10 faces towards the busbar.

Referring to FIGS. 2, 4, and 5, the tablet structure 20 is constructed as a seagull wing shape, and the tablet structure 20 may include a tablet body 21, a first tablet arm 221, and a second tablet arm 222. The first tablet arm 221 and the second tablet arm 222 are symmetrically connected to both sides of the tablet body 21, and free ends of the first tablet arm 221 and the second tablet arm 222 each have a bending section 24 bending towards the substrate 10. The bending section 24 is adapted to press the power structure 30 so that the power structure 30 is pressed against the substrate 10.

A relatively large planar space is formed above the tablet structure 20, leaving an installation space for other components (taking the busbar as an example) while significantly reducing dimensions of the power unit 100 and the busbar assembly in the height direction.

An installation space for the power structure is formed between the tablet arm 22 and the substrate 10, and the power structure 30 is adapted to be mounted in the installation space of the power structure.

Referring to FIGS. 6-16, the power structure 30 has a plurality of pins, for example, the first pin 331, the second pin 332, and the third pin 333 of the first connecting leg 311 and the second connecting leg 321, and at least one of the pins is connected, in a form of penetrating only one layer of the busbar, to the penetrated busbar, and the at least one pin is staggered from and electrically insulated from the other busbars. In other words, the at least one pin does not need to penetrate other busbars, and it is only needed to punch holes in the penetrated busbar, so that the at least one pin penetrates this hole, thereby reducing the number of the holes punched on the other busbars and simplifying a production process of the power unit assembly 1000. Moreover, the at least one pin is staggered from the other busbars, and a good insulation performance between the at least one pin and the other busbars can be ensured.

The pin is connected, in the form of penetrating only one layer of the busbar, to the penetrated busbar, and this pin is staggered from the other busbars, such that the number of the holes punched on the other busbars can be reduced, to simplify a manufacturing process of the busbar and facilitate achieving the better electrical insulation performance between the pin and the other busbars.

In some alternative embodiments, the busbar has a busbar connecting portion, at least one pin of the power unit 100 is connected to the busbar in a form of penetrating only one layer of the busbar connecting portion, and the busbar connecting portion is configured in a sheet shape. In other words, for the busbar, the busbar connecting portion is only provided at a position that needs to be connected to the pin, while no physical structure may be provided at a position staggered from the pin, thereby facilitating saving a material of the busbar and thus saving cost.

Alternatively, the busbar and the corresponding busbar connecting portion are on the same plane, thereby facilitating simplification of the structure of the busbar and processing and manufacturing of the busbar while reducing stray inductance.

Alternatively, the busbar and the corresponding busbar connecting portion are formed by a blanking process, which is simple and efficient, thereby facilitating shortening processing time of the busbar.

In some alternative embodiments, the busbar connecting portion protrudes from at least one side edge of the corresponding busbar, and the busbar connecting portion is directly connected to the corresponding busbar. In other words, the busbar connecting portion is connected to the corresponding busbar without other connectors, so that the busbar structure is simple, thereby facilitating simplifying the processing process of the busbar while reducing the stray inductance.

In some alternative embodiments, the busbar connecting portion is provided with a busbar connecting portion through hole that allows the pin to pass through. The pin of the power structure 30 extends into a corresponding busbar connecting portion through hole and is electrically connected to the busbar where the busbar connecting portion is located.

In some alternative embodiments, in two busbar connecting portions corresponding to two adjacent pins, the busbar connecting portion through hole on one of the busbar connecting portions is located outside a contour of the other one of the busbar connecting portions, so that it can be ensured that each of the pins is only connected to the busbar connecting portion through hole on the corresponding busbar connecting portion without being connected to the busbar connecting portion through hole on other busbar connecting portions. It should be noted that the "two adjacent pins" mentioned here can be two adjacent pins of the same power structure 30 or two adjacent pins of different power structures 30.

Figure 14:
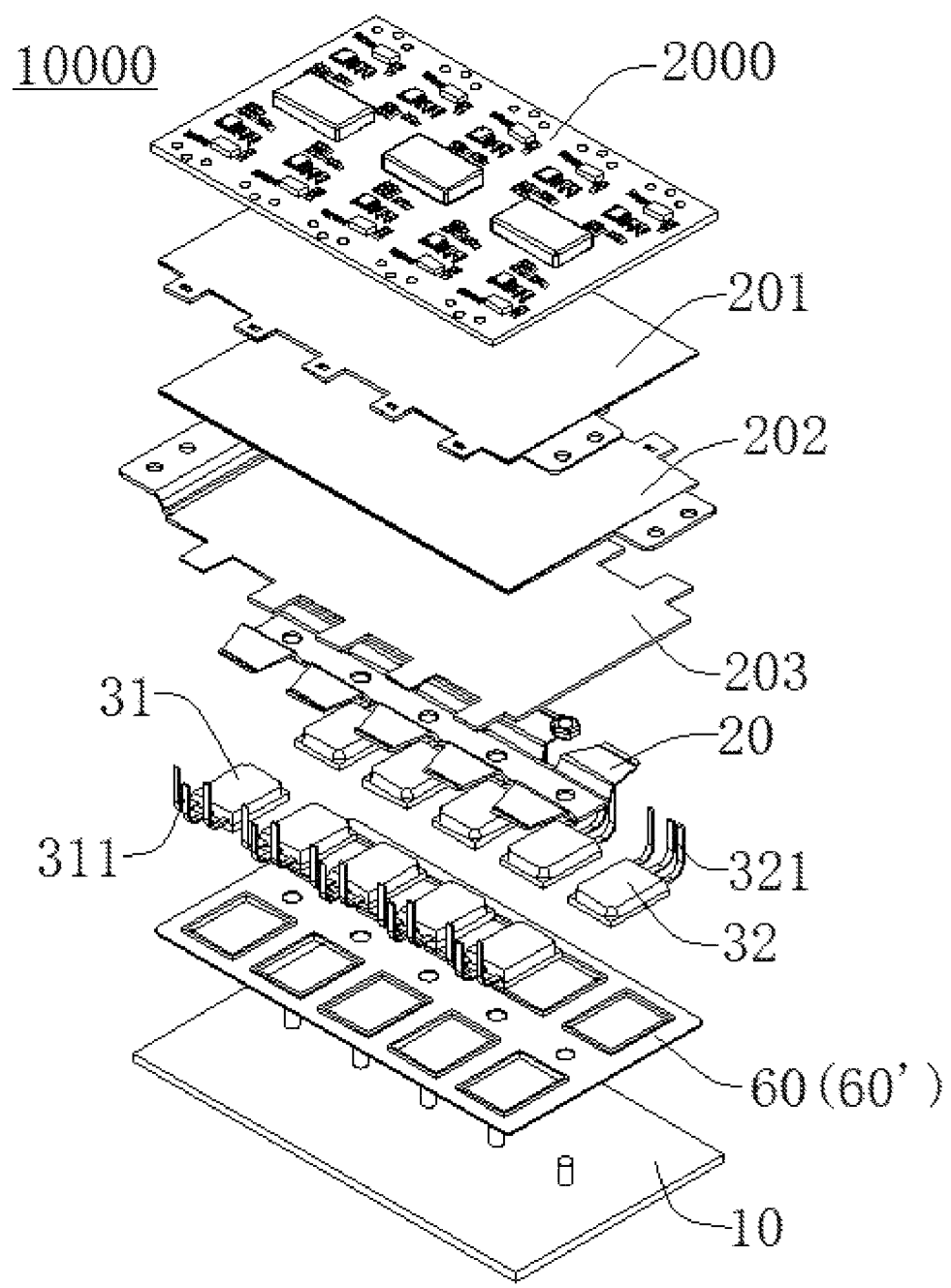
FIG. 14 is a perspective exploded schematic view of a power unit assembly and a driving circuit board.
Figure 15:
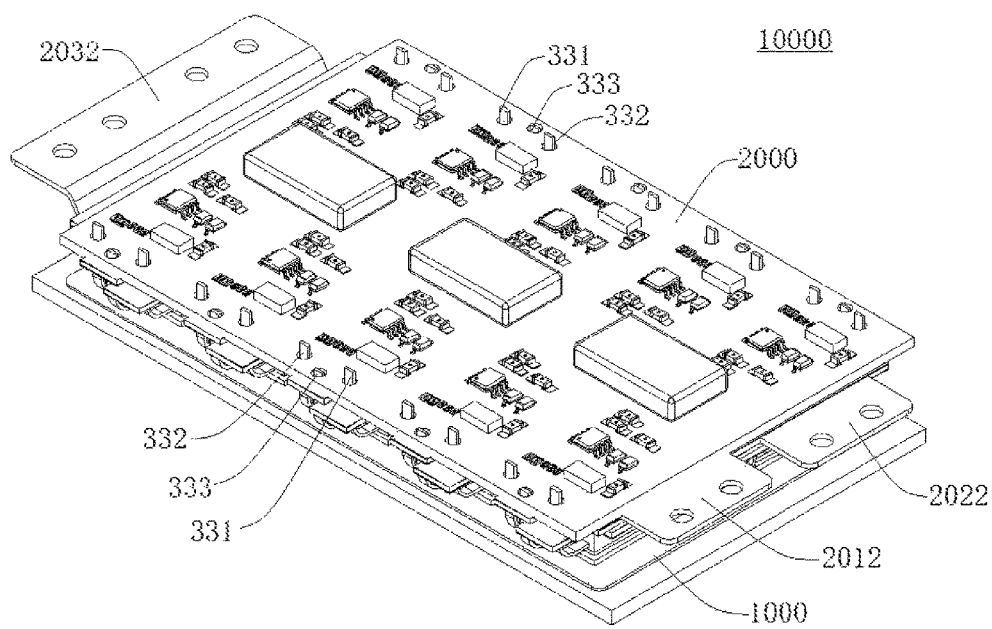
FIG. 15 is a perspective assembled schematic view of a power unit assembly and a driving circuit board.
Figure 16:
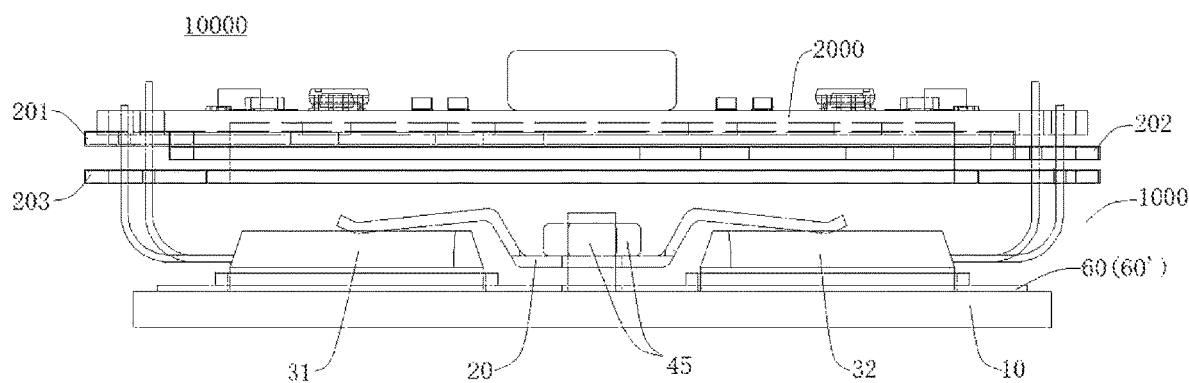
FIG. 16 is an assembled side view of a power unit assembly and a driving circuit board.
Figure 17:
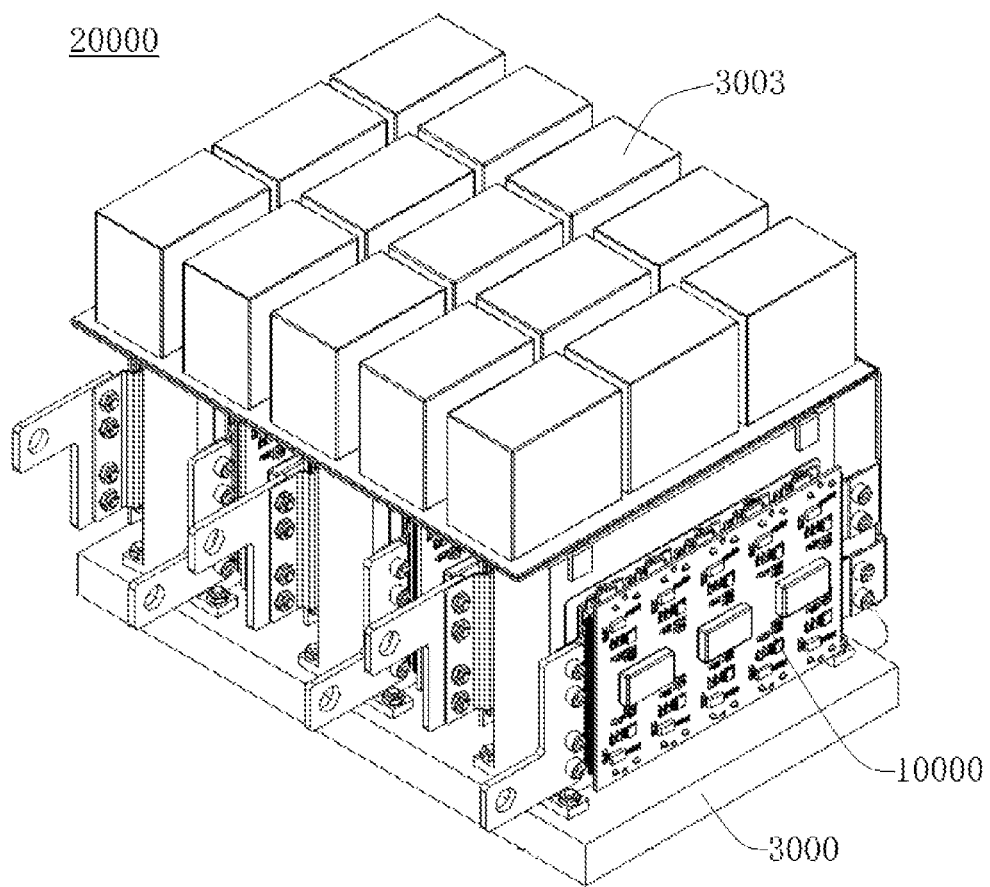
FIG. 17 is an assembled schematic view of an inverter power assembly of a first embodiment.

In some alternative embodiments, referring to FIGS. 6-13, two of the pins in the same power structure 30 are respectively connected to the busbar connecting portions of the two corresponding busbars, and each of the pins is only connected to and penetrate the corresponding busbar connecting portion. Referring to FIGS. 14-16, the remaining one pin in the same power structure 30 is adapted to be connected to the driving circuit board 2000.

Referring to FIGS. 6-9, the busbar includes: a first busbar 201, a second busbar 202 and a third busbar 203. The first busbar 201 includes a first busbar body 2013, the second busbar 202 includes a second busbar body 2023, and the third busbar 203 includes a third busbar body 2033. The busbar connecting portion includes: a first busbar connecting portion 2011, a second busbar connecting portion 2021 and a third busbar connecting portion 2031. The first busbar connecting portion 2011 is connected to the first busbar body 2013 of the first busbar 201, the second busbar connecting portion 2021 is connected to the second busbar body 2023 of the second busbar 202, and the third busbar connecting portion 2031 is connected to the third busbar body 2033 of the third busbar 203.

The first busbar connecting portion 2011 is located at one side of the first busbar 201, the second busbar connecting portion 2021 is located at the other side of the second busbar 202 opposite to the first busbar connecting portion 2011, and the third busbar connecting portions 2031 are respectively located at both sides of the third busbar 203.

Figure 6:
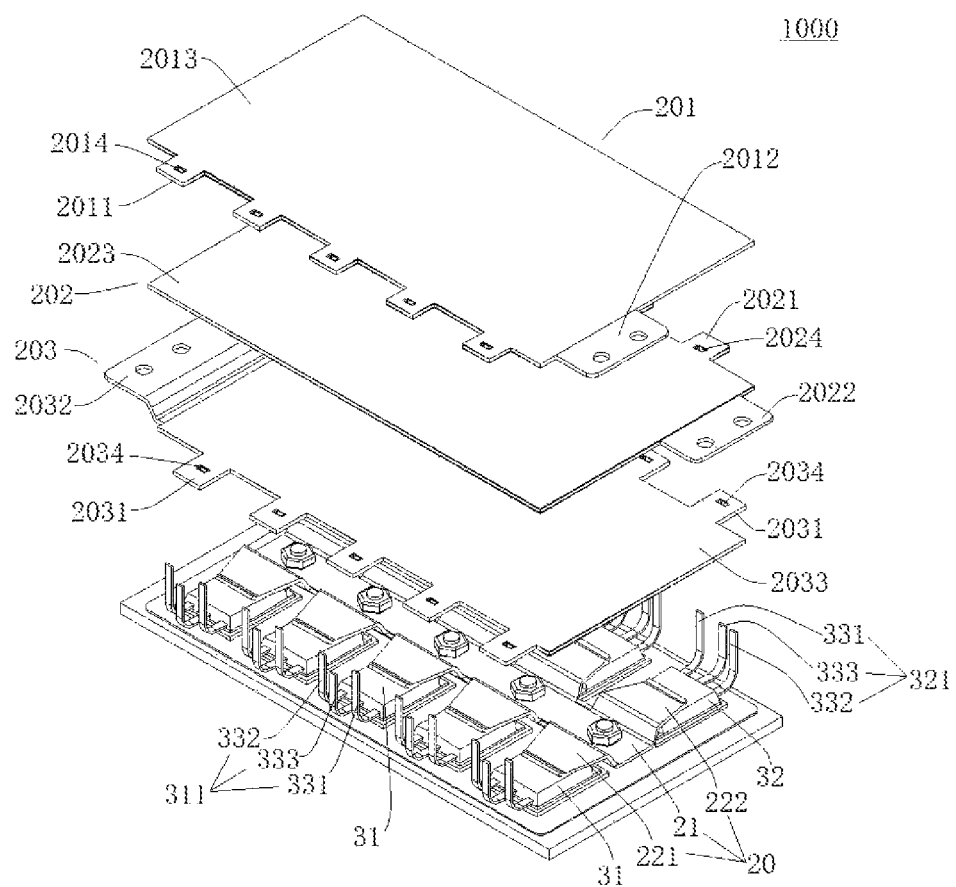
FIG. 6 is a perspective exploded schematic view of a power unit assembly.

In some alternative embodiments, referring to FIG. 6, the power structure 30 includes a first power structure 31 and a second power structure 32. The pin of the first power structure 31 and the pin of the second power structure 32 are respectively located at opposite outer sides of the first power structure 31 and the second power structure 32, the pin of the first power structure 31 is the first connecting leg 311, the pin of the second power structure 32 is the second connecting leg 321, and each of the first connecting leg 311 and the second connecting leg 321 includes a first pin 331, a second pin 332, and a third pin 333.

The pin 311 of the first power structure 31, and the first busbar connecting portion 2011 and the third busbar connecting portion 2031 of the third busbar 203 at a first side of the busbar are all at the first side (for example, a left side in FIG. 6), and the pin 321 of the second power structure 32, and the second busbar connecting portion 2021 and the third busbar connecting portion 2031 of the third busbar 203 at a second side of the busbar are all at the second side (for example, a right side in FIG. 6).

The first busbar connecting portion 2011 is provided with a first busbar connecting portion through hole 2014, the second busbar connecting portion 2021 is provided with a second busbar connecting portion through hole 2024, and the third busbar connecting portion 2031 is provided with a third busbar connecting portion through hole 2034.

Specifically, referring to FIGS. 6-9 and 13-16, the first pin 331 of the first connecting leg 311 is adapted to pass through the third busbar connecting portion through hole 2034 on the third busbar connecting portion 2031, to achieve a connection with the third busbar 203; the second pin 332 of the first connecting leg 311 is adapted to penetrate the driving circuit board 2000, to achieve a connection with the driving circuit board 2000; and the third pin 333 of the first connecting leg 311 is adapted to pass through the first busbar connecting portion through hole 2014 on the first busbar connecting portion 2011, to achieve a connection with the first busbar 201.

Figure 10:
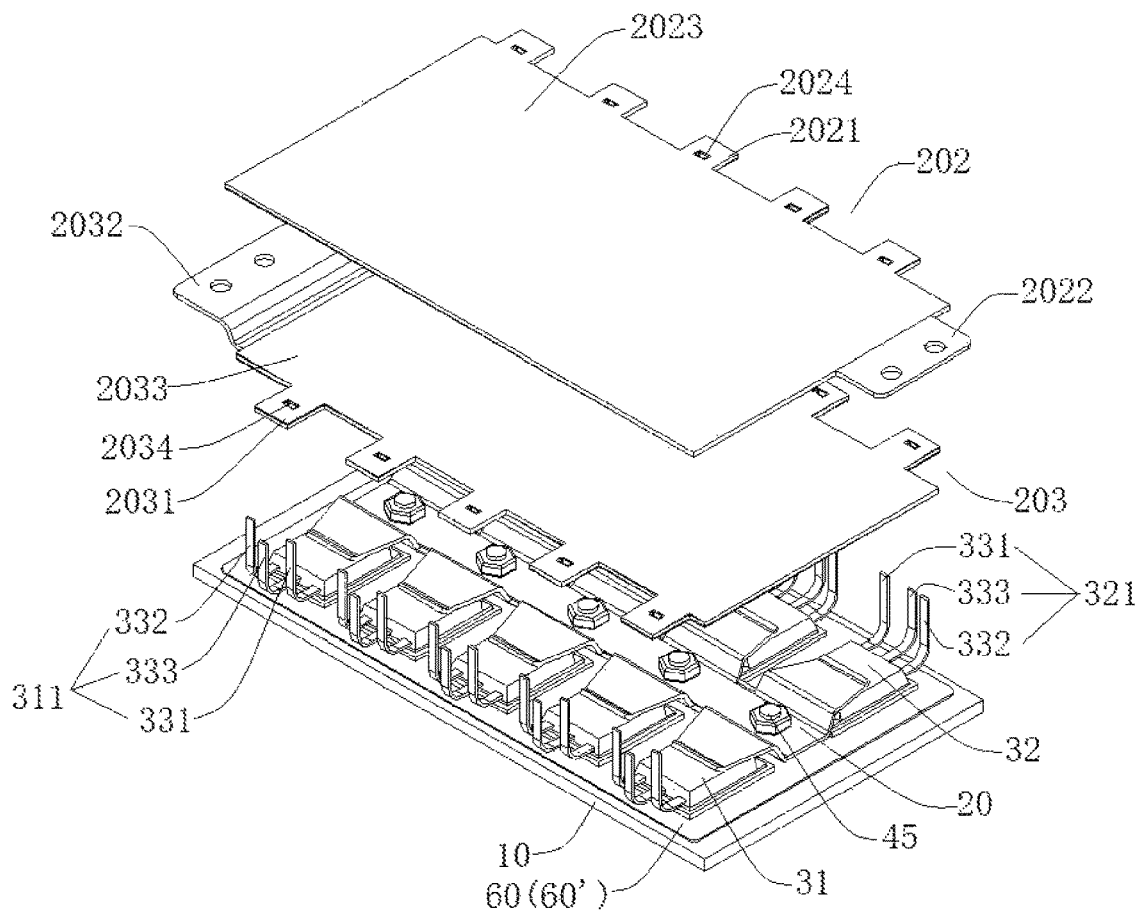
FIG. 10 is a perspective exploded schematic view of a power unit, a second busbar and a third busbar.
Figure 11:
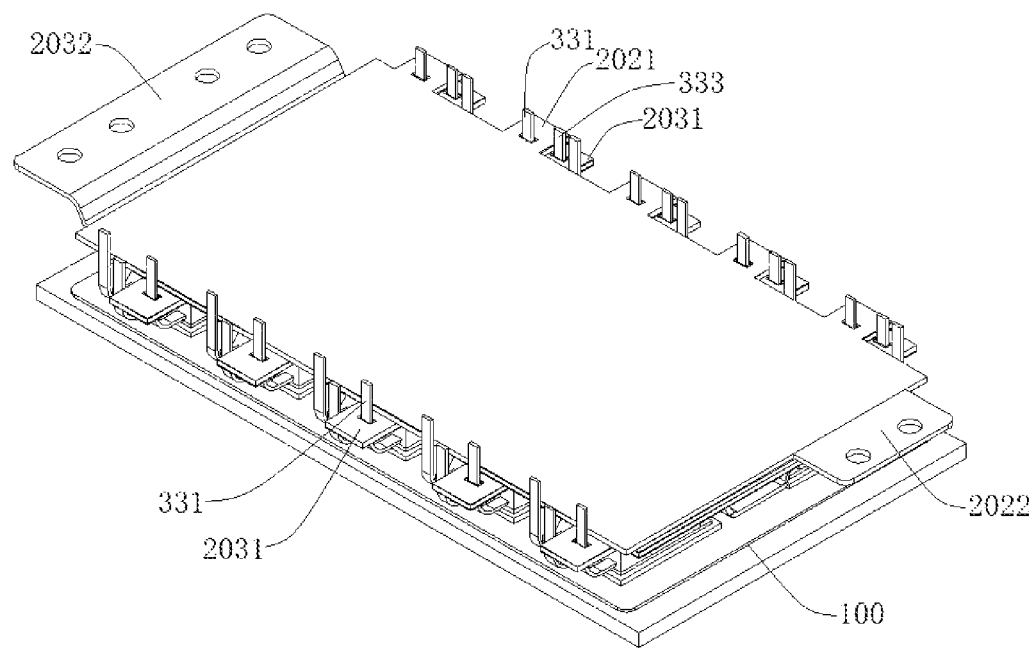
FIG. 11 is a perspective assembled schematic view of a power unit, a second busbar and a third busbar.
Figure 12:
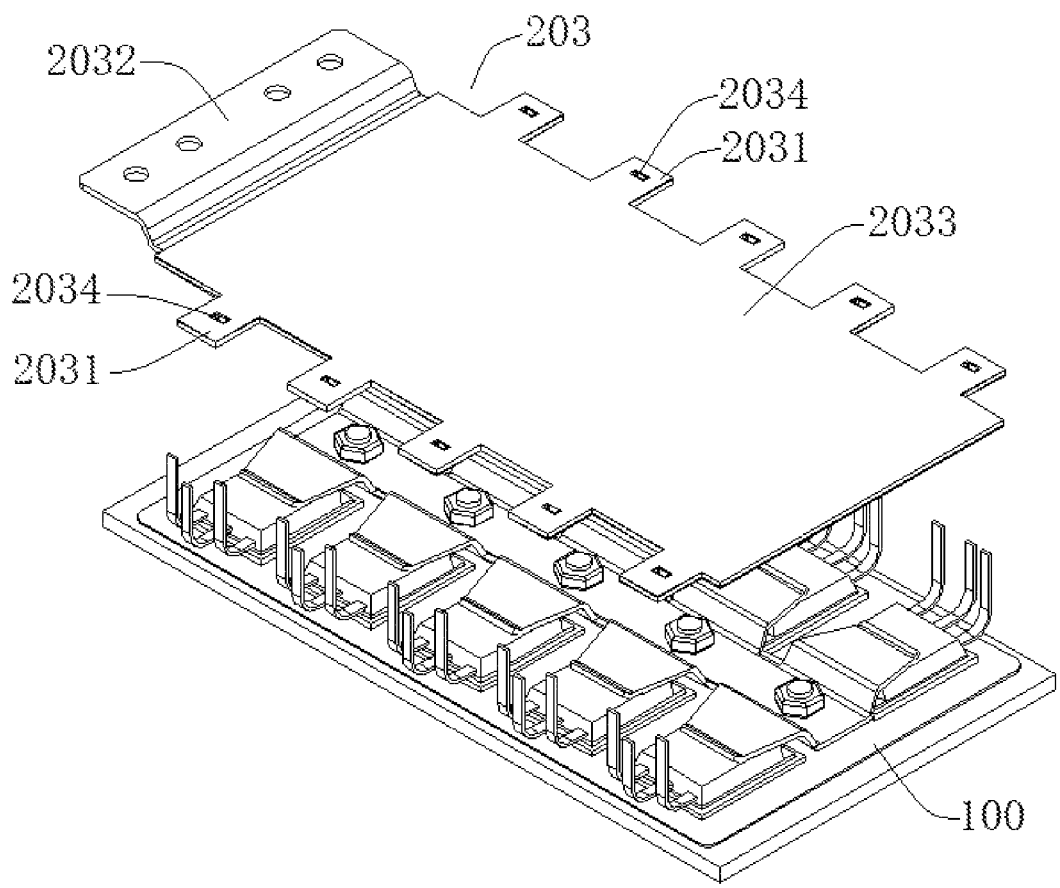
FIG. 12 is a perspective exploded schematic view of a power unit and a third busbar.
Figure 13:
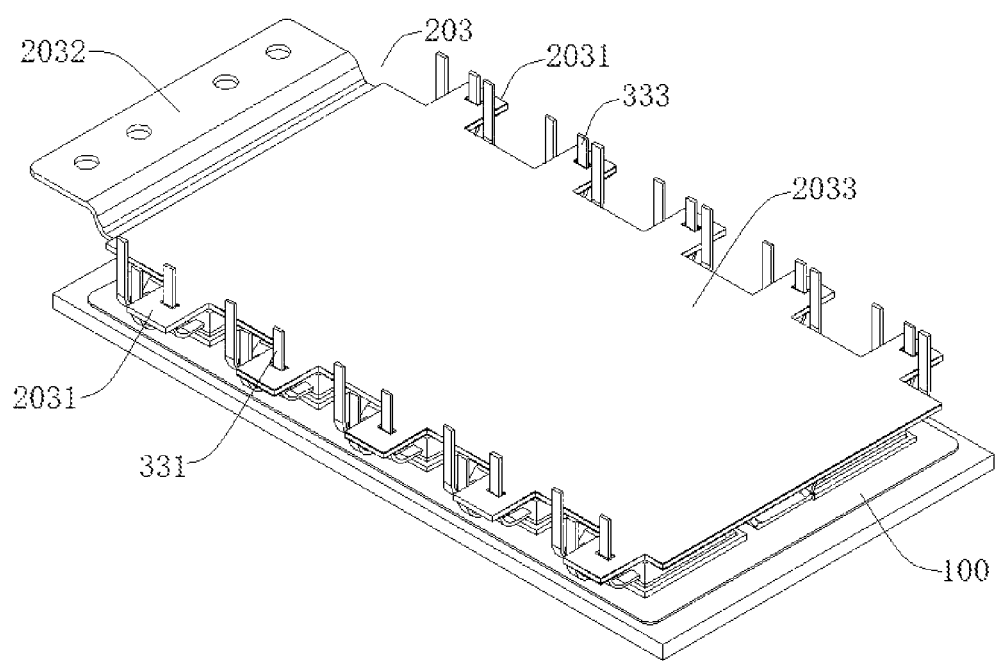
FIG. 13 is a perspective assembled schematic view of a power unit and a third busbar.

Similarly, referring to FIGS. 10-16, the first pin 331 of the second connecting leg 321 is adapted to pass through the second busbar connecting portion through hole 2024 on the second busbar connecting portion 2021, in order to achieve the connection with the second busbar 202; the second pin 332 of the second connecting leg 321 is adapted to penetrate the driving circuit board 2000, in order to achieve the connection with the driving circuit board 2000; and the third pin 333 of the second connecting leg 321 is adapted to pass through the third busbar connecting portion through hole 2034 on the third busbar connecting portion 2031, in order to achieve the connection with the third busbar 203. The third busbar connecting portion through hole 2034 on the third busbar connecting portion 2031 on the third busbar 203 located at the first side of the busbar is staggered from the third busbar connecting portion through hole 2034 on the third busbar connecting portion 2031 on the third busbar 203 located on the second side of the busbar. Referring to FIG. 10 in conjunction, a line connecting the third busbar connecting portion through holes 2034 of both sides of the third busbar 203 is not parallel to a short side of the third busbar 203.

A stacking arrangement of the first busbar 201, the second busbar 202 and the third busbar 203 can be changed according to actual needs. For example, the third busbar 203 may be located above the first busbar 201 and the second busbar 202 or between the first busbar 201 and the second busbar 202.

Further, any one of the two pins in the same power structure 30 is connected to the corresponding busbar connecting portion and adjacent to or spaced from the other busbar connecting portion side by side.

Figure 7:
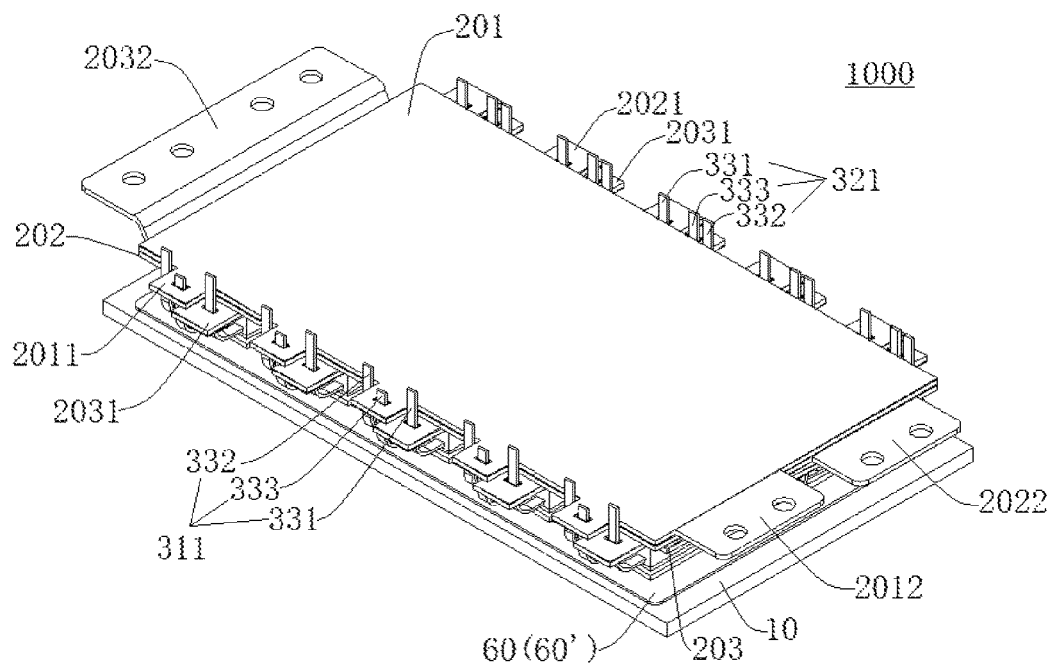
FIG. 7 is a perspective assembled schematic view of a power unit assembly.
Figure 8:
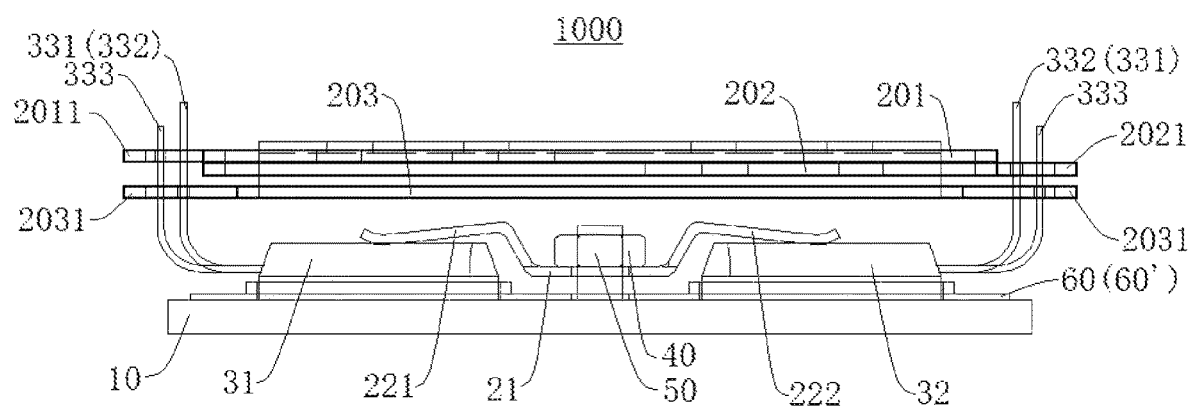
FIG. 8 is an assembled side view of a power unit assembly.
Figure 9:
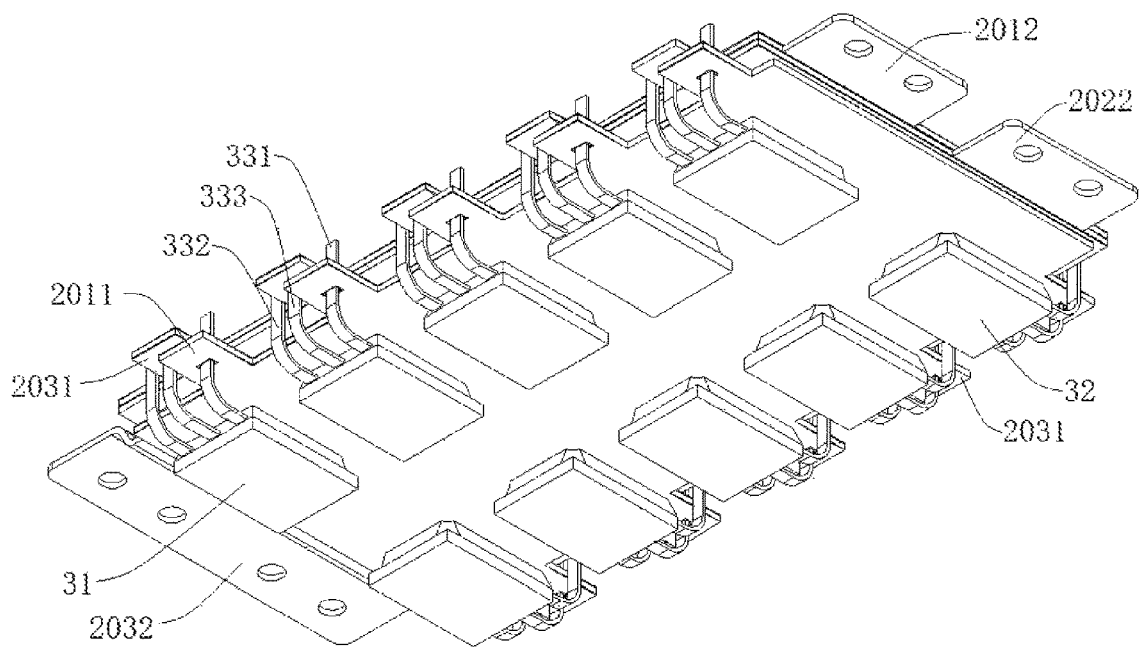
FIG. 9 is a schematic view of connection between a power structure and three layers of busbars.

As shown in FIGS. 6-7, the first pin 331 of the first connecting leg 311 is connected to the third busbar connecting portion 2031 and spaced apart from the first busbar connecting portion 2011, and the third pin 333 of the first connecting leg 311 is connected to the first busbar connecting portion 2011 and spaced apart from the third busbar connecting portion 2031; the first pin 331 of the second connecting leg 321 is connected to the second busbar connecting portion 2021 and spaced apart from the third busbar connecting portion 2031, and the third pin 333 of the second connecting leg 321 is connected to the third busbar connecting portion 2031 and spaced apart from the second busbar connecting portion 2021.

In some alternative embodiments, any one of the two pins in the same power structure 30 is connected to the corresponding busbar connecting portion, and the busbar connecting portion through hole on one of the busbar connecting portions is located outside a contour of the other one of the busbar connecting portions. As shown in FIGS. 6-7, the first pin 331 of the first connecting leg 311 is connected to the third busbar connecting portion 2031, and the third busbar connecting portion through hole 2034 on the third busbar connecting portion 2031 is located outside a contour of the first busbar connecting portion 2011; the third pin 333 of the first connecting leg 311 is connected to the first busbar connecting portion 2011, and the first busbar connecting portion through hole 2014 on the first busbar connecting portion 2011 is located outside a contour of the third busbar connecting portion 2031; the first pin 331 of the second connecting leg 321 is connected to the second busbar connecting portion 2021, and the second busbar connecting portion through hole 2024 on the second busbar connecting portion 2021 is located outside the contour of the third busbar connecting portion 2031; the third pin 333 of the second connecting leg 321 is connected to the third busbar connecting portion 2031, and the third busbar connecting portion through hole 2034 on the third busbar connecting portion 2031 is located outside the contour of the second busbar connecting portion 2021.

Referring to FIGS. 14-16, the remaining one pin in the same power structure 30 is adapted to be connected to the driving circuit board 2000, and this remaining one pin is directly connected to the driving circuit board 2000 without being blocked by the busbar connecting portion. For example, the second pin 332 of the first power structure 31 is connected to the driving circuit board 2000, and there is no busbar connecting portion between the second pin 332 of the first power structure 31 and the driving circuit board 2000 for blocking; the second pin 332 of the second power structure 32 is connected to the driving circuit board 2000, and there is no busbar connecting portion between the second pin 332 of the second power structure 32 and the driving circuit board 2000 for blocking.

In some alternative embodiments, referring to FIGS. 1, 3, 6-7, 9-11 and 15, the same power structure 30 has a first pin 331, a second pin 332 and a third pin 333, and the third pin 333 is located between the first pin 331 and the second pin 332. Referring to FIG. 2, FIG. 4, FIG. 8, and FIG. 16, the third pin 333 is located outside the first pin 331 and the second pin 332 relative to the power structure 30, and the pins are staggered, which facilitates a rational arrangement of connecting points of the power structures 30 to the corresponding busbars. A gap between the first pin 331 and the second pin 332 allows one busbar connecting portion to be inserted, and the third pin 333 is connected to and penetrates this busbar connecting portion.

For example, a gap between the first pin 331 and the second pin 332 of the first power structure 31 allows the first busbar connecting portion 2011 to be inserted, and the third pin 333 of the first power structure 31 is connected to and penetrates the first busbar connecting portion 2011. The gap between the first pin 331 and the second pin 332 of the second power structure 32 allows the third busbar connecting portion 2031 to be inserted, and the third pin 333 of the second power structure 32 is connected to and penetrates the third busbar connecting portion 2031.

Further, the busbar connecting portion penetrated by the first pin 331 and the busbar connecting portion penetrated by the third pin 333 are partially stacked or staggered in a stacking direction of the plurality of the busbars. For example, as shown in FIGS. 6-7, the third busbar connecting portion 2031 penetrated by the first pin 331 of the first power structure 31 and the first busbar connecting portion 2011 penetrated by the third pin 333 are partially stacked or staggered in the stacking direction of the plurality of the busbars; the second busbar connecting portion 2021 penetrated by the first pin 331 of the second power structure 32 and the third busbar connecting portion 2031 penetrated by the third pin 333 are partially stacked or staggered in the stacking direction of the plurality of the busbars. Such design allows welding points between the power structure and the metal busbars to be located at positions where an edge of the busbar protrudes, and when using a traditional welding process, welding heat can be well maintained at the welding points, and a production process threshold is lower, so that the traditional process can be used for mass production.

Referring to FIGS. 14-16, the second pin 332 of the first power structure 31 and the second pin 332 of the second power structure 32 are both adapted to be directly connected to the driving circuit board 2000.

Specifically, one of the first busbar 201 and the second busbar 202 is a positive busbar and the other is a negative busbar. The third busbar 203 is a phase bar. For example, the first busbar 201 is a positive busbar and the second busbar 202 is a negative busbar, or the first busbar 201 is a negative busbar and the second busbar 202 is a positive busbar.

Further, the power unit assembly 1000 may further include a busbar clamp (not shown in the drawing) for clamping the first busbar 201 and the second busbar 202, which facilitates bonding of the first busbar 201 and the second busbar 202 and can shorten a distance between the first busbar 201 and the second busbar 202, thereby further reducing a height dimension of the power unit assembly 1000.

In the embodiments shown in FIGS. 6-16, each of the first busbar 201, the second busbar 202, and the third busbar 203 has a rectangular shape, and the first busbar 201, the second busbar 202, and the third busbar 203 are stacked in a thickness direction of the busbar, and the busbar connecting portion is formed on a longitudinal long side of a corresponding busbar. Specifically, the first busbar connecting portion 2011 is formed on a longitudinal long side at a first side of the first busbar 201, the second busbar connecting portion 2021 is formed on a longitudinal long side on a second side of the second busbar 202, and the third busbar connecting portion 2031 is formed on longitudinal long sides on both sides of the third busbar 203.

Referring to FIGS. 6-7 and FIGS. 9-13, an end of the first busbar 201 is provided with a first busbar adapter end plate 2012, an end of the second busbar 202 is provided with a second busbar adapter end plate 2022, the first busbar adapter end plate 2012 and the second busbar adapter end plate 2022 are located at the same end and arranged side by side, and the other end of the third busbar 203 opposite to the first busbar adapter end plate 2012 is provided with a third busbar adapter end plate 2032, thereby facilitating a rational arrangement of the adapter end plates of each of the busbars.

In some alternative embodiments, the first busbar 201, the second busbar 202, and the third busbar 203 are all flat busbars, which is beneficial to further reduce the dimension of the power unit assembly 1000 in the height direction.

In some unshown embodiments, the busbar connecting portion is provided with a through groove that allows the pin to pass through, and the through groove extends in a direction facing away from the busbar and penetrates an outer edge of the busbar connecting portion facing away from the busbar. For example, the through groove may be a "U"-shaped groove with an opening facing outward, thereby allowing the pin to pass through the through groove or be taken out of the through groove.

In some alternative embodiments, a surface of the busbar is entirely covered with an insulating thin film.

In other alternative embodiments, the busbar includes a busbar body and a busbar connecting portion. The busbar connecting portion protrudes from at least one side edge of a corresponding busbar and the busbar connecting portion is directly connected to the corresponding busbar, an outer surface of the busbar connecting portion is wrapped with an insulating film, and the busbar bodies of two adjacent busbars are separated from each other. In other words, only the outer surface of the busbar connecting portion can be covered with an insulating film, while the outer surface of the busbar body may not be covered with an insulating film, as long as it can be ensured that the busbar bodies of the two adjacent busbars are separated from each other, which is beneficial to save the material of the insulating film.

In still other alternative embodiments, the busbar includes: a busbar body. An outer surface of the busbar body is entirely covered with an insulating film, such that when a plurality of busbars is stacked, an insulation performance between two adjacent busbars is good.

Further, the busbar further includes a busbar connecting portion protruding from at least one side edge of a corresponding busbar body and directly connected to the corresponding busbar body. Outer surfaces of the busbar body and the busbar connecting portion are entirely covered with an insulating film, which can prevent the busbar from being electrically connected to other pins of the power structure 30, thereby leading to the better insulation performance between two adjacent busbars.

As shown in FIGS. 6-16, the busbar bodies of two adjacent busbars are arranged to be at least partially stacked, thereby facilitating reducing a volume of the power module 10000.

An inverter power assembly 20000 according to some embodiments of the present disclosure will be described in detail below with reference to FIGS. 17-57.

With reference to FIGS. 17-19, FIGS. 29-30, and FIGS. 54-57, the inverter power assembly 20000 according to the embodiment of the present disclosure may include a mounting frame 3000, a power module 10000 and a capacitor 3003. The power module 10000 is mounted on the mounting frame 3000, leading a compact layout of the power module 10000, which in turn leads to a compact structure of the entire inverter power assembly 20000. The capacitor 3003 is electrically connected to the power module 10000.

The inverter power assembly 20000 according to the embodiment of the present disclosure has the power module 10000 mounted on the mounting frame 3000 and the capacitor 3003 electrically connected to the power module 10000, thereby leading to a simple, compact, and reasonable arrangement for the structure of the entire inverter power assembly 20000.

In embodiments shown in FIGS. 17-39 and 54-57, the mounting frame 3000 may include a mounting underframe 4001 and at least one mounting branch-arm 4002 mounted on the mounting underframe 4001, and the power module 10000 is mounted on the mounting branch-arm 4002.

In the embodiments shown in FIGS. 17-39, the mounting branch-arm 4002 extends out from the mounting underframe 4001. In some embodiments, a bottom of the mounting branch-arm 4002 may be fixed to the mounting underframe 4001 by bolt fasteners or may be formed into one piece with the mounting underframe 4001.

Further, referring to FIGS. 21-28, the mounting branch-arm 4002 and the mounting underframe 4001 are provided therein with cooling chambers 4005 that are in communication with each other, and a cooling medium is adapted to circulate in the cooling chambers 4005, in order to take away heat generated when the power module 10000 is operating and thus prevent the power module 10000 from being overheated and damaged. The cooling chamber 4005 is arranged in the mounting frame 3000, and additional cooling components may not be provided, thereby leading to the more compact structure of the inverter power assembly 20000.

Alternatively, the cooling medium can be a cooling liquid or a cooling gas. In some cold conditions, the cooling chamber 4005 can also be filled with a medium having a relatively high temperature, in order to facilitate heating of the power module 10000 so that the power module 10000 is in a suitable temperature environment, which is beneficial to increase a service life of the power module 10000. For convenience of description, a case where the cooling chamber 4005 is filled with a low-temperature cooling medium is taken as an example for description below.

Specifically, the cooling chamber 4005 includes: an underframe cooling chamber 40051 located in the mounting underframe 4001 and a branch-arm cooling chamber 40052 located in the mounting branch-arm 4002. The branch-arm cooling chamber 40052 is in communication with the underframe cooling chamber 40051, and the cooling medium is suitable to circulate in the branch-arm cooling chamber 40052 and the underframe cooling chamber 40051, to take away the heat of the power module 10000.

Figure 18:
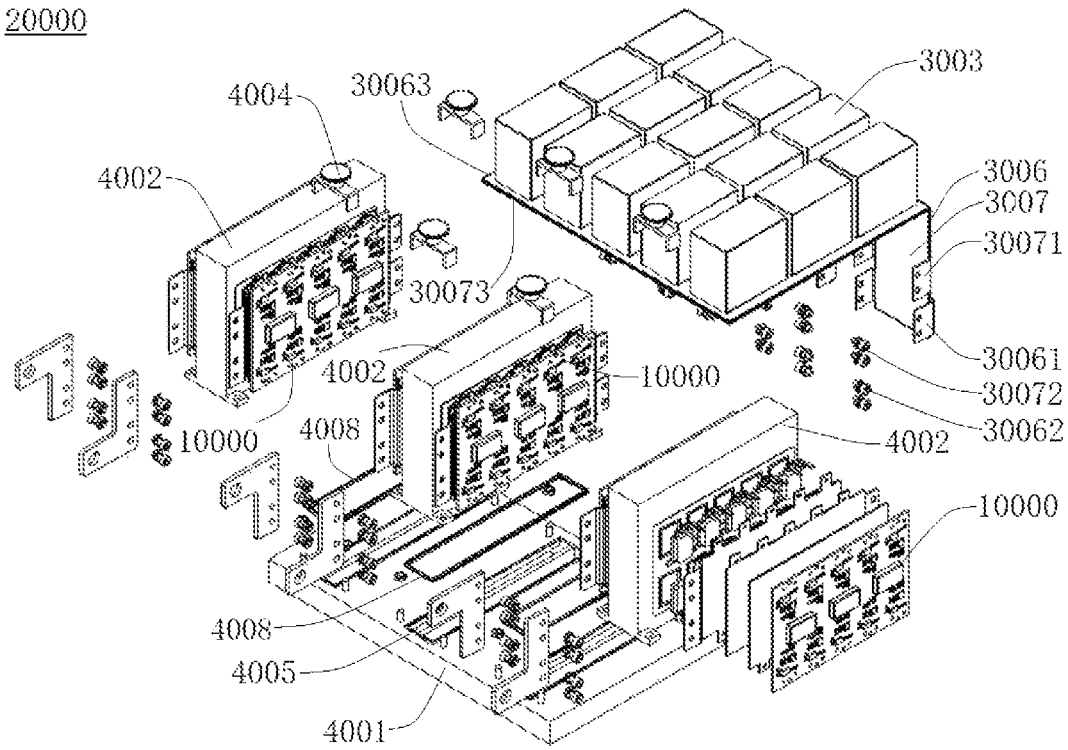
FIGS. 18-19 are exploded schematic views of an inverter power assembly of a first embodiment.
Figure 19:
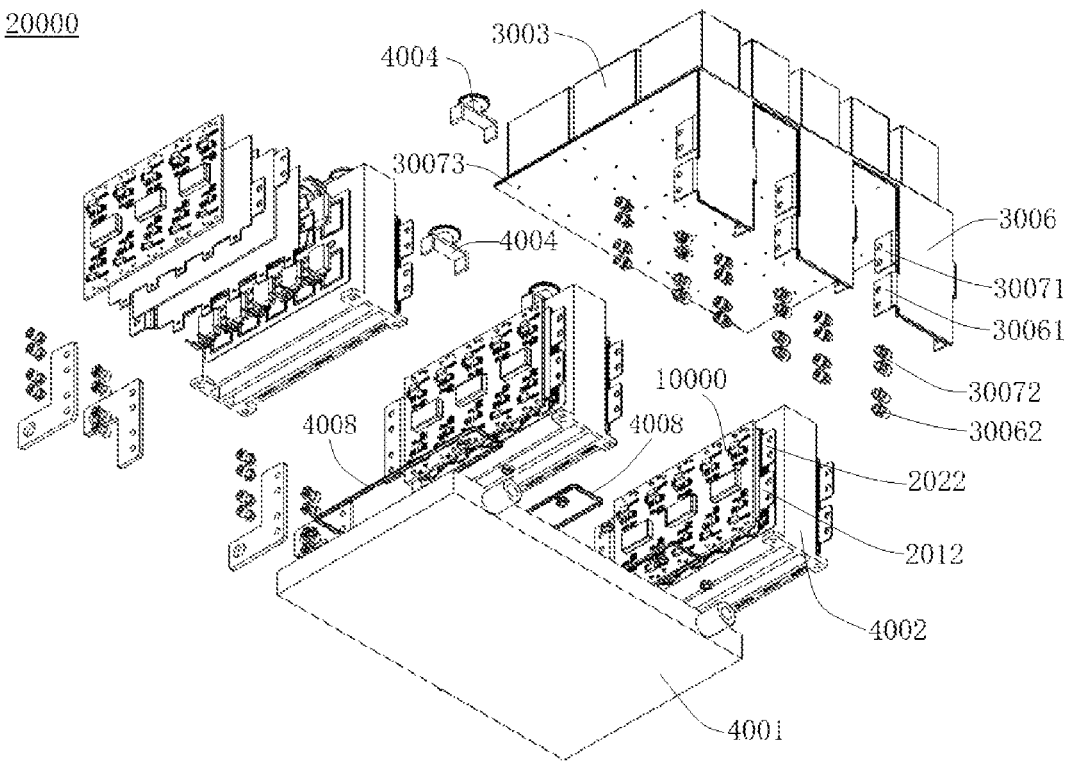
Figure 20:
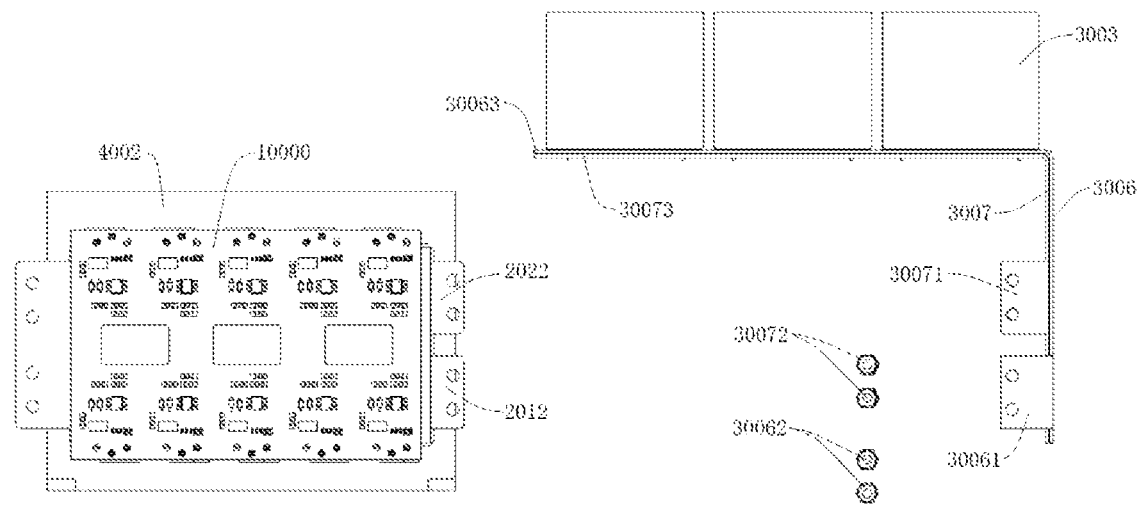
FIG. 20 is a schematic view of connections between a capacitor and a power module.

Referring to FIGS. 18-19, a sealing ring 4008 can be provided at a position where the mounting branch-arm 4002 and the mounting underframe 4001 are connected, to prevent the cooling medium from leaking from the position of connection.

Figure 22:
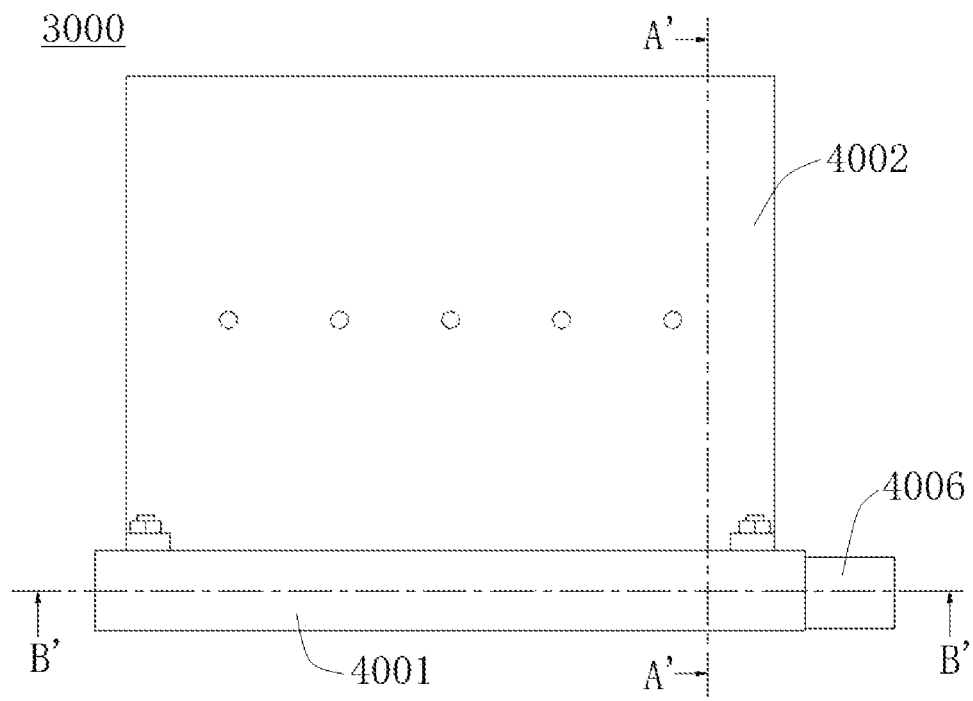
FIG. 22 is a right side view of a mounting frame of a first embodiment.
Figure 23:
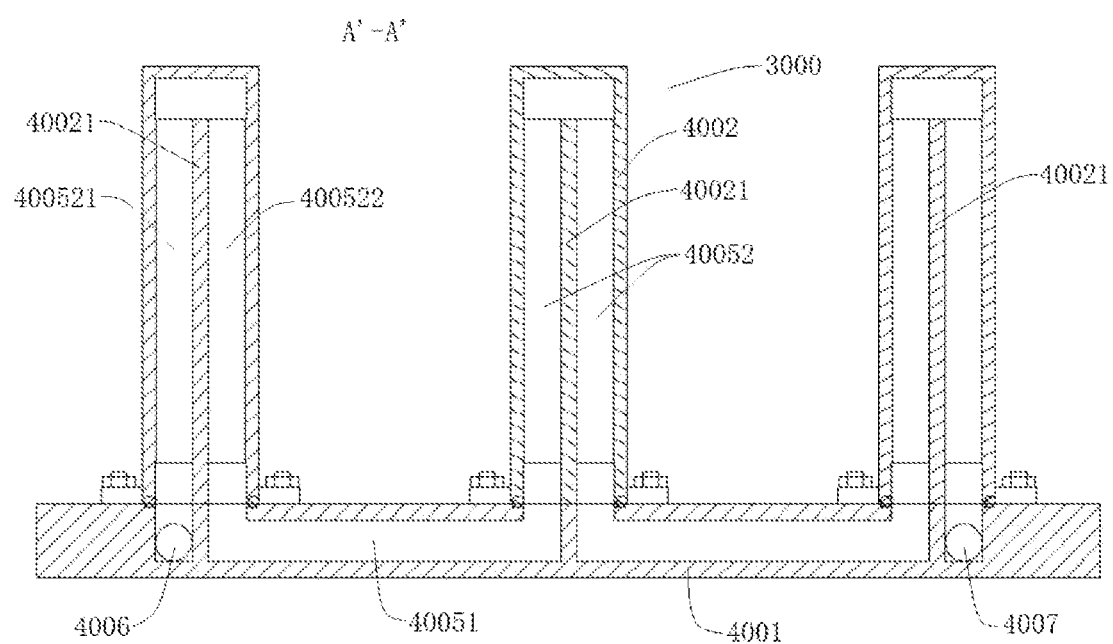
FIGS. 23-24 are cross-sectional views taken along A'-A' and B'-B' of FIG. 22 respectively.
Figure 24:
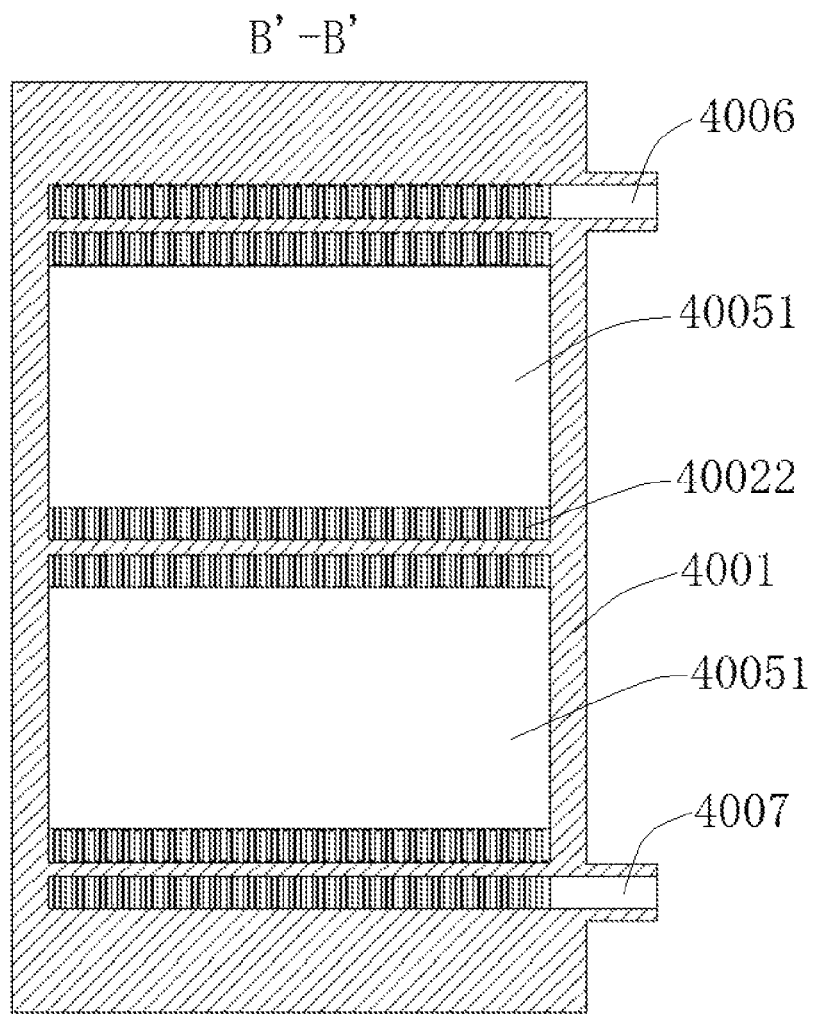
Figure 25:
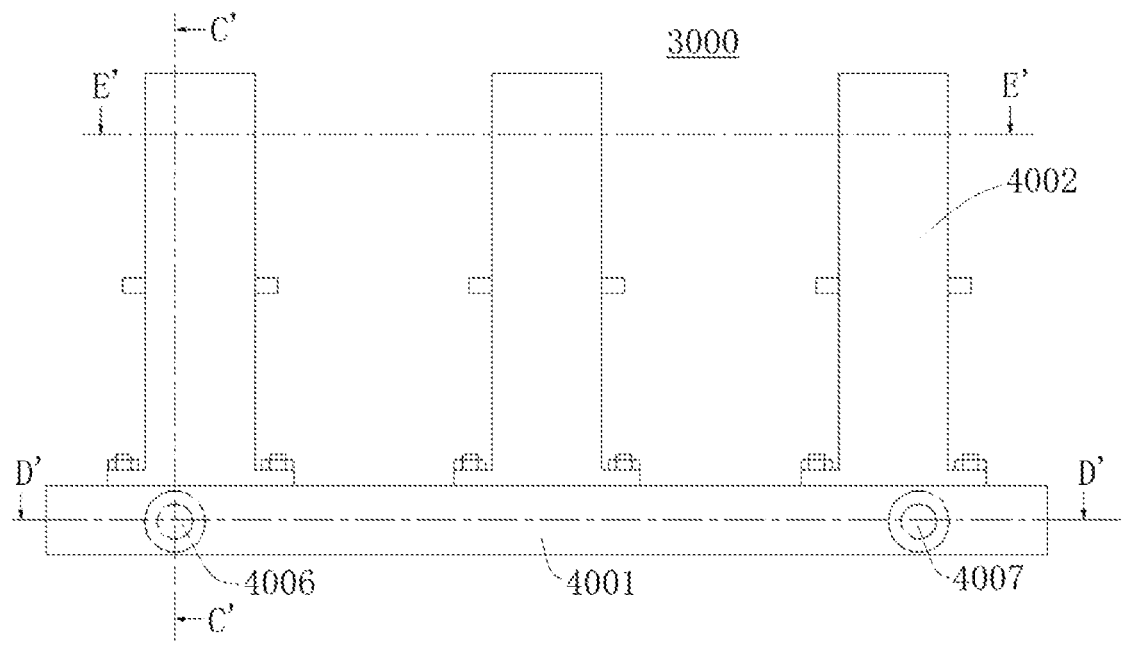
FIG. 25 is a front view of a mounting frame of a first embodiment.
Figure 26:
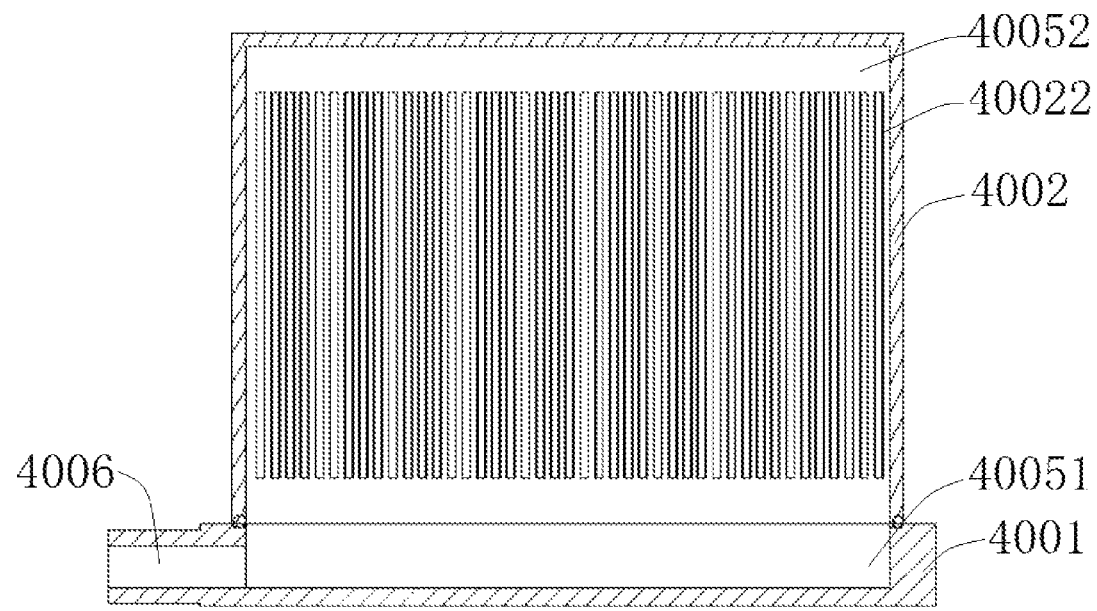
FIGS. 26-28 are cross-sectional views taken along C'-C', D'-D', and E'-E' of FIG. 25, respectively.
Figure 27:
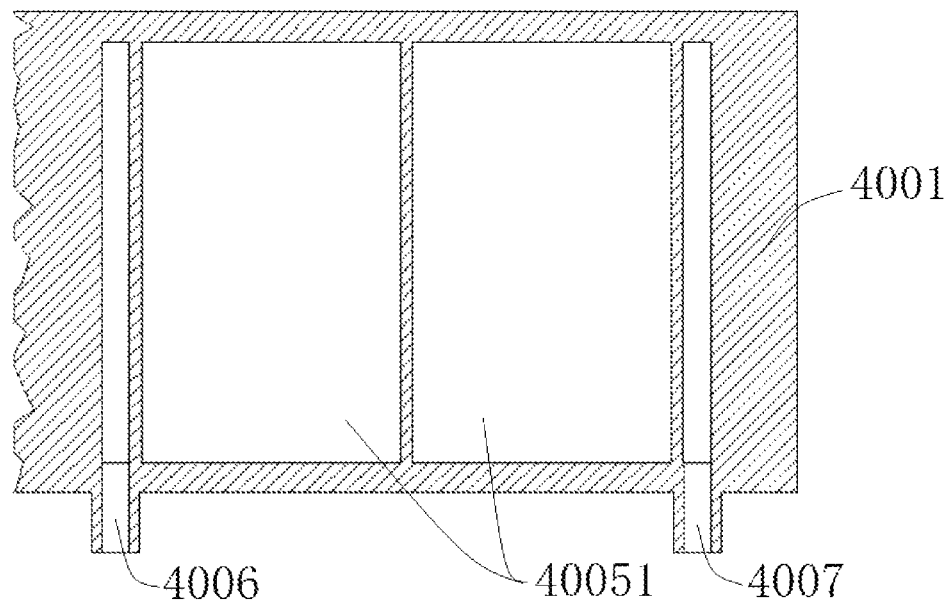
Figure 28:
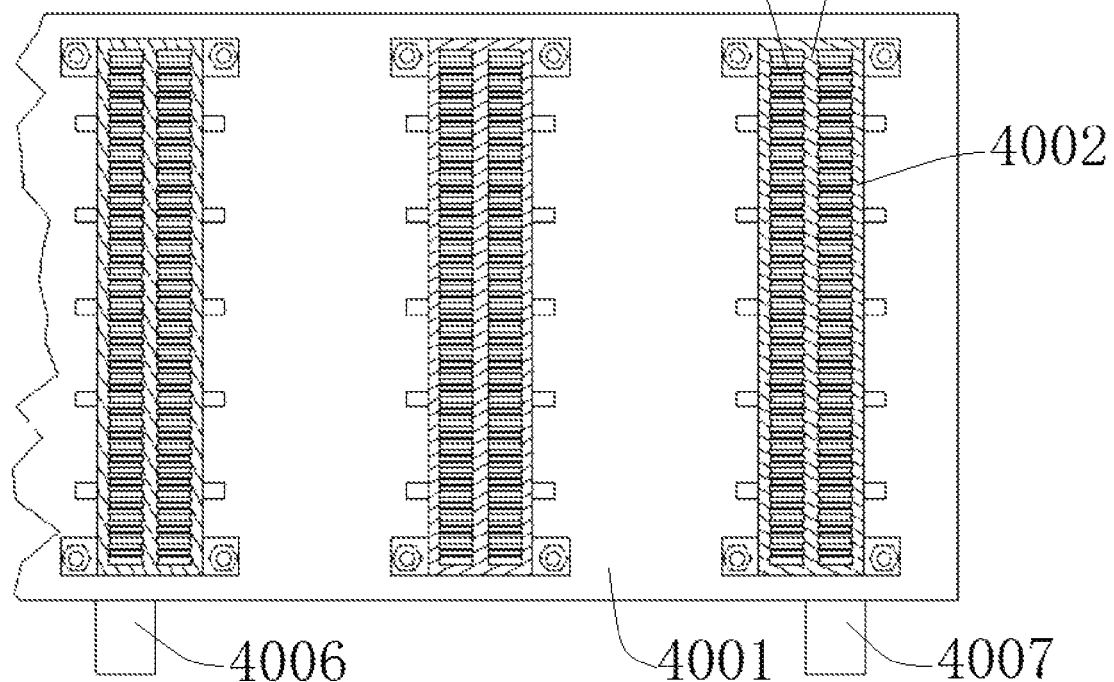
Figure 29:
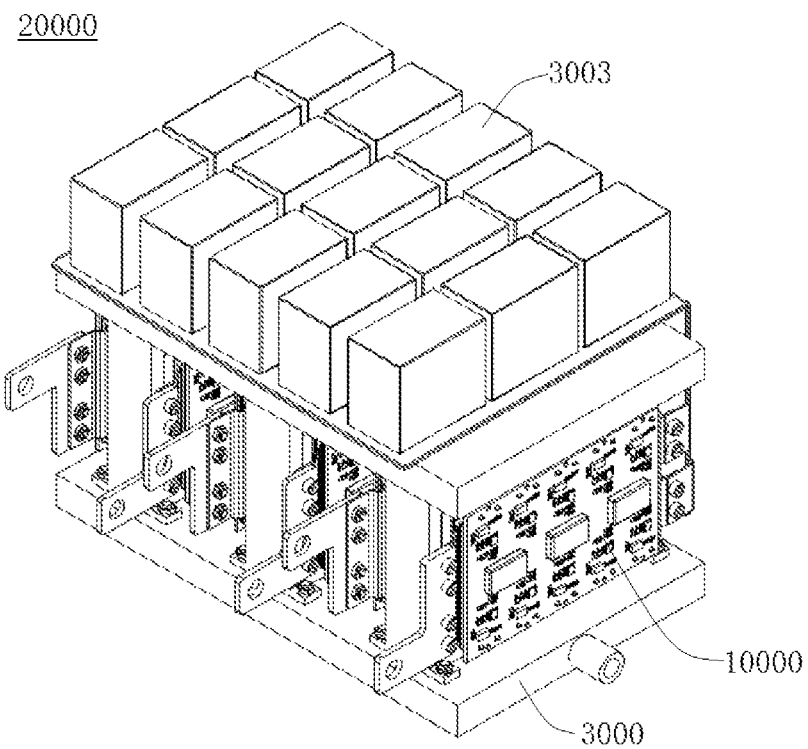
FIG. 29 is an assembled schematic view of an inverter power assembly of a second embodiment.

Further, as shown in FIGS. 22-23, a partition plate 40021 is provided in the chamber of the branch-arm cooling chamber 40052, the partition plate 40021 divides the branch-arm cooling chamber 40052 into a branch-arm inlet chamber 400521 and a branch-arm outlet chamber 400522, and the partition plate 40021 is separated from an inner top wall of the branch-arm cooling chamber 40052, so that the branch-arm inlet chamber 400521 and the branch-arm outlet chamber 400522 are in communication with each other at top of the branch-arm cooling chamber 40052. The cooling medium in the underframe cooling chamber 40051 of the mounting underframe 4001 flows into the mounting branch-arm 4002 via the branch-arm inlet chamber 400521, and then flows, via the branch-arm outlet chamber 400522, from the mounting branch-arm 4002 into the underframe cooling chamber 40051.

Specifically, the mounting underframe 4001 is provided with a first medium port 4006 and a second medium port 4007 that are in communication with the underframe cooling chamber 40051, one of the first medium port 4006 and the second medium port 4007 is a medium inlet, and the other is a medium outlet. The cooling medium flows into the underframe cooling chamber 40051 through the medium inlet, and the cooling medium in the underframe cooling chamber 40051 flows out from the mounting underframe 4001 through the medium outlet.

Alternatively, the first medium port 4006, the underframe cooling chamber 40051, the branch-arm inlet chamber 400521, the branch-arm outlet chamber 400522, and the second medium port 4007 are connected in series to form a medium passage. The cooling medium circulates in the medium passage to take away the heat of the power module 10000.

Specifically, there is a plurality of mounting branch-arms 4002, and the branch-arm outlet chamber 400522 of the mounting branch-arm 4002 located at an upstream side of the medium passage and the branch-arm inlet chamber 400521 of an adjacent mounting branch-arm 4002 at a downstream side are in communication with each other by the underframe cooling chamber 40051. As shown in FIG. 23, there are three mounting branch-arms 4002, the first medium port 4006 is a medium inlet, and the second medium port 4007 is a medium outlet. The first medium, the underframe cooling chamber 40051, the branch-arm inlet chamber 400521 and the branch-arm outlet chamber 400522 of the first mounting branch-arm 4002, the underframe cooling chamber 40051, the branch-arm inlet chamber 400521 and the branch-arm outlet chamber 400522 of the second mounting branch-arm 4002, the underframe cooling chamber 40051, the branch-arm inlet chamber 400521 and the branch-arm outlet chamber 400522 of the third mounting branch-arm 4002, the underframe cooling chamber 40051, and the second medium port 4007 are connected in series to form a medium passage. Specifically, the cooling medium flowing in from the first medium port 4006 reaches the underframe cooling chamber 40051, then enters the branch-arm inlet chamber 400521 of the first mounting branch-arm 4002 and then flows via the branch-arm outlet chamber 400522 into the underframe cooling chamber 40051, and the cooling medium in the underframe cooling chamber 40051 then enters the branch-arm inlet chamber 400521 of the second mounting branch-arm 4002 and then flows via the branch-arm outlet chamber 400522 into the underframe cooling chamber 40051, and the cooling medium in the underframe cooling chamber 40051 then enters the branch-arm inlet chamber 400521 of the third mounting branch-arm 4002 and then flows via the branch-arm outlet chamber 400522 into the underframe cooling chamber 40051, and the cooling medium in the underframe cooling chamber 40051 finally flows out through the second medium port 4007.

In some unshown embodiments, the first medium port 4006, the underframe cooling chamber 40051, the branch-arm inlet chamber 400521, the branch-arm outlet chamber 400522, and the second medium port 4007 can also form parallel medium passages therebetween. Specifically, the cooling medium flowing in from the first medium port 4006 reaches the underframe cooling chamber 40051, then respectively enters the branch-arm inlet chamber 400521 of the first mounting branch-arm 4002, the branch-arm inlet chamber 400521 of the second mounting branch-arm 4002, and the branch-arm inlet chamber 400521 of the third mounting branch-arm 4002, and then flows into the underframe cooling chamber 40051 respectively via the branch-arm exit cavity 400522 of the first mounting branch-arm 4002, the branch-arm exit cavity 400522 of the second mounting branch-arm 4002 and the branch-arm exit cavity 400522 of the third mounting branch-arm 4002, and the cooling medium in the underframe cooling chamber 40051 finally flows out through the second medium port 4007.

With reference to FIGS. 18-19, the mounting frame 3000 also includes a capacitor support element 4004 having one end fixed on the mounting branch-arm 4002 and the other end adapted to support the capacitor 3003. The capacitor support element 4004 includes: a cylindrical capacitor support portion and a "U"-shaped branch-arm connecting portion. The capacitor support portion is located on top of the branch-arm connecting portion, the branch-arm connecting portion is straddled on the mounting branch-arm 4002, and the capacitor support portion is used to support the capacitor 3003.

In the embodiments shown in FIGS. 29-39, the mounting frame 3000 may further include a mounting upper-frame 4003 provided on top of the mounting branch-arm 4002 and adapted to support the capacitor 3003. The power module 10000 is located between the mounting upper-frame 4003 and the mounting underframe 4001, in other words, the power module 10000 is mounted on the mounting branch-arm 4002 between the mounting upper-frame 4003 and the mounting underframe 4001. In some embodiments, the top of the mounting branch-arm 4002 can be fixed to the mounting upper-frame 4003 with bolt fasteners or can be formed into one piece with the mounting upper-frame 4003.

Figure 30:
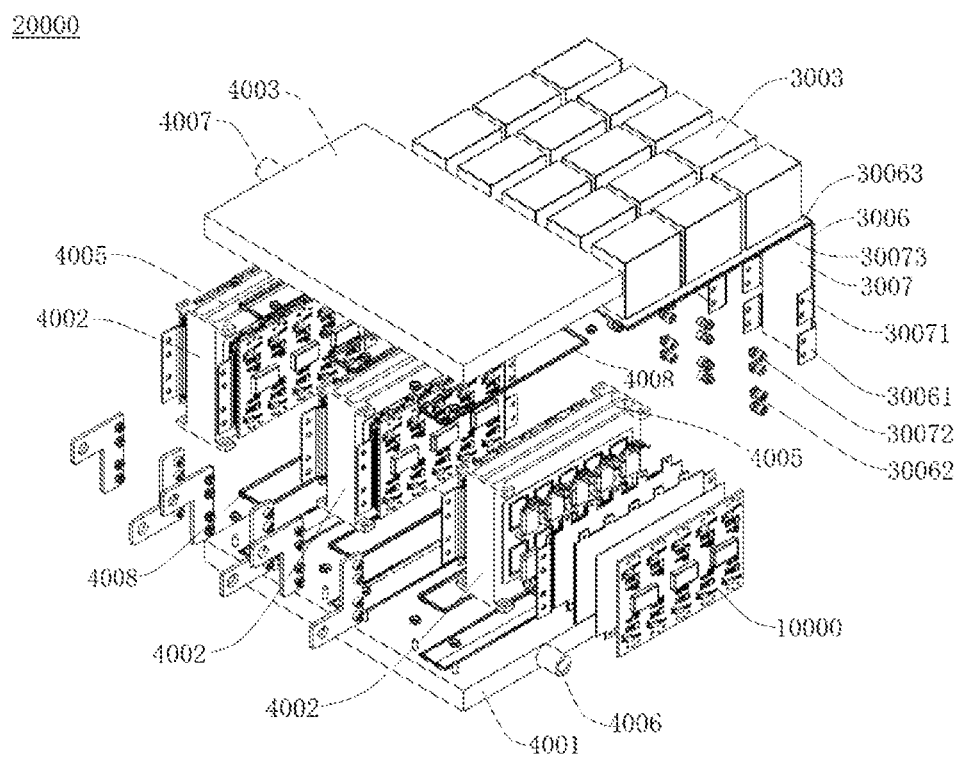
FIG. 30 is an exploded schematic view of an inverter power assembly of a second embodiment.
Figure 33:
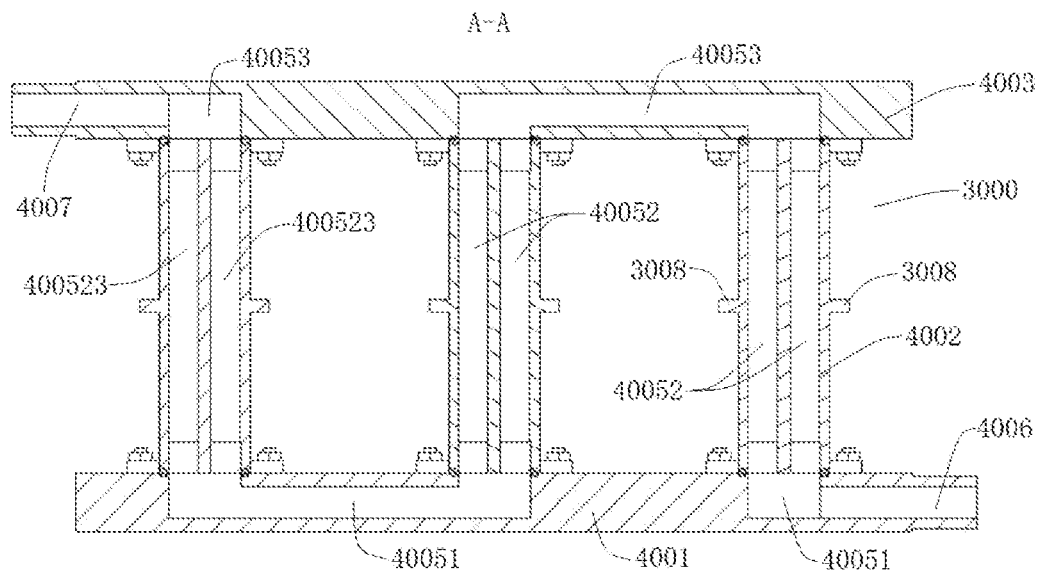
FIGS. 33-34 are cross-sectional views respectively taken along A-A and B-B of FIG. 32.
Figure 34:
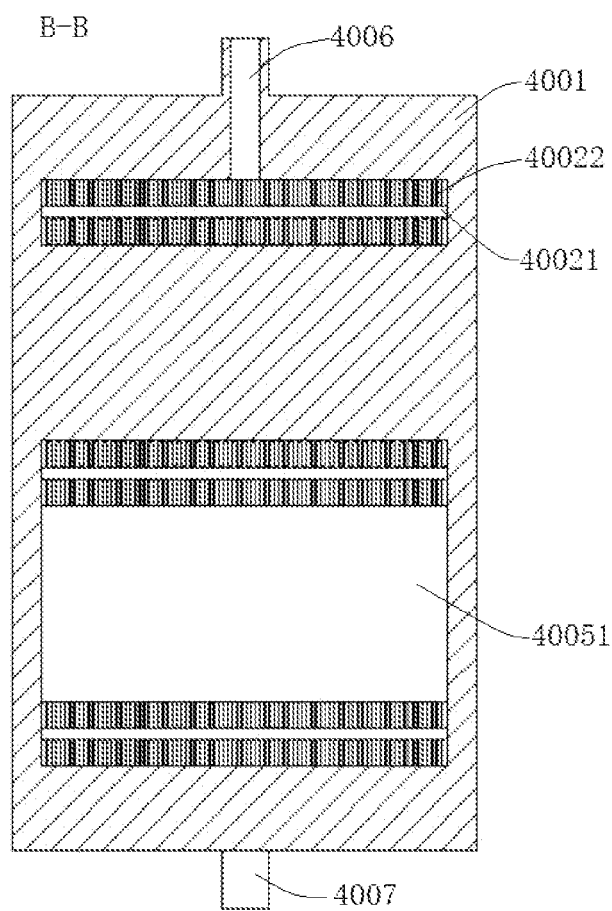
Figure 35:
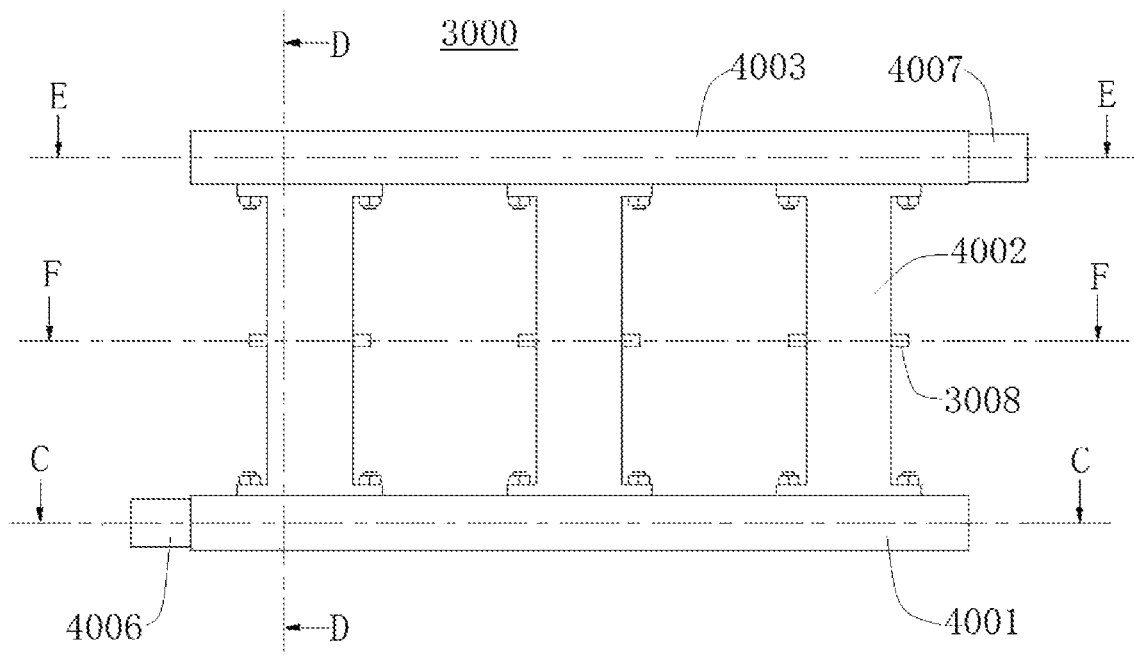
FIG. 35 is a front view of a mounting frame of a second embodiment.
Figure 36:
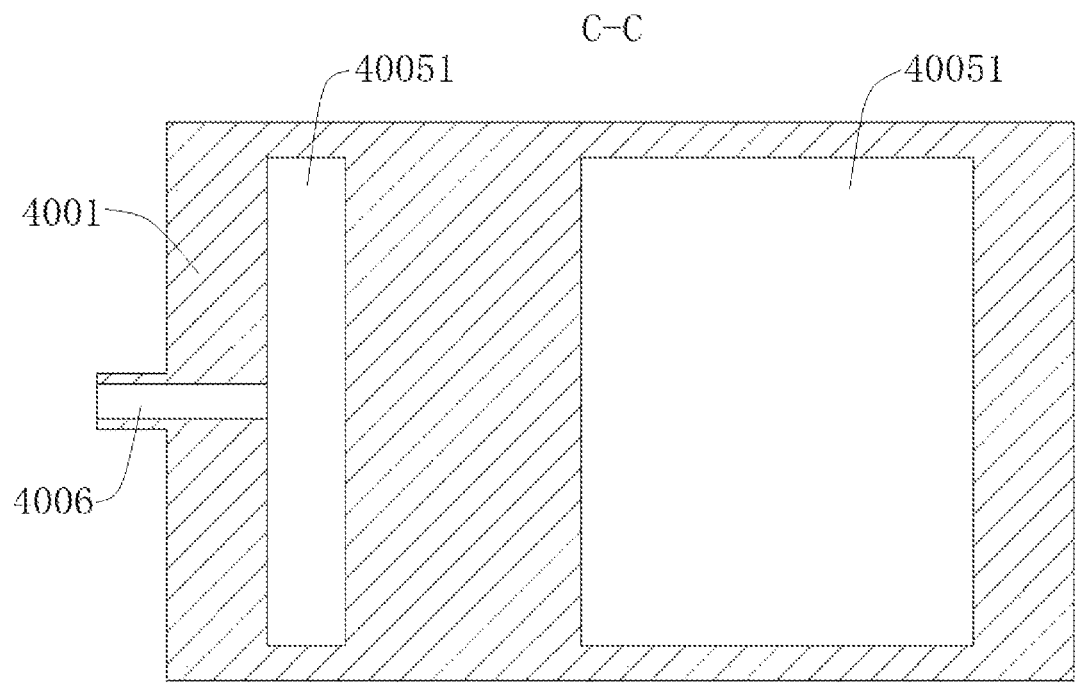
FIGS. 36-39 are cross-sectional views respectively taken along C-C, D-D, E-E, F-F of FIG. 35.
Figure 37:
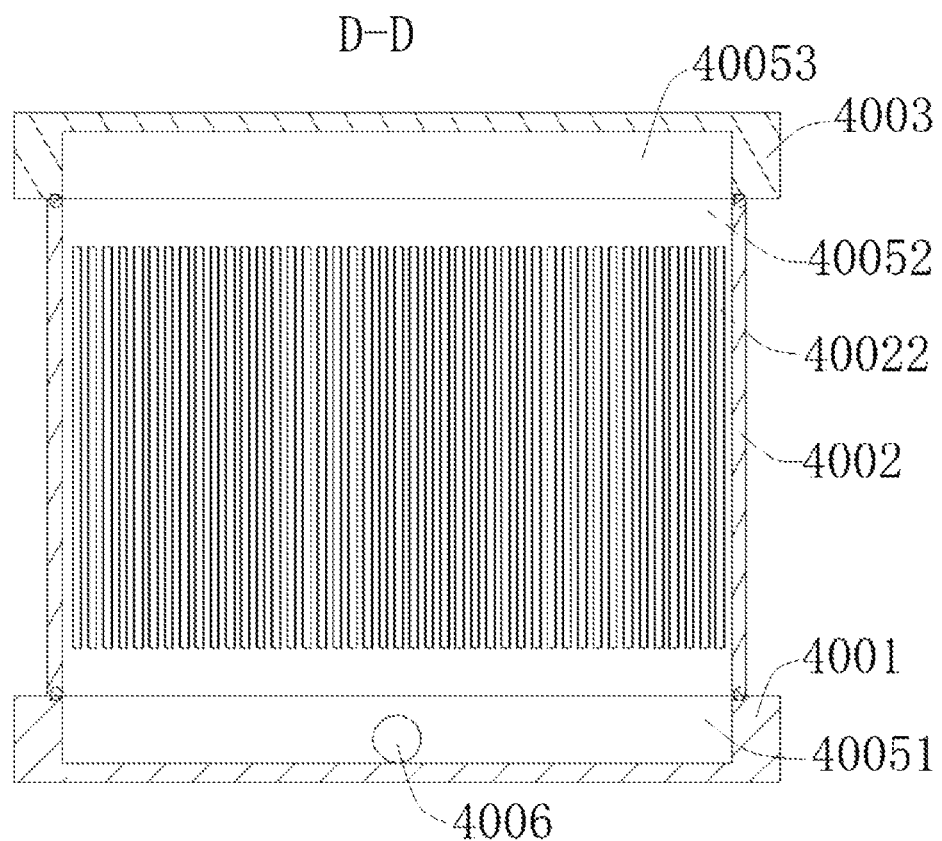
Figure 38:
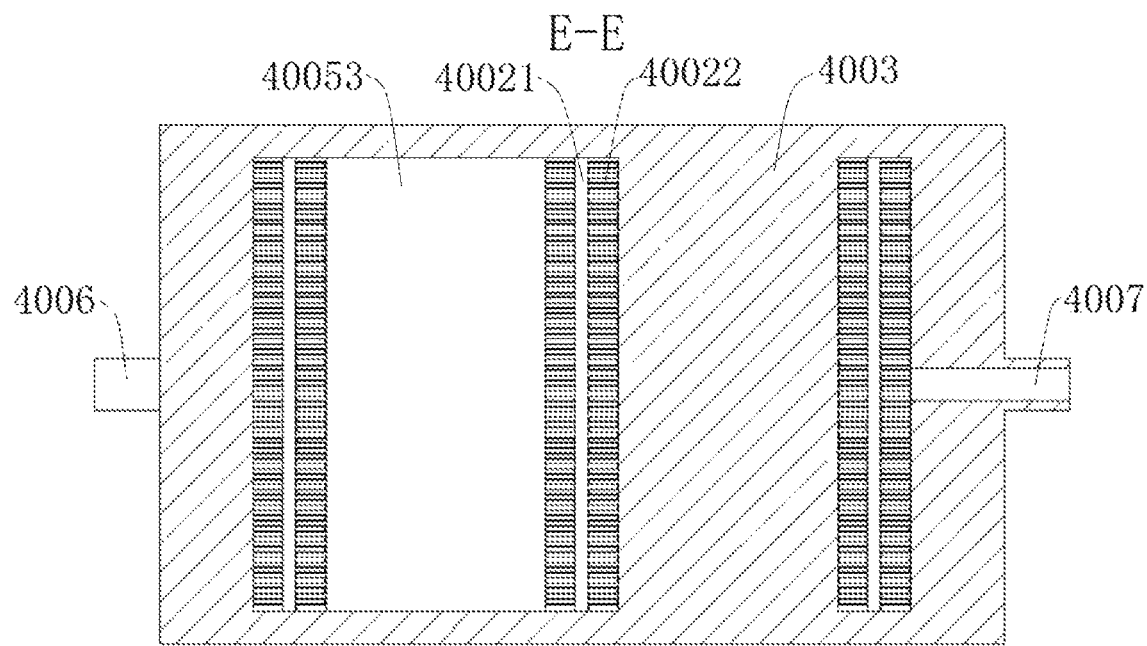
Figure 39:
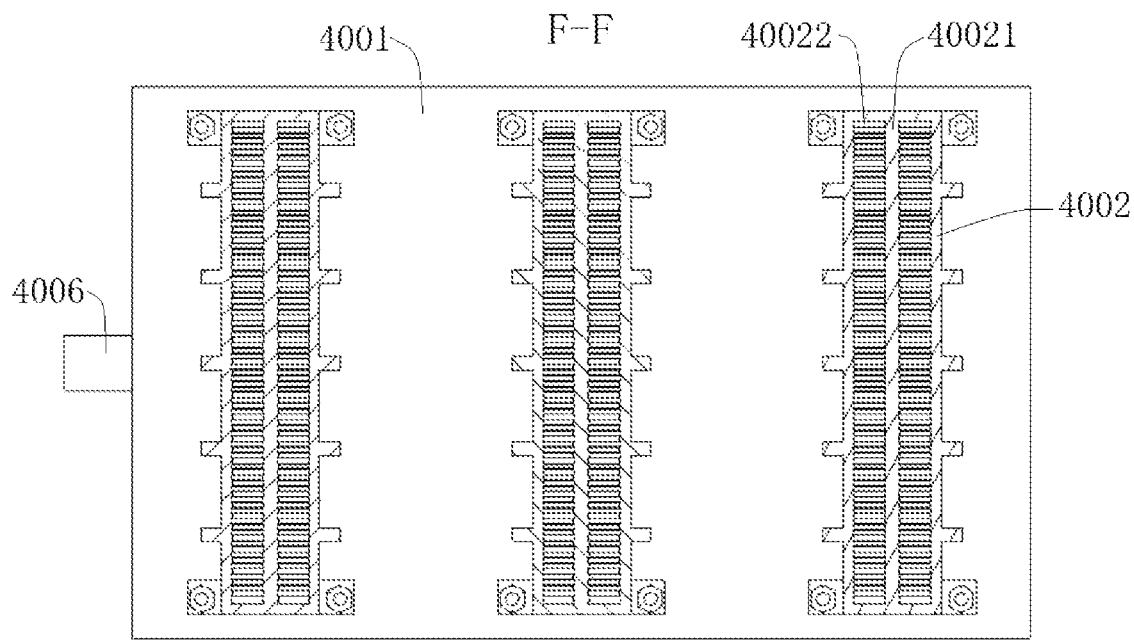
Figure 40:
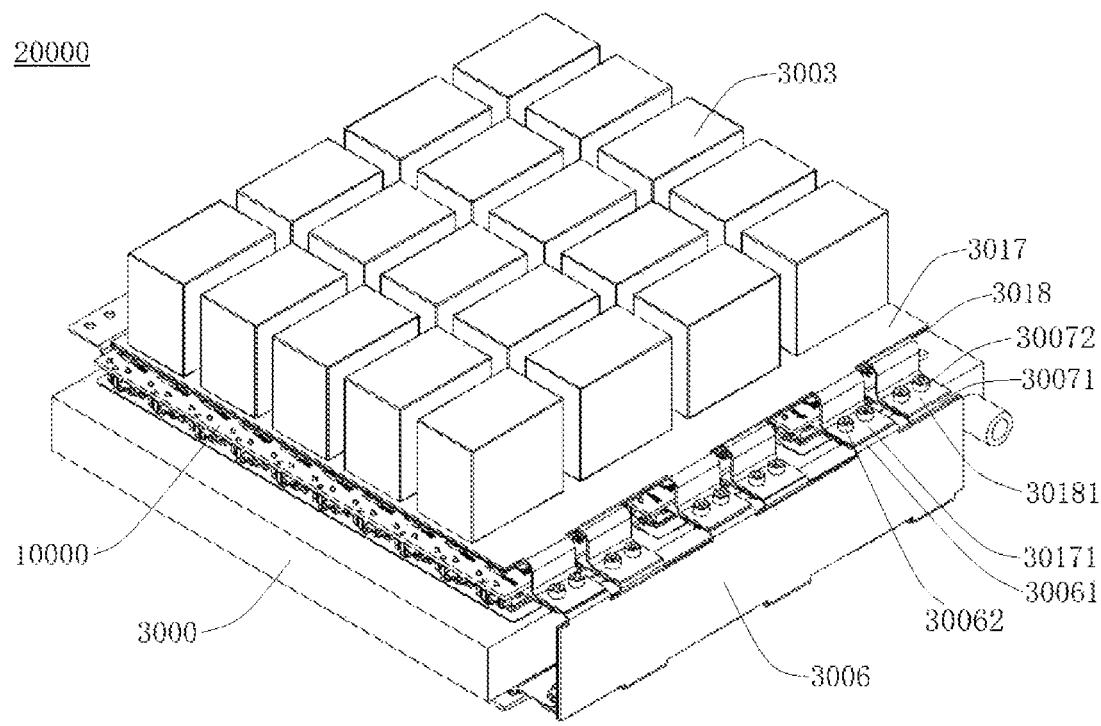
FIGS. 40-41 are assembled schematic views of an inverter power assembly of a third embodiment.
Figure 41:
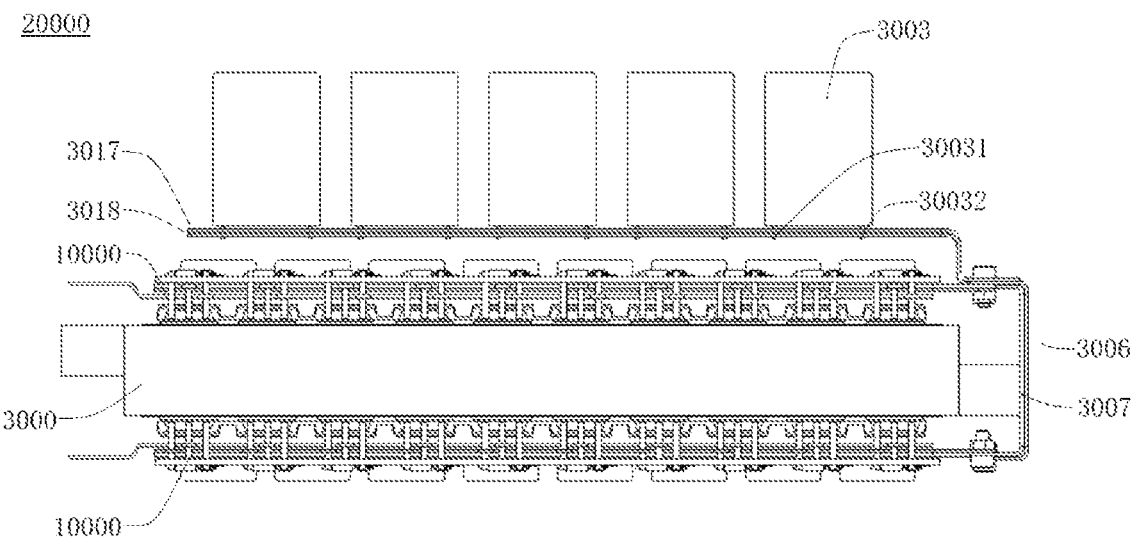
Figure 42:
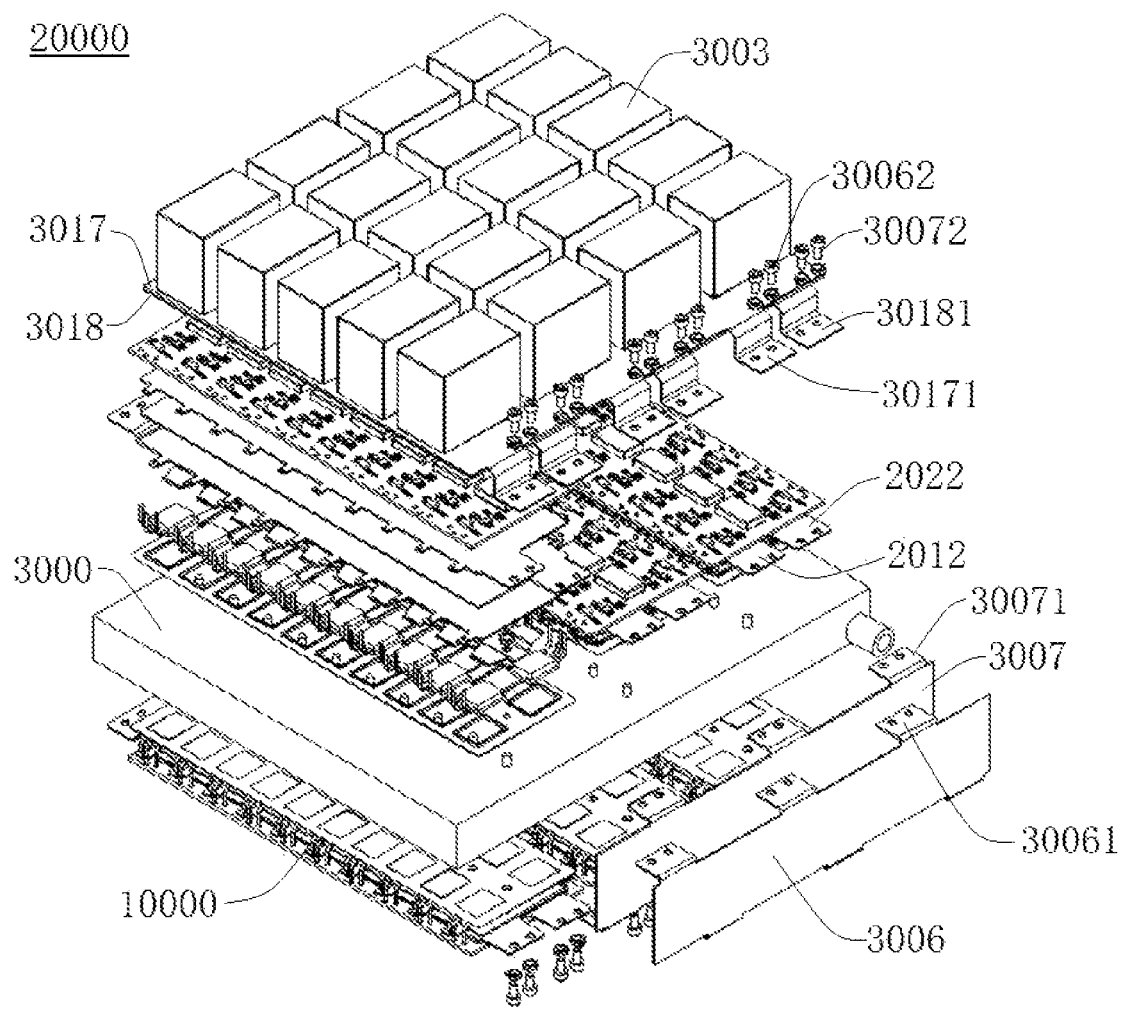
FIGS. 42-43 are exploded schematic views of an inverter power assembly of a third embodiment.
Figure 43:
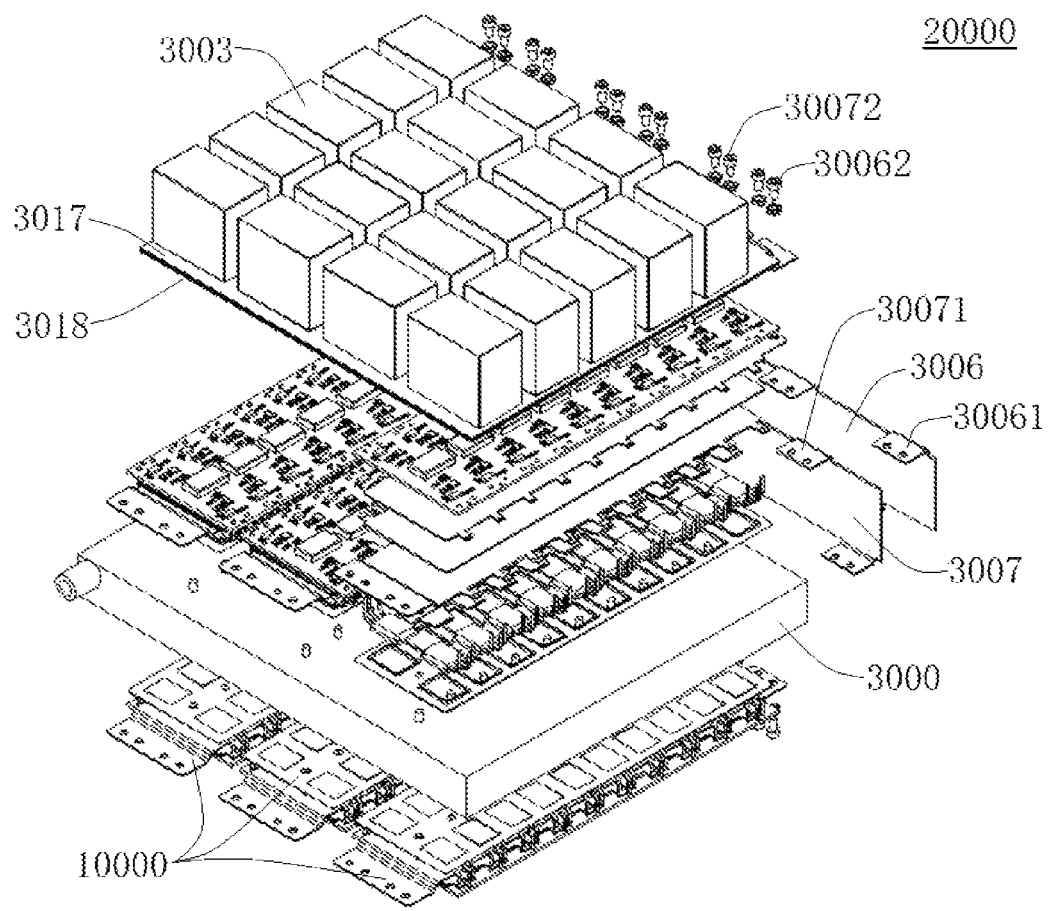
Figure 44:
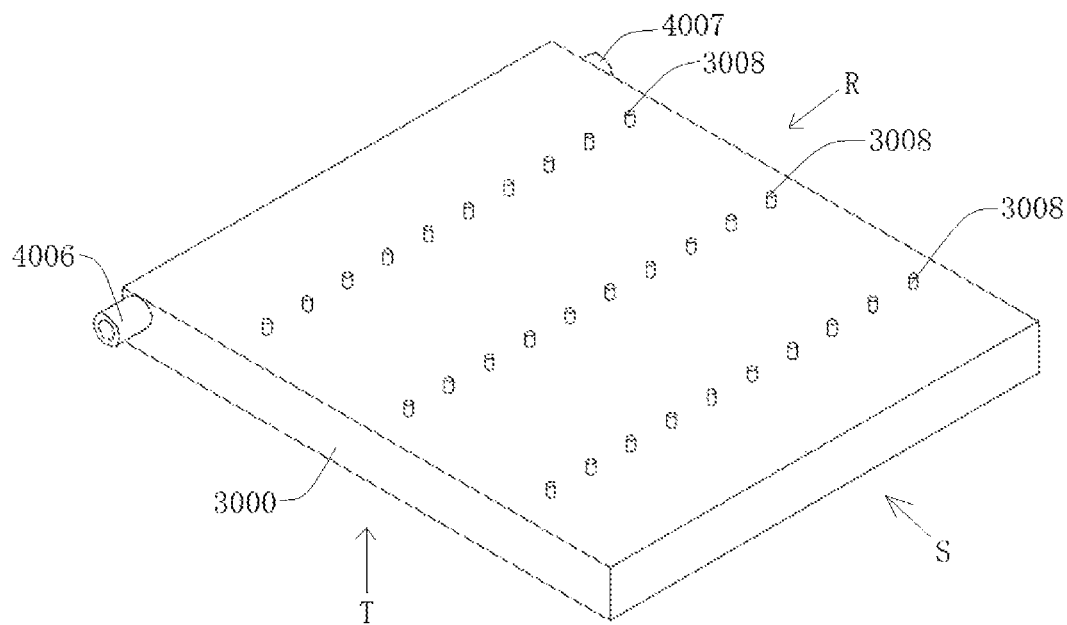
FIG. 44 is a perspective schematic view of a mounting frame of a third embodiment.

Further, as shown in FIG. 30 and FIG. 33, the mounting upper-frame 4003, the mounting branch-arm 4002, and the mounting underframe 4001 are provided therein with cooling chambers 4005 that are in communication with each other, and the cooling medium is adapted to circulate in the cooling chambers 4005, to take away the heat generated when the power module 10000 is operating, so as to prevent the power module 10000 from being overheated and damaged.

Specifically, the cooling chamber 4005 includes: an underframe cooling chamber 40051 located in the mounting underframe 4001, an upper-frame cooling chamber 40053 located in the mounting upper-frame 4003 and a branch-arm cooling chamber 40052 located in the mounting branch-arm 4002. The branch-arm cooling chamber 40052 is in communication with the upper-frame cooling chamber 40053 and the underframe cooling chamber 40051, and the cooling medium is suitable to circulate in the upper-frame cooling chamber 40053, the branch-arm cooling chamber 40052 and the underframe cooling chamber 40051, so as to take away the heat of the power module 10000.

As shown in FIG. 30, sealing rings 4008 may be provided at positions where the mounting branch-arm 4002 is connected to the mounting underframe 4001 and the mounting upper-frame 4003, to prevent the cooling medium from leaking from the positions of the connections.

In some unshown embodiments, the branch-arm cooling chamber 40052 has a single-channel chamber structure.

In the embodiment shown in FIG. 33, a partition plate 40021 is provided in a chamber of the branch-arm cooling chamber 40052, the partition plate 40021 divides the branch-arm cooling chamber 40052 into a plurality of branch-arm sub-chambers 400523, and each of the branch-arm sub-chambers 400523 is in communication with the upper-frame cooling chamber 40053 and the underframe cooling chamber 40051. For example, the partition plate 40021 can divide the branch-arm cooling chamber 40052 where it is located into two branch-arm sub-chambers 400523, and when the power modules 10000 are mounted on two opposite side surfaces (left and right) of the mounting branch-arm 4002, each of the power modules 10000 can be attached to the branch-arm sub-chamber 400523, so that the branch-arm sub-chamber 400523 can take away heat of a corresponding power module 10000. Moreover, the branch-arm cooling chamber 40052 is divided into a plurality of branch-arm sub-chambers 400523, which can increase a flow rate of the cooling medium, thereby taking away the heat of the power module 10000 faster.

The mounting underframe 4001 is provided with a first medium port 4006 in communication with the underframe cooling chamber 40051, the mounting upper-frame 4003 is provided with a second medium port 4007 in communication with the upper-frame cooling chamber 40053, one of the first medium port 4006 and the second medium port 4007 is a medium inlet, and the other is a medium outlet. The cooling medium flows into the cooling chamber 4005 through the medium inlet, and the cooling medium in the cooling chamber 4005 flows out from the mounting frame 3000 through the medium outlet.

Alternatively, the second medium port 4007, the upper-frame cooling chamber 40053, the branch-arm cooling chamber 40052, the underframe cooling chamber 40051, and the first medium port 4006 are connected in series to form a medium passage. The cooling medium circulates in the medium passage to take away the heat of the power module 10000.

Further, there is a plurality of mounting branch-arms 4002, a bottom end of the branch-arm cooling chamber 40052 of the mounting branch-arm 4002 in communication with the second medium port 4007 is in communication with a bottom end of the branch-arm cooling chamber 40052 of an adjacent mounting branch-arm 4002 through the underframe cooling chamber 40051, a top end of the branch-arm cooling chamber 40052 of the mounting branch-arm 4002 in communication with the first medium port 4006 is in communication with a top end of the branch-arm cooling chamber 40052 of the adjacent mounting branch-arm 4002 through the upper-frame cooling chamber 40053, and branch-arm cooling chambers 40052 of other two adjacent mounting branch-arms 4002 are in communication in series through the upper-frame cooling chamber 40053 at the top end or the underframe cooling chamber 40051 at the bottom end.

It should be noted that the two adjacent mounting branch-arms 4002 here are aimed at a flow direction of the same serial-connected medium passage, one of the two adjacent mounting branch-arms 4002 is located at an upstream side of the medium passage, and the other is located at a downstream side of the medium passage.

Alternatively, the first medium port 4006 is a medium inlet, the second medium port 4007 is a medium outlet, and the cooling medium flows from bottom to top, thereby facilitating filling the entire cooling chamber 4005. In the embodiment shown in FIG. 33, there are three mounting branch-arms 4002, the second medium port 4007 is in communication with the top end of the branch-arm cooling chamber 40052 of the first mounting branch-arm 4002 through the upper-frame cooling chamber 40053, the bottom end of the branch-arm cooling chamber 40052 of the first mounting branch-arm 4002 is in communication with the bottom end of the branch-arm cooling chamber 40052 of the second mounting branch-arm 4002 through the underframe cooling chamber 40051, the top end of the branch-arm cooling chamber 40052 of the second mounting branch-arm 4002 is in communication with the top end of the branch-arm cooling chamber 40052 of the third mounting branch-arm 4002 through the upper-frame cooling chamber 40053, and the bottom end of the branch-arm cooling chamber 40052 of the third mounting branch-arm 4002 is in communication with the first medium port 4006 through the underframe cooling chamber 40051.

The cooling medium flowing in from the first medium port 4006 reaches the underframe cooling chamber 40051, then flows in via the bottom end of the branch-arm cooling chamber 40052 of the third mounting branch-arm 4002 and then flows into the upper-frame cooling chamber 40053 through the top end of the branch-arm cooling chamber 40052 of the third mounting branch-arm 4002. The cooling medium in the upper-frame cooling chamber 40053 flows in through the top end of the branch-arm cooling chamber 40052 of the second mounting branch-arm 4002, and then flows into the underframe cooling chamber 40051 through the bottom end of the branch-arm cooling chamber 40052 of the second mounting branch-arm 4002. The cooling medium in the underframe cooling chamber 40051 flows in through the bottom end of the branch-arm cooling chamber 40052 of the first mounting branch-arm 4002 and then flows into the upper-frame cooling chamber 40053 through the top end of the branch-arm cooling chamber 40052 of the first mounting branch-arm 4002. The cooling medium in the upper-frame cooling chamber 40053 finally flows out through the second medium port 4007.

In some unknown embodiments, the second medium port 4007, the upper-frame cooling chamber 40053, the branch-arm cooling chamber 40052, the underframe cooling chamber 40051, and the first medium port 4006 may form parallel medium passages therebetween. Specifically, the cooling medium flowing in from the first medium port 4006 reaches the underframe cooling chamber 40051, then respectively enters the branch-arm sub-chamber 400523 of the first mounting branch-arm 4002, the branch-arm sub-chamber 400523 of the second mounting branch-arm 4002 and the branch-arm sub-chamber 400523 of the third mounting branch-arm 4002, and then flows into the upper-frame cooling chamber 40053, and the cooling medium in the upper-frame cooling chamber 40053 finally flows out through the second medium port 4007.

In some alternative embodiments, it is also possible that the first medium port 4006 is the medium outlet and the second medium port 4007 is the medium inlet, and in this case, a flow path of the cooling medium is opposite to the above path and will not be repeated here.

Figure 31:
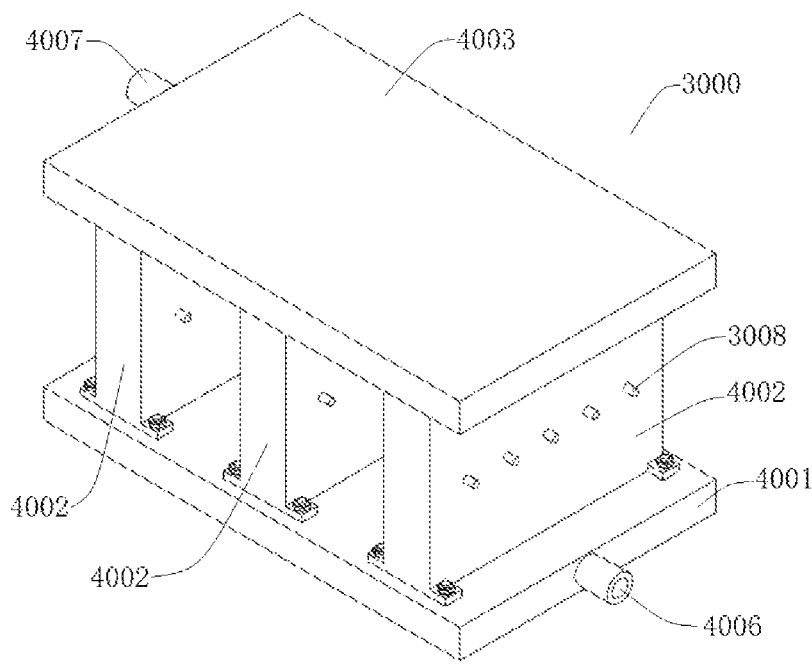
FIG. 31 is a perspective schematic view of a mounting frame of a second embodiment.
Figure 32:
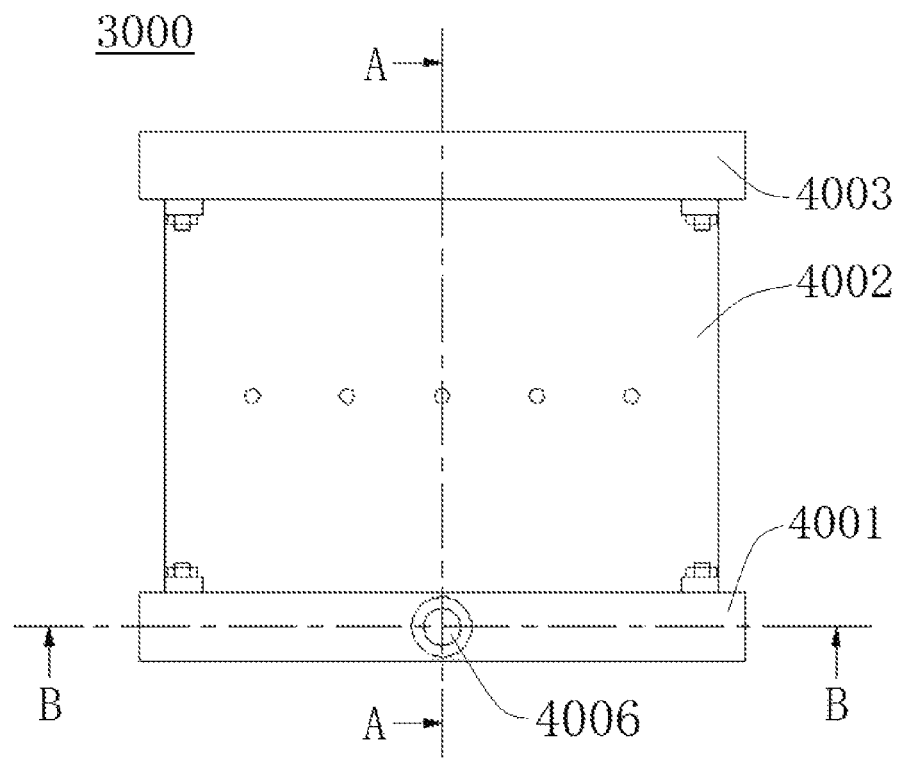
FIG. 32 is a right side view of a mounting frame of a second embodiment.

Alternatively, the mounting upper-frame 4003 is parallel to the mounting underframe 4001, as shown in FIGS. 31-33, which leads to a consistent spacing between the mounting upper-frame 4003 and the mounting underframe 4001, thereby facilitating indiscriminately installing the power module 10000.

Alternatively, the mounting branch-arm 4002 is perpendicular to the mounting underframe 4001, as shown in FIG. 21-FIG. 23, FIG. 31-FIG. 33, which leads to consistent spaces on two sides of the mounting branch-arm 4002, thereby facilitating indiscriminately installing the power module 10000.

Referring to FIGS. 24-28 and 34-39, a plurality of fins 40022 is provided in the branch-arm cooling chamber 40052, the plurality of the fins 40022 has one end connected to the partition plate 40021 and the other end connected to a chamber wall of the branch-arm cooling chamber 40052. Two adjacent fins 40022, the partition plate 40021 and the chamber wall of the branch-arm cooling chamber 40052 together define a fin sub-chamber. The cooling medium circulates in the fin sub-chamber to take away the heat of the power module 10000. The fin sub-chamber has a relatively small cross-sectional area, which facilitates accelerating of the cooling medium.

Alternatively, the plurality of the fins 40022 is parallel to each other. Preferably, there is a consistent spacing between two adjacent fins 40022, which leads to a consistent cross-sectional areas of respective fin sub-chambers, thereby ensuring a consistent flow rate of the cooling medium.

In the embodiments shown in FIGS. 54-57, the mounting underframe 4001 includes a first underframe 40011 and a second underframe 40012, and the mounting branch-arm 4002 is set up on the first underframe 40011 and the second underframe 40012.

Further, the mounting branch-arm 4002, the first underframe 40011, and the second underframe 40012 are provided therein with cooling chambers that are in communication with each other.

Specifically, the cooling chamber includes: a first cooling chamber located in the first underframe 40011, a second cooling chamber located in the second underframe 40012, and a branch-arm cooling chamber located in the mounting branch-arm 4002. The first cooling chamber and the branch-arm cooling chamber are in communication with the second cooling chamber.

Figure 54:
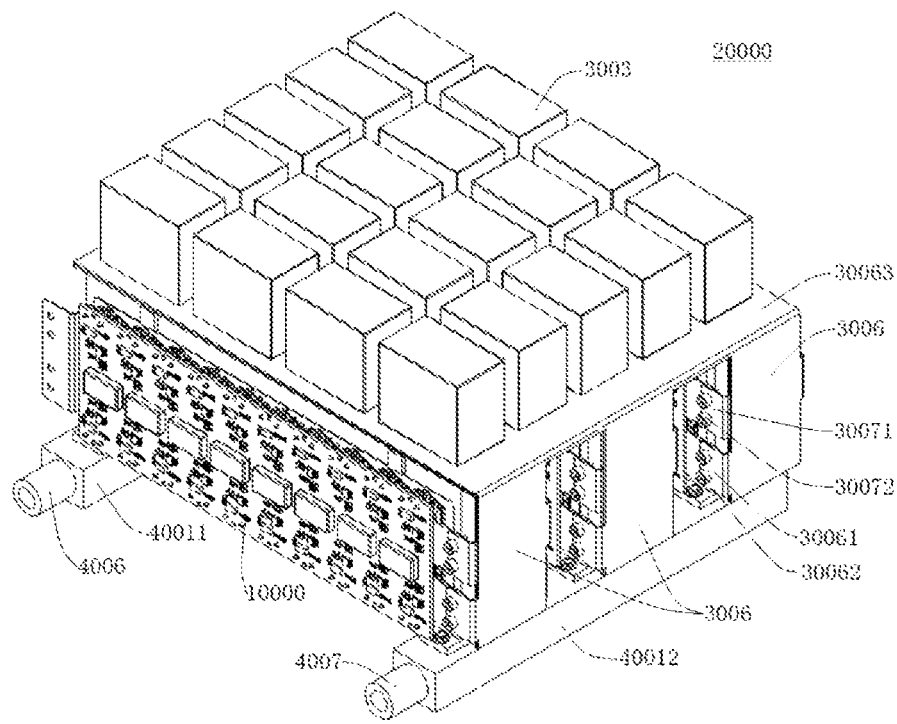
FIGS. 54-55 are assembled schematic views of an inverter power assembly of a fourth embodiment.
Figure 55:
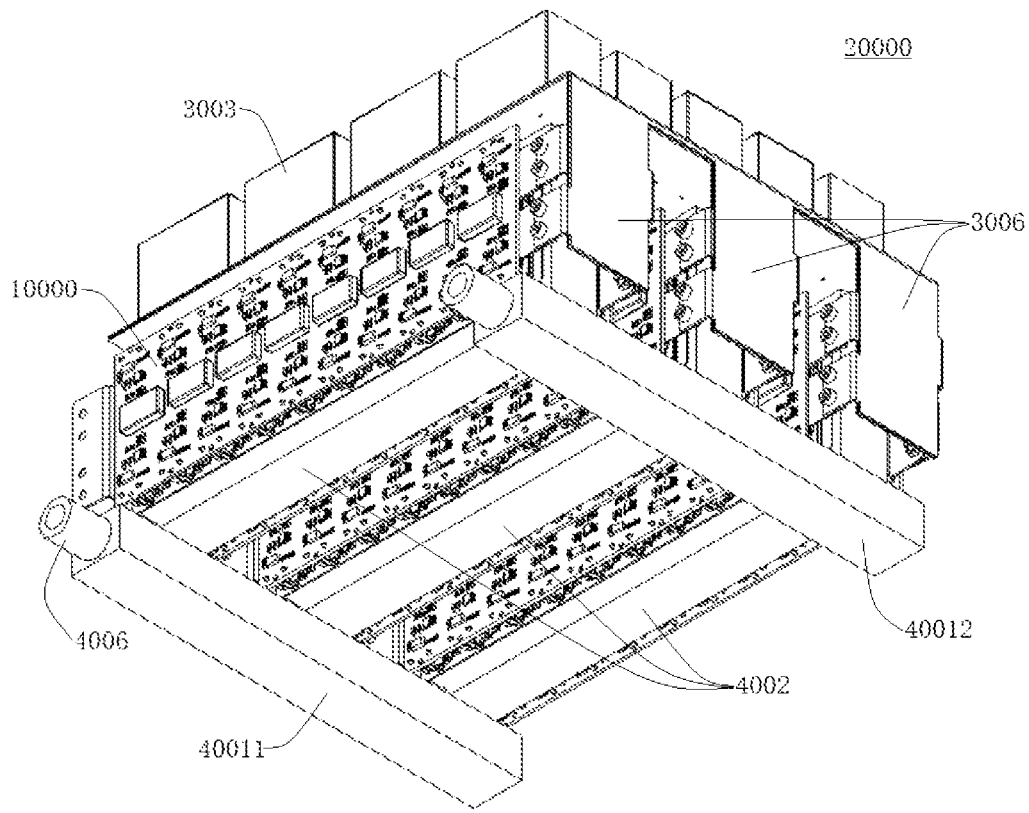

Referring to FIG. 54, the first underframe 40011 is provided with a first medium port 4006 in communication with the first cooling chamber, the second underframe 40012 is provided with a second medium port 4007 in communication with the second cooling chamber, one of the first medium port 4006 and the second medium port 4007 is a medium inlet, and the other is a medium outlet.

Alternatively, there is a plurality of the mounting branch-arms 4002, and a plurality of branch-arm cooling chambers is arranged in parallel between the first cooling chamber and the second cooling chamber.

Figure 56:
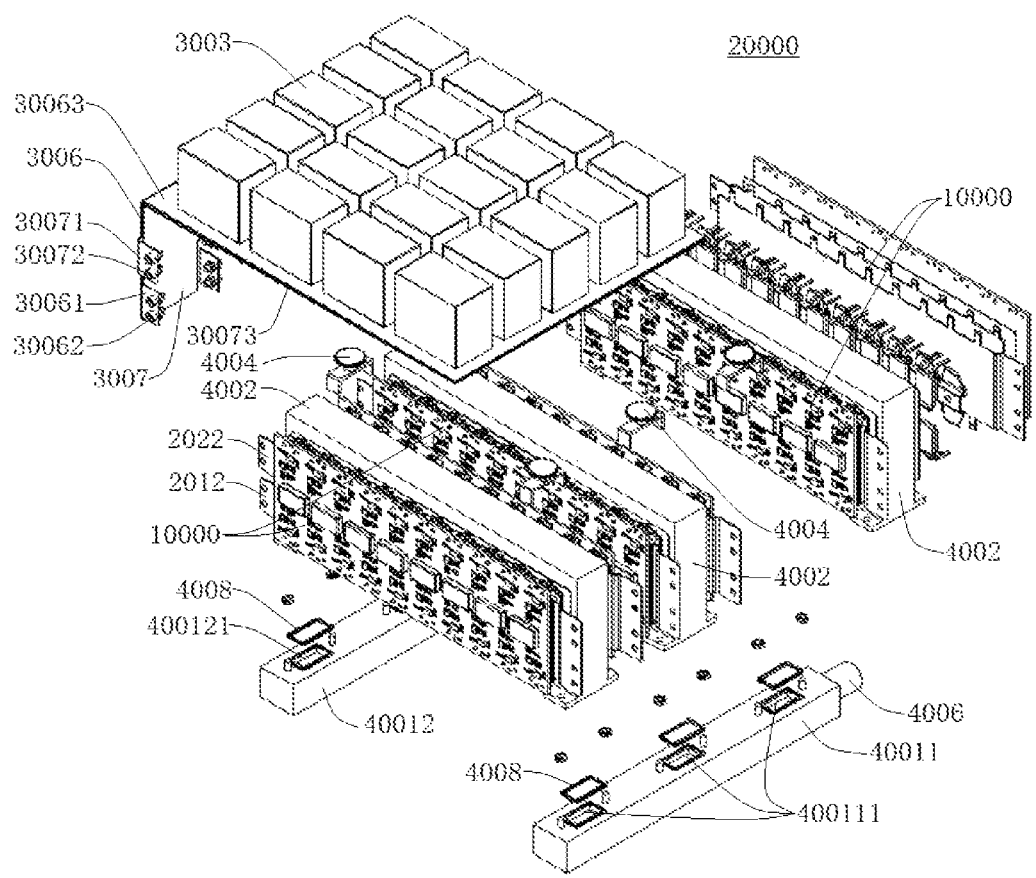
FIGS. 56-57 are exploded schematic views of an inverter power assembly of a fourth embodiment.
Figure 57:
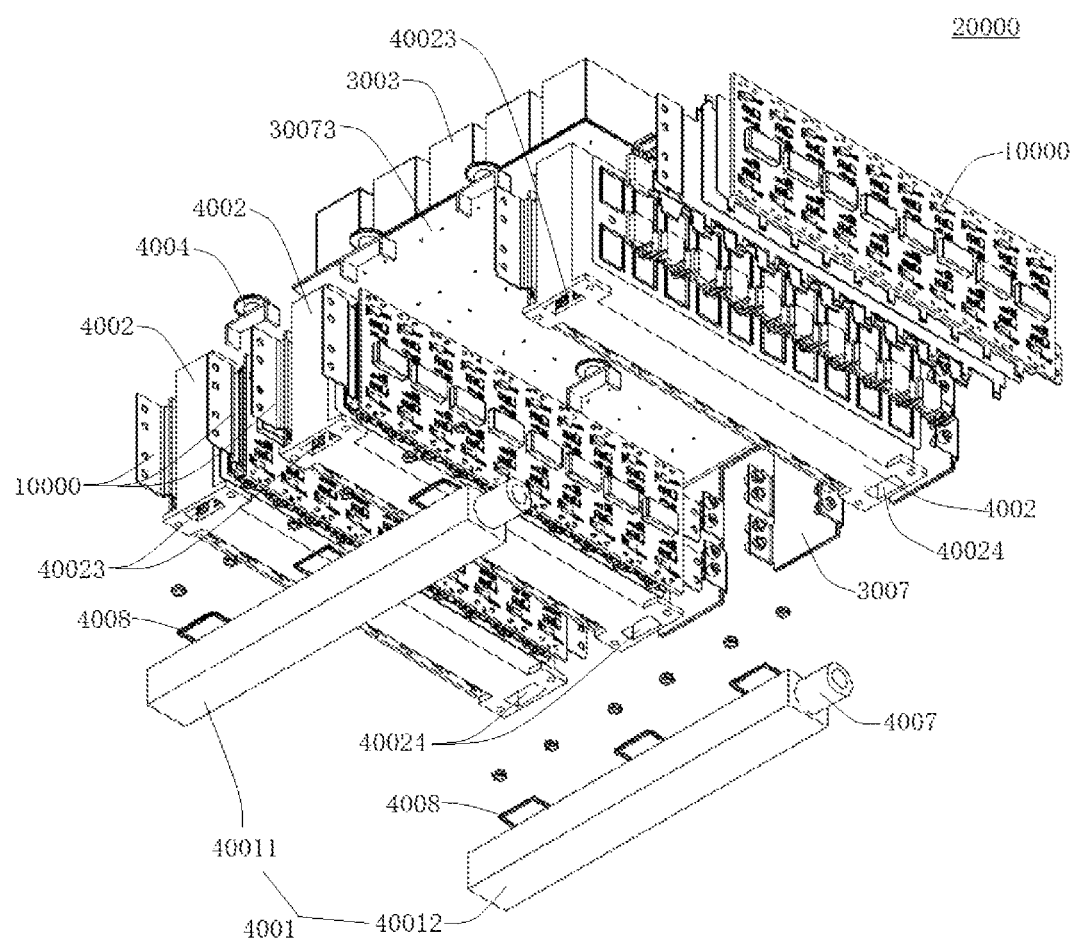

Referring to FIG. 56, the first underframe 40011 is provided with a first underframe interface 400111 in communication with the first cooling chamber, the second underframe 40012 is provided with a second underframe interface 400121 in communication with the second cooling chamber, the mounting branch-arm 4002 is provided with a branch-arm first interface 40023 and a branch-arm second interface 40024 that are in communication with the branch-arm cooling chamber, the branch-arm first interface 40023 is in communication with the first underframe interface 400111, and the branch-arm second interface 40024 is in communication with the second underframe interface 400121.

Taking a case where the first medium port 4006 is a medium inlet and the second medium port 4007 is a medium outlet as an example, the cooling medium flows through the first medium port 4006 into the first cooling chamber in the first underframe 40011, then enters, through each first underframe interface 400111 and the corresponding branch-arm first interface 40023, into each branch-arm cooling chamber, then flows into the second cooling chamber in the second underframe 40012 through the corresponding branch-arm second interface 40024 and the second underframe interface 400121, and finally flows out through the second medium port 4007.

A sealing ring 4008 can be provided between the branch-arm first interface 40023 and the first underframe interface 400111, to prevent the cooling medium from leaking from where the mounting branch-arm 4002 is connected to the first underframe 40011. A sealing ring 4008 may be provided between the branch-arm second interface 40024 and the second underframe interface 400121, to prevent the cooling medium from leaking from where the mounting branch-arm 4002 is connected to the second underframe 40012.

As shown in FIGS. 17-19, 29-30, and 54-57, at least one side surface of two reversely arranged side surfaces of each of the mounting branch-arms 4002 is mounted with the power module 10000. For example, the power module 10000 can be mounted on only one side surface of the mounting branch-arm 4002, and both the two reversely arranged side surfaces of the mounting branch-arm 4002 can be mounted with the power module 10000, thereby increasing the number of the power modules 10000.

Figure 21:
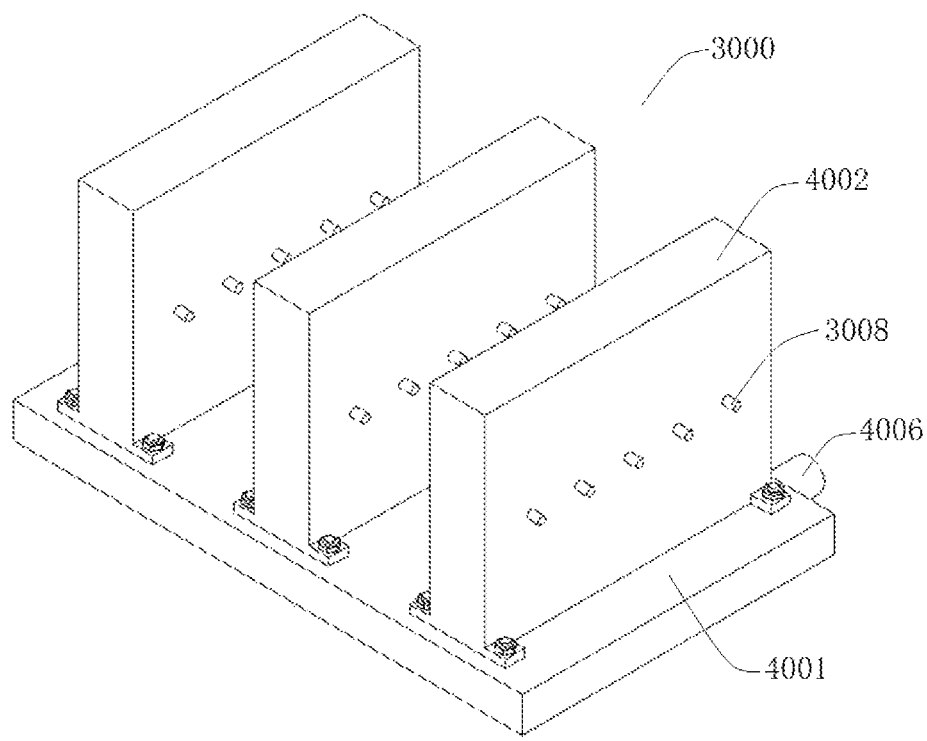
FIG. 21 is a perspective schematic view of a mounting frame of a first embodiment.

One of the mounting branch-arm 4002 and the power module 10000 is provided with a positioning protrusion 3008, and the other is provided with a positioning recess adapted to position and mate with the positioning protrusion 3008, as shown in FIGS. 21 and 31, the positioning protrusion 3008 is provided on the mounting branch-arm 4002, thereby achieving the positioning and installation of the power module 10000 on the mounting branch-arm 4002.

Referring to FIGS. 17-19, FIGS. 29-30, FIGS. 54-57, the capacitor 3003 is located on top of the mounting frame 3000.

Further, the inverter power assembly 20000 may further include: a first polar plate 3006 and a second polar plate 3007. The first polar plate 3006 and the second polar plate 3007 are arranged at an end of the power module 10000, and both the power module 10000 and the capacitor 3003 are electrically connected to the first polar plate 3006 and the second polar plate 3007. In other words, the first polar plate 3006 and the second polar plate 3007 are components that electrically connect the power module 10000 with the capacitor 3003, and by providing the first polar plate 3006 and the second polar plate 3007, an indirect electrical connection between the power module 10000 and the capacitor 3003 is achieved. The first polar plate 3006 may be arranged at a side of the second polar plate 3007 facing away from the mounting frame 3000.

Further, there may be one or more capacitors 3003. The capacitor 3003 has a first terminal and a second terminal, the first terminal is adapted to be electrically connected to the first polar plate 3006, and the second terminal is adapted to be electrically connected to the second polar plate 3007. The first terminal and the second terminal of the capacitor 3003 are conductive parts, and other parts of the capacitor 3003 have insulating surfaces, to improve safety of the capacitor 3003 in use.

Further, a first capacitor connecting portion 30063 is provided on the first polar plate 3006, and the first terminal is electrically connected to the first capacitor connecting portion 30063. A second capacitor connecting portion 30073 is provided on the second polar plate 3007, and the second terminal is electrically connected to the second capacitor connecting portion 30073. When the terminal is electrically connected to a corresponding capacitor connecting portion, in some alternative embodiments, an end of the terminal can be directly attached to a conductive portion on a surface of the capacitor connecting portion, so as to achieve the electrical connection between the terminal and the corresponding capacitor connecting portion; and in other alternative embodiments, a terminal hole may be provided on the capacitor connecting portion, and the terminal can pass through the terminal hole to be electrically connected to a hole wall of the terminal hole, so as to achieve the electrical connection between the terminal and the capacitor connecting portion. The terminal and the corresponding capacitor connecting portion can also be connected by a wire.

Specifically, referring to FIGS. 18-19, 30, and 54-57, the first capacitor connecting portion 30063 and the second capacitor connecting portion 30073 are configured as plate-shaped structures located between the capacitor 3003 and the mounting frame 3000. The first capacitor connecting portion 30063 may be perpendicular to the first polar plate 3006, and the second capacitor connecting portion 30073 may be perpendicular to the second polar plate 3007. In addition, the first capacitor connecting portion 30063 and the first polar plate 3006 can be formed by bending one plate, and the second capacitor connecting portion 30073 and the second polar plate 3007 can be formed by bending one plate.

Referring to FIG. 6, FIGS. 17-19, FIGS. 29-30, FIGS. 54-57, the power module 10000 has a first busbar 201 and a second busbar 202, the first busbar 201 is electrically connected to the first polar plate 3006, and the second busbar 202 is electrically connected to the second polar plate 3007.

Further, the first polar plate 3006 is provided with a first polar piece 30061, and the first polar piece 30061 extends towards the power module 10000, and the first polar piece 30061 is adapted to be electrically connected to the first busbar 201. The second polar plate 3007 is provided with a second polar piece 30071, the second polar piece 30071 extends towards the power module 10000, and the second polar piece 30071 is adapted to be electrically connected to the second busbar 202.

The first capacitor connecting portion 30063 and the first polar piece 30061 of the first polar plate 3006, and the second capacitor connecting portion 30073 and the second polar piece 30071 of the second polar plate 3007 are conductive parts, and other parts may have insulating surfaces, to improve safety of the first polar plate 3006 and the second polar plate 3007 in use.

Further, the first busbar 201 has a first busbar adapter end plate 2012, and the first polar piece 30061 and the first busbar adapter end plate 2012 are fixedly connected by a first bolt 30062, to achieve an electrical connection between the first polar piece 30061 and the first busbar adapter end plate 2012. The second busbar 202 has a second busbar adapter end plate 2022, and the second polar piece 30071 and the second busbar adapter end plate 2022 are fixedly connected by a second bolt 30072, to achieve an electrical connection between the second polar piece 30071 and the second busbar adapter end plate 2022.

The number of the power modules 10000, the number of the first polar pieces 30061, and the number of the second polar pieces 30071 are equal.

In some unknown embodiments, the mounting frame 3000 has a plurality of mounting areas located in the same plane, a plurality of the power modules 10000 is mounted in a tiled manner in the corresponding mounting areas, and the capacitor 3003 is arranged at a side of the plurality of the power modules 10000 facing away from the mounting frame 3000.

The inverter power assembly 20000 according to other embodiments of the present disclosure will be described in detail below with reference to FIGS. 40-53.

Referring to FIGS. 40-53, the inverter power assembly 20000 according to the embodiment of the present disclosure can include: a mounting frame 3000, a power module 10000 and a capacitor 3003, the power module 10000 is installed on mounting frame 3000. The power module 10000 is mounted on the mounting frame 3000, leading a compact layout of the power module 10000, which in turn leads to a compact structure of the entire inverter power assembly 20000. The capacitor 3003 is electrically connected to the power module 10000.

The inverter power assembly 20000 according to the embodiment of the present disclosure has the power module 10000 mounted on the mounting frame 3000 and the capacitor 3003 electrically connected to the power module 10000, thereby leading to a simple, compact, and reasonable arrangement for the structure of the entire inverter power assembly 20000.

In the embodiments shown in FIGS. 40-53, the mounting frame 3000 is constructed as a flat mounting frame, and at least one side surface of two reversely arranged side surfaces of the mounting frame 3000 is mounted with the power module 10000. For example, the power module 10000 can be mounted on only one side surface of the mounting frame 3000, and it is also possible that, as shown in FIGS. 40-43, the two reversely arranged side surfaces of the mounting frame 3000 are each provided with the power modules 10000, thereby increasing the number of the power modules 10000 in this case.

Specifically, two reversely arranged side surfaces are side surfaces with a largest area of the mounting frame 3000 shown, which can provide a relatively large space for mounting the power module 10000, such that a plurality of the power modules 10000 can be mounted on the same mounting frame 3000, thereby increasing a capacity of the inverter power assembly 20000.

Alternatively, one of the at least one side surface and the power module 10000 is provided with a positioning protrusion 3008, and the other is provided with a positioning recess adapted to position and mate with the positioning protrusion 3008. Referring to FIGS. 44-49 and 53, the two reversely arranged side surfaces of the mounting frame 3000 are each provided with the positioning protrusion 3008 to facilitate the positioning of the power module 10000, to achieve the positioning and installation of the power module 10000 on the mounting frame 3000.

The mounting frame 3000 according to some embodiments of the present disclosure is described below with reference to FIGS. 45-48, and by providing the fixing member 2a in the mounting frame 3000, the connecting member passes through the side wall of the mounting frame 3000 and is fixedly connected to the fixing member 2a, to tightly press the power module 10000 against the housing 1a, which is beneficial to increase the connection depth between the connecting member and the mounting frame 3000, to improve the mounting stability of the power module 10000.

Figure 45:
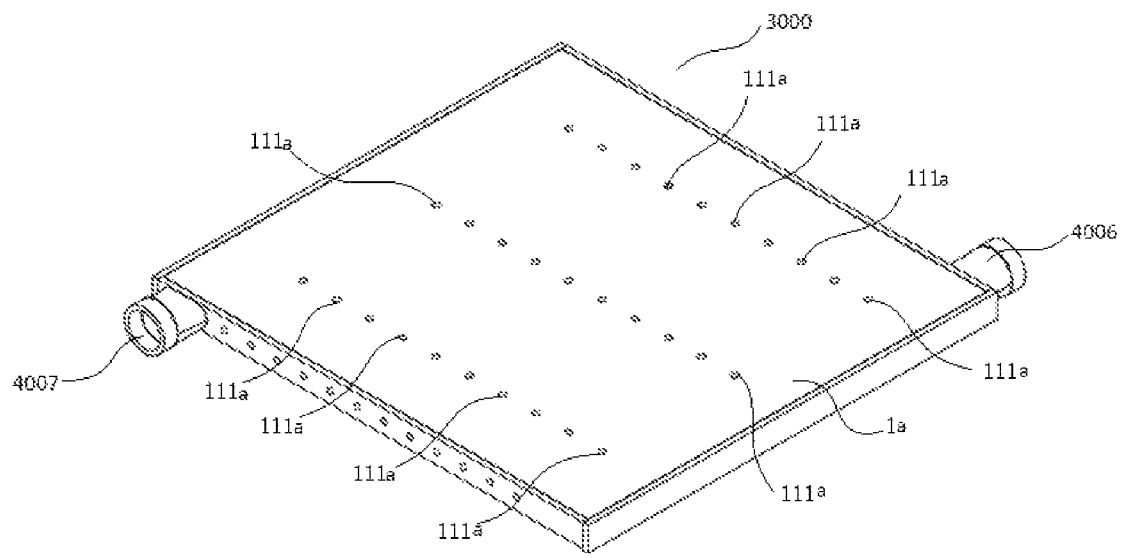
FIG. 45 is a perspective schematic view of a mounting frame according to some other implementations of the third embodiment.
Figure 46:
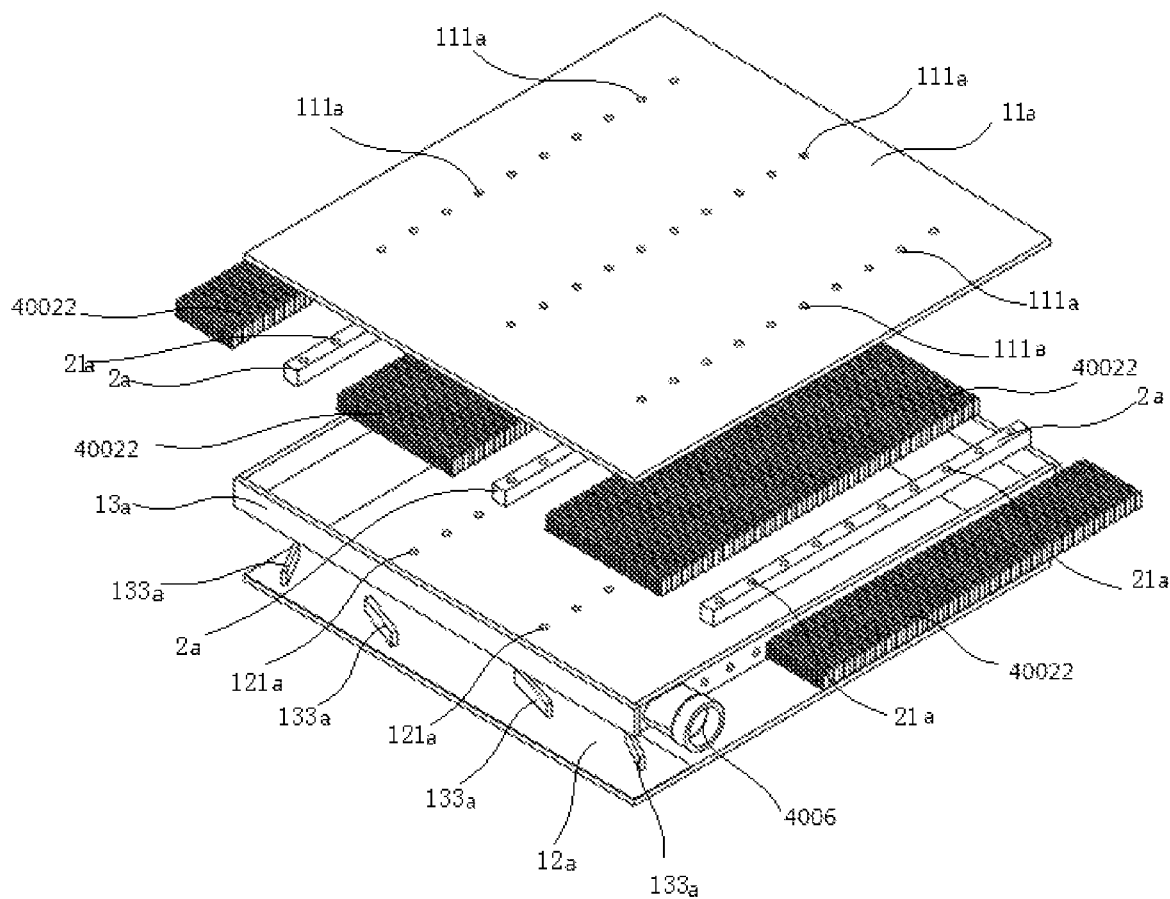
FIG. 46 is an exploded view of a mounting frame according to some other implementations of the third embodiment.

As shown in FIGS. 45 and 46, the mounting frame 3000 according to the embodiment of the present disclosure includes: a housing 1a and a fixing member 2a.

A cooling chamber 4005 is formed in the housing 1a, and a heat exchange member is provided in the cooling chamber 4005. As shown in FIG. 45, a side wall of the housing 1a is provided with a first medium port 4006 and a second medium port 4007, and the heat exchange member is installed in the cooling chamber 4005 and formed with a heat exchange flow channel communicating from the first medium port 4006 to the second medium port 4007, in this way, the first medium port 4006 and the second medium port 4007 of the mounting frame 3000 can be communicated with an external heat exchange pipeline, so that an external heat exchange medium can enter the cooling chamber 4005, then the mounting frame 3000 can dissipate heat for the power module 10000. It should be noted that the heat exchange member in the present disclosure can be flexibly and optionally installed according to actual needs, that is, the heat exchange member can be provided in the cooling chamber 4005 in order to dissipate heat through the heat exchange member, or the structure of the housing 1a itself can still be used for heat dissipation without providing the heat exchange member in the cooling chamber 4005.

The housing 1a is provided with connecting holes, as shown in FIG. 45, there are a plurality of connecting holes, and the plurality of the connecting holes are distributed in the housing 1a at intervals. The connecting hole penetrates through the housing 1a, that is, the connecting member can penetrate through the housing 1a from the outside of the housing 1a and is inserted into the housing 1a. The fixing member 2a is installed in the cooling chamber 4005. It should be noted that the various components of the mounting frame 3000 in present disclosure can be fixedly installed by brazing, that is, after the fixing member 2a and the heat exchange member are installed in the housing 1a, the fixing member 2a and the heat exchange member are fixed in the housing 1a by brazing, in order to make positions of the fixing member 2a and the heat exchange member in the housing 1a relatively stable.

As shown in FIG. 46, the fixing member 2a is provided with a fixing hole 21a, the fixing hole 21a and the connecting hole are arranged directly opposite in the thickness direction of the mounting frame 3000, and the connecting member is adapted to pass through the connecting hole to fit to the fixing hole 21a to fix the power module 10000 to the housing 1a. In other words, after the power module 10000 is installed and fitted to the housing 1a, the connecting member can pass through the connecting hole to be inserted into the housing 1a and be connected and fitted with the fixing hole 21a of the fixing member 2a, and the connecting member tightly presses the power module 10000, so as to realize the fixed installation of the power module 10000, and a tablet structure 20 may be provided at the power module 10000 to tightly press the power module 10000 towards the housing 1a, and the connecting member may be a bolt, and a head of the bolt is pressed into the groove of the tablet structure 20. The fixing member 2a may be made of a metal material having a relatively strong structural strength, so that the fixing member 2a has a relatively strong structural strength, to ensure that the fixing member 2a is not easily deformed when the connecting member is connected and fitted with the fixing member 2a. The metal material for the fixing member 2a, could be selected from aluminum alloy, magnesium alloy, steel, etc. Preferably, the tensile strength after brazing of the metal material could be over 150 MPa. High strength aluminum alloy is preferential, mainly based on Al—Cu—Mg or Al—Zn—Mg—Cu alloy, namely 2XXX series or 6XXX series or 7XXX series alloy.

It should be noted that the power module 10000 in present disclosure may be a material element of different types and in different fields. For example, the power module 10000 may be a power device such as an IGBT, a transistor, or other elements having heat-generating characteristics, for example, the power module 10000 may be an electric heating wire, a thermistor, a conductive painting material, or an electric heating film and so on. Alternatively, when the power module 10000 is applied in industries, the power module 10000 may be made of an alloy material, or a silicon-carbon element and a silicon-molybdenum element, and specifically, it may be a silicon-molybdenum rod, a silicon-carbon rod, a molybdenum wire, a molybdenum tip, or a molybdenum electrode. Therefore, the mounting frame 3000 in the present disclosure can dissipate heat for a corresponding heat generating element.

It should be noted that the fixing hole 21a in present disclosure may be a threaded hole, and an outer peripheral wall of the connecting member may be provided with an external thread, in this way, after the connecting member is inserted into the housing 1a, the connecting member can be inserted into the fixing hole 21a in order to be threadedly connected with the fixing member 2a, such that when the connecting member installs and fixes the power module 10000, the connection depth of the connecting member in the mounting frame 3000 can be increased without increasing the wall thickness of the housing 1a of the mounting frame 3000, thereby improving the installation stability of the power module 10000 in the mounting frame 3000. Without doubt, the fixing hole 21a can also be configured as a through hole, so that the connecting member penetrates the connecting hole and penetrates the fixing hole 21a to fix the power module 10000 to the housing 1a, thus, the connection stability between the power module 10000 and the mounting frame 3000 can also be increased.

Moreover, in the specific implementation, after the mounting frame 3000 is brazed as a whole, a hole can be drilled on the fixing member 2a, after drilling the hole, threads are tapped inside the hole, and a hole is drilled on the housing 1a, to fix the tablet structure 20 by bolts from upper and lower directions, to realize the fixing of the power module 10000. Therefore, thicknesses of the upper and lower surfaces of the mounting frame 3000 can be maintained at optimal thicknesses, and the processing is the most convenient, one-time drilling and one-time tapping directly are enough, with simplest process, lowest cost, and highest installation accuracy. It should be noted that after the fixing member 2a is installed in the housing 1a and fixed by brazing, the fixing member 2a is attached to the inner wall of the cooling chamber 4005, to separate the fixing hole 21a and the connecting hole from the cooling chamber 4005, so as to prevent the heat exchange medium in the cooling chamber 4005 from flowing out of the fixing member 2a.

The mounting frame 3000 according to the embodiment of the present disclosure has the fixing member 2a arranged in the housing 1a of the mounting frame 3000 and has the connecting member for tightly pressing the power module 10000 be inserted into the housing 1a in order to be connected and fixed with the fixing member 2a, such that the connection depth of the connecting member in the housing 1a is increased without increasing the wall thickness of the housing 1a, which is beneficial to reduce the cost and can ensure the connection stability of the power module 10000 on the mounting frame 3000.

In some embodiments, a heat exchange member is provided in the cooling chamber 4005, the heat exchange member includes at least one fin 40022, and the at least one fin 40022 and the fixing member 2a are arranged in the cooling chamber 4005, that is, the fin 40022 can be set to one, two or more, and when there are a plurality of fins 40022, the plurality of the fins 40022 may be respectively located on both sides of the fixing member 2a.

That is to say, the heat exchange member in present disclosure adopts a split-type structure having a plurality of fins 40022, in order to achieve a heat exchange effect in the cooling chamber 4005 at the same time through the plurality of the fins 40022, and the fixing member 2a can be installed between the plurality of fins 40022, in this way, the fixing member 2a can be prevented from being installed at an edge position in the cooling chamber 4005, so that the connecting member can be inserted from an area near middle of the housing 1a into the housing 1a in order to be connected with the fixing member 2a, so as to make binding effects of the connecting member on respective positions of the power module 10000 more balanced, which is beneficial to improve the installation stability of the power module 10000.

In some embodiments, there is at least one fixing member 2a, that is, there can be one, two or more fixing members 2a, and at least one fixing member 2a and at least one fin 40022 are distributed alternately, in this way, the fins 40022 are provided on both sides of each fixing member 2a, such that after fixing the power module 10000 with the fixing member 2a, the fins 40022 located on both sides of the fixing member 2a can maximize heat dissipation of the power module 10000 corresponding to this fixing member 2a, to improve the heat dissipation effect of the power module 10000 and improve arrangement rationality of the fin 40022.

In some embodiments, the heat exchange member includes a turbulence structure configured in a spherical shape and/or configured in a columnar shape. For example, a plurality of the spaced apart spherical turbulence structures are separately provided in the cooling chamber 4005, or a plurality of the spaced apart columnar turbulence structures are separately arranged in the cooling chamber 4005, without doubt, a plurality of the spherical turbulence structures and a plurality of the columnar turbulence structures can also be provided in the cooling chamber 4005 at the same time, so as to increase the heat exchange effect in the cooling chamber 4005 through the arrangement of the turbulence structures.

A plurality of fixing members 2a are arranged in the cooling chamber 4005, so that the plurality of the fixing members 2a are respectively used to fix different power modules 10000, in other words, a plurality of groups of the power modules 10000 can be installed on an outer side of the housing 1a, the plurality of the groups of the power modules 10000 are spaced apart and arranged on the outer side of the housing 1a, and the plurality of the power modules 10000 can be connected and fixed to the plurality of the fixing members 2a through the connecting members, respectively.

Figure 47:
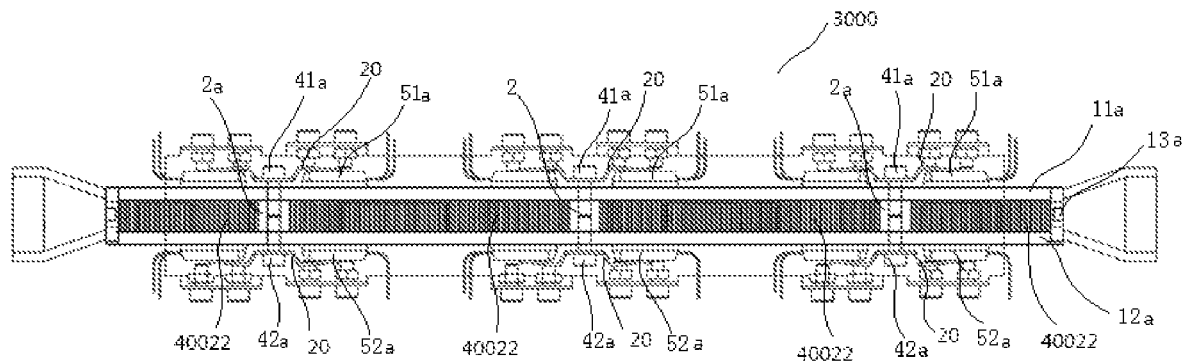
FIG. 47 is an assembled view of a mounting frame and a power module according to some other implementations of the third embodiment.

As shown in FIG. 46, there are 3 fixing members 2a and 4 fins 40022, and the 3 fixing members 2a and the 4 fins 40022 are distributed alternatively, that is, both sides of each fixing member 2a are respectively provided with one fin 40022. As shown in FIG. 47, three groups of the power modules 10000 are installed on an outer side (such as an upper side) of the housing 1a, the three groups of the power modules 10000 correspond to the three fixing members 2a respectively, each group of the power modules 10000 is press-fitted on the housing 1a through one tablet structure 20, and it is connected and fixed with the corresponding fixing member 2a through the connecting member being inserted into the housing 1a, as a result, a plurality of groups of the power modules 10000 can be fixed and installed, to increase the number of the power modules 10000 installed on the mounting frame 3000, and to reduce the heat dissipation cost of the power modules 10000.

In some embodiments, there is at least one for both the fixing hole 21a and the connecting hole, the at least one fixing hole 21a is in one-to-one correspondence to the at least one connecting hole, that is, the fixing hole 21a and the connecting hole can be set to one, two or more. In other words, each fixing member 2a can be provided with a plurality of fixing holes 21a, and the plurality of the connecting holes are provided on the housing 1a at positions corresponding to the plurality of the fixing holes 21a, in order to connect and fix the power module 10000 with the fixing member 2a at a plurality of different positions through a plurality of the connecting members, making it beneficial to increase the installation stability of the power module 10000.

In some embodiments, the fixing member 2a is configured into a strip-shape, and a plurality of fixing holes 21a are arranged sequentially spaced apart along the length direction of the fixing member 2a, such that the fixing member 2a can be used for installation and connection with the power module 10000 at a plurality of positions in the length direction at the same time.

As shown in FIG. 46, the fixing member 2a is provided with 10 fixing holes 21a in the length direction, and as shown in FIG. 45, three rows of connecting holes are provided on the housing 1a, each of the rows includes 10 connecting holes, and after the fixing member 2a is installed and fixed to the housing 1a, the 10 fixing holes 21a are in one-to-one correspondence to the 10 connecting holes, in this way, one group of power modules 10000 can be connected and fixed with the fixing member 2a by the 10 connecting members respectively penetrating into the 10 connecting holes and the 10 fixing holes 21a, thereby greatly increasing the installation stability of the power module 10000 and the housing 1a.

As in some embodiments, the fixing member 2a is configured as a metal strip, and a plurality of fixing holes 21a are sequentially arranged spaced apart along the length direction of the metal strip. That is, the fixing member 2a in the present disclosure can be configured as a long strip structure, a plurality of the spaced fixing holes 21a are provided in the length direction of the fixing member 2a, and the fixing member 2a is suitable for being fixed to the inner wall of the cooling chamber 4005 by brazing, so as to realize the installation and fixing of the fixing member 2a in the cooling chamber 4005, and to ensure the stability of the fixing member 2a.

As in other embodiments, the inner wall of the cooling chamber 4005 is provided with a fixing groove, the fixing member 2a is installed in the fixing groove, and the fixing member 2a is glued and fixed to the inner wall of the fixing groove. It can be understood that the fixing member 2a is a non-metal member or a metal member and can be installed in a manner of bonding and fixing with the fixing groove, and the installation structure is flexible, and the applicability is strong.

In some embodiments, the housing 1a includes an upper cover 11a, a lower cover 12a, and a side frame 13a. As shown in FIG. 46, the side frame 13a is formed into a quadrangular frame structure, and upper and lower ends of the side frame 13a are open, the upper cover 11a and the lower cover 12a are respectively used to close the upper and lower ends of the side frame 13a, such that the upper cover 11a, the lower cover 12a and the side frame 13a jointly define the cooling chamber 4005.

In some embodiments, as shown in FIG. 46, the connecting hole includes an upper connecting hole 111a, the upper connecting hole 111a is provided on the upper cover 11a, the power module 10000 includes a first power module 51a located at an upper side of the housing 1a, and the upper connecting hole 111a is used to connect with the first power module 51a located at an upper side of the housing 1a.

In some embodiments, the fixing hole 21a is configured as a through hole penetrating in the thickness direction of the fixing member 2a, and the connecting member penetrates the fixing hole and the upper connecting hole in order to fix the first power module 51a to the housing 1a. In other words, an upper connecting hole 111a penetrating in the thickness direction can be provided on an upper wall surface of the housing 1a, and a fixing hole 21a directly opposite to the upper connecting hole 111a is provided on the fixing member 2a, in this way, the connecting member can sequentially penetrate through the upper connecting hole 111a and the fixing hole 21a from top to bottom, or the connecting member can also sequentially penetrate through the fixing hole 21a and the upper connecting hole 111a from bottom to top, and both connection modes can effectively realize the fixed installation of the first power module 51a and the housing 1a.

In some embodiments, the power module 10000 includes a second power module 52a located at the lower side of the housing 1a, the connecting hole further includes a lower connecting hole 121a, and the lower connecting hole 121a is used for connecting with the second power module 52a located at the lower side of the housing 1a.

That is, when the first power module 51a and the second power module 52a are fixedly installed in the housing 1a, the first power module 51a can be installed at the upper side of the housing 1a, and the second power module 52a can be installed at the lower side of the housing 1a, and the fixed connection between the first power module 51a and the housing 1a is realized by the connecting member penetrating the upper connecting hole 111a and the fixing member 2a, and the second power module 52a is fixedly connected to the housing 1a by the connecting member penetrating the lower connecting hole 121a and the fixing member 2a.

In some embodiments, the fixing hole 21a is configured as a through hole penetrating along the thickness direction of the fixing member 2a and/or a blind hole. It can be understood that when there is only one fixing hole 21a, the fixing hole 21a may be a through hole or a blind hole, and when there are a plurality of the fixing holes 21a, all the plurality of the fixing holes 21a can be configured as through holes, or all the fixing holes 21a may be configured as blind holes, and some of the plurality of the fixing holes 21a may be configured as blind holes and the other fixing holes 21a may be configured as through holes. When the fixing hole 21a is configured as a through hole, the fixing hole 21a penetrates from the upper side surface of the fixing member 2a to the lower side surface of the fixing member 2a, in other words, the connecting member can penetrate the fixing hole 21a from the upper side of the fixing hole 21a and extend to the lower side of the fixing member 2a, or the connecting member can penetrate the fixing hole 21a from the upper side of the fixing member 2a and extend to the lower side of the fixing member 2a, alternatively, the connecting member may penetrate the fixing hole 21a from the lower side of the fixing member 2a and extend to the upper side of the fixing member 2a.

In some embodiments, as shown in FIG. 47, the connecting member includes an upper connecting member 41a, and the upper connecting member 41a passes through the upper connecting hole 111a and the fixing hole 21a to fix the first power module 51a to the housing 1a.

In other embodiments, the connecting member further includes a lower connecting member 42a, and the lower connecting member 42a passes through the lower connecting hole 121a and the fixing hole 21a in order to fix the second power module 52a to the housing 1a. That is, the first power module 51a and the second power module 52a can be fixedly installed on the housing 1a through the upper connecting member 41a and the lower connecting member 42a respectively, which is beneficial to improve the flexibility of the installation of the first power module 51a and the second power module 52a, and when the first power module 51a and the second power module 52a are installed or replaced, both the first power module 51a and the second power module 52a can be assembled and disassembled separately, and this helps reduce replacement costs.

In some embodiments, the fixing hole 21a is configured as a through hole penetrating in the thickness direction of the fixing member 2a, and the connecting member penetrates through the upper connecting hole 111a, the fixing hole 21a and the lower connecting hole 121a to fix the first power module 51a and the second power module 52a to the housing 1a, that is, the connecting member is an integral piece, and the connecting member can directly penetrate the upper connecting hole 111a, the fixing hole 21a and the lower connecting hole 121a, that is, the connecting member directly penetrates the housing 1a, to fixedly install the first power module 51a and/or the second power module 52a on the upper and lower sides of the housing 1a, then the first power module 51a and the second power module 52a can be fixed individually or simultaneously, as a result, the installation efficiency of the first power module 51a and the second power module 52a is greatly improved, and the installation cost is saved.

In other embodiments, the fixing hole 21a includes an upper fixing hole 21a provided on the upper surface of the fixing member 2a and/or a lower fixing hole 21a provided on the lower surface of the fixing member 2a, and the upper fixing hole 21a and/or the lower fixing hole 21a are configured as blind holes, that is, the upper fixing hole 21a has an upper end open and has a lower end closed, the connecting member can be inserted from an upper end of the upper fixing hole 21a, the lower fixing hole 21a has a lower end open and has an upper end closed, and the connecting member can be inserted from the lower end of the lower fixing hole 21a, in this way, the fixing hole 21a is a non-through hole structure, which helps to ensure the structural strength and stability of the fixing member 2a and also helps to reduce difficulty of drilling the fixing hole 21a. It can be configured in such a way that the fixing hole 21a is provided only on the upper surface of the fixing member 2a and the lower surface of the fixing member 2a is a flat surface, or the lower fixing hole 22 is provided only on the lower surface of the fixing member 2a and the upper surface of the fixing member 2a is a flat surface, alternatively, the upper surface of the fixing member 2a is provided with the upper fixing hole 21a while the lower surface of the fixing member 2a is provided with the lower fixing hole 22.

The connecting member includes an upper connecting member 41a and/or a lower connecting member 42a, the upper connecting member 41a penetrates the upper connecting hole 111a and the upper fixing hole 21a to fix the first power module 51a to the housing 1a, and the lower connecting member 42a penetrates the lower connecting hole 121a and the lower fixing hole 21a to fix the second power module 52a to the housing 1a, thus, the first power module 51a and the second power module 52a can be fixedly installed on the housing 1a through the upper connecting member 41a and the lower connecting member 42a respectively, making it beneficial to improve the flexibility of the installation of the first power module 51a and the second power module 52a, and when installing or replacing the first power module 51a and the second power module 52a, both the first power module 51*a* and the second power module 52*a* can be assembled and disassembled separately, and this helps reduce replacement costs.

In the case where the fixing hole 21*a* is provided on the upper surface of the fixing member 2*a* and the lower surface of the fixing member 2*a* is a flat surface, the fixing member 2*a* is configured to have a single-sided blind hole, the connecting member includes an upper connecting member 41*a*, and the upper connecting member 41*a* penetrates the upper connecting hole 111*a* and the upper fixing hole 21*a* to fix the first power module 51*a* to the housing 1*a*, in the case where the lower fixing hole 21*a* is provided on the lower surface of the fixing member 2*a* and the upper surface of the fixing member 2*a* is a flat surface, the fixing member 2*a* is configured to have a single-sided blind hole, the connecting member includes a lower connecting member 42*a*, and the lower connecting member 42*a* penetrates the lower connecting member and the lower fixing hole 22 to fix the second power module 52*a* to the housing 1*a*. In the case where the upper fixing hole 21*a* is provided on the upper surface of the fixing member 2*a* while the lower fixing hole 22 is provided on the lower surface of the fixing member 2*a*, the fixing member 2*a* is configured to have a double-sided blind hole, in this case, the connecting member includes an upper connecting member 41*a* and a lower connecting member 42*a*, the upper connecting member 41*a* penetrates the upper connecting hole 111*a* and the upper fixing hole 21*a* to fix the first power module 51*a* on the upper surface of the housing 1*a*, and the lower connecting member 42*a* penetrates the lower connecting member and the lower fixing hole 22 to fix the second power module 52*a* on the lower surface of the housing 1*a*, so that different forms of assembly of the power module 10000 can be realized.

Figure 48:
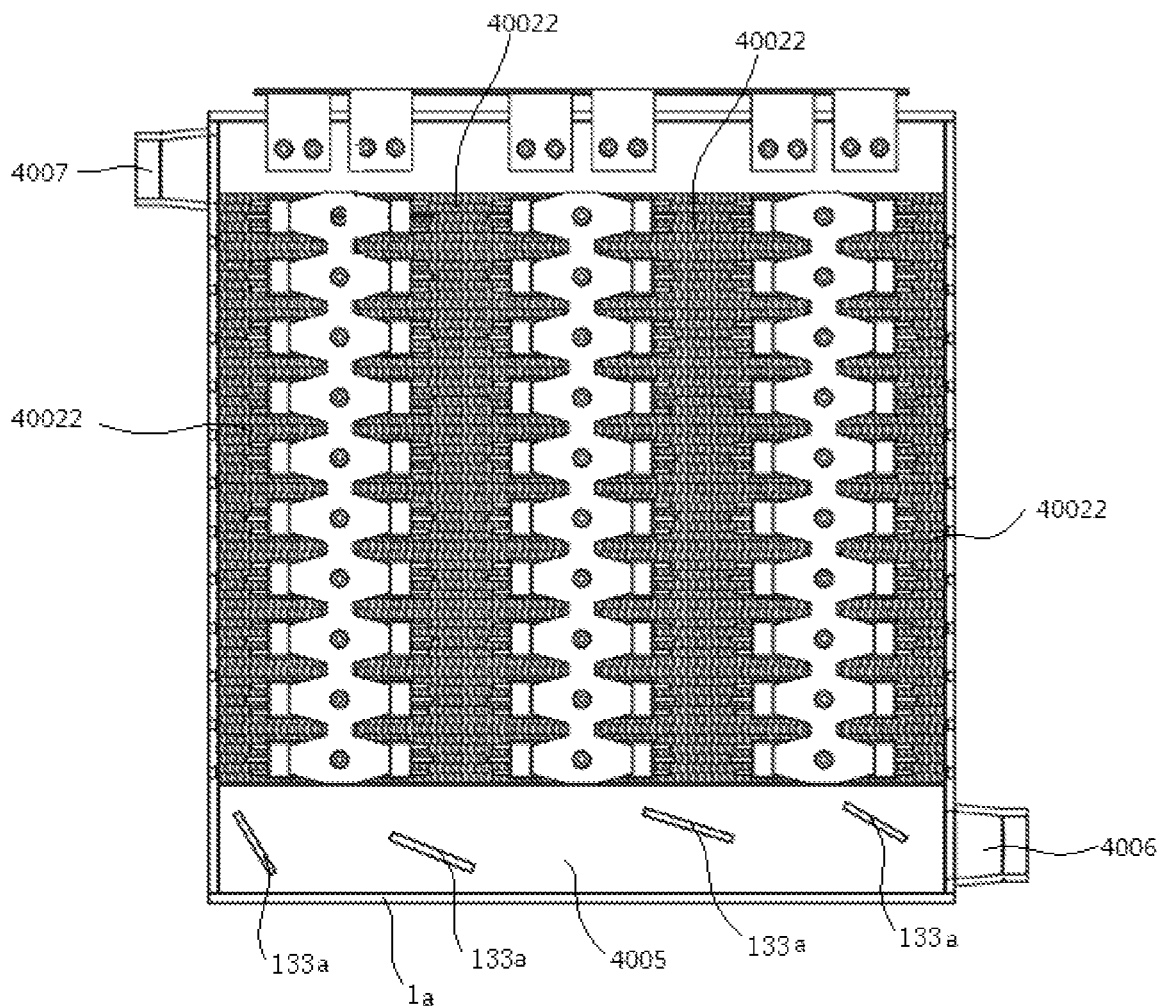
FIG. 48 is a top view of a mounting frame (without an upper cover) according to some other implementations of the third embodiment.
Figure 49:
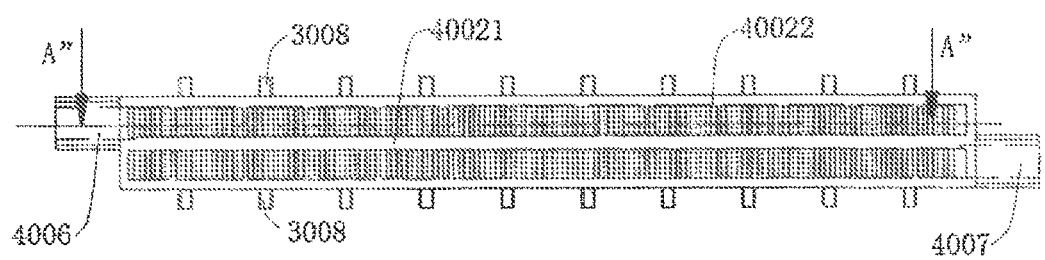
FIG. 49 is a view of a mounting frame of the third embodiment shown in FIG. 44 in an S direction.
Figure 50:
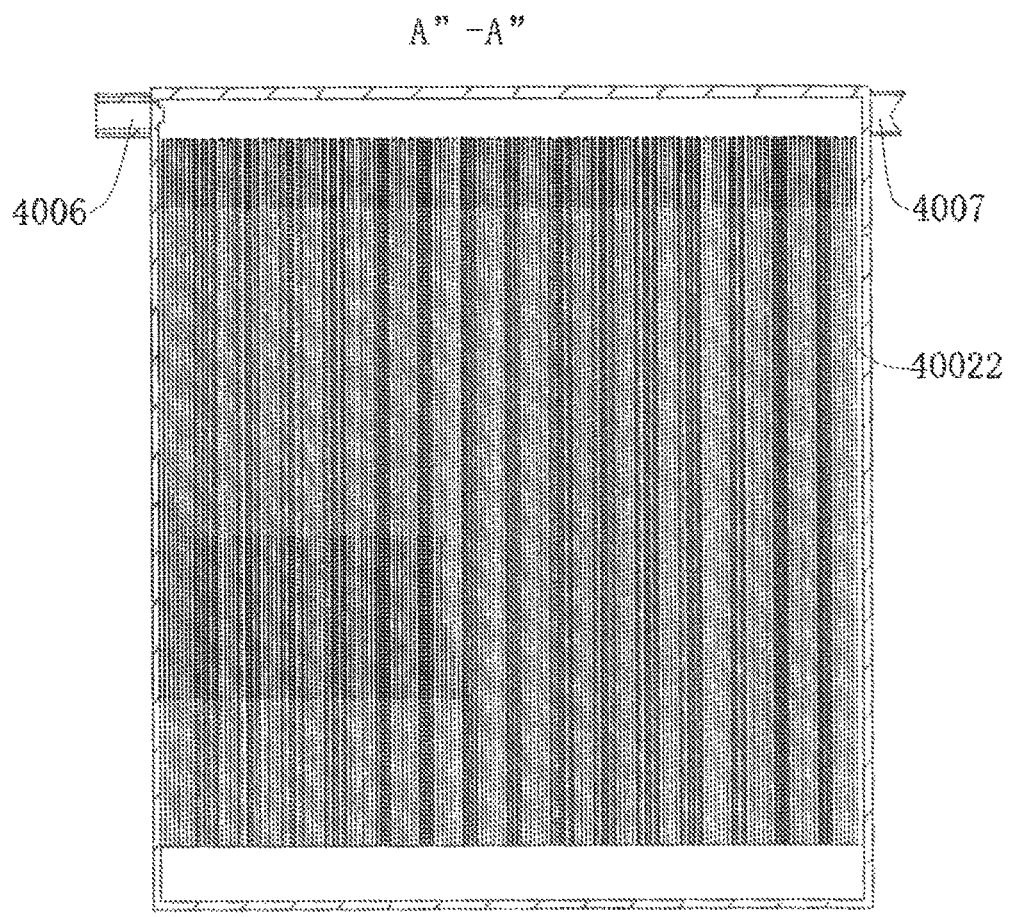
FIG. 50 is a cross-sectional view taken along A"-A" of FIG. 49.
Figure 51:
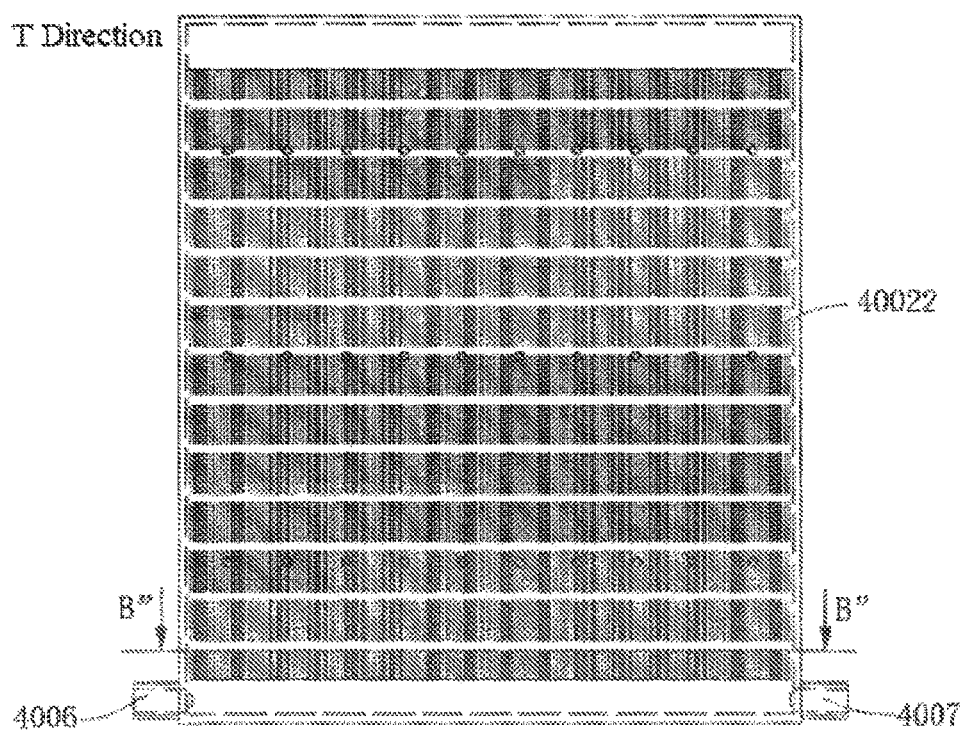
FIG. 51 is a view of a mounting frame of the third embodiment shown in FIG. 44 in a T direction.
Figure 52:
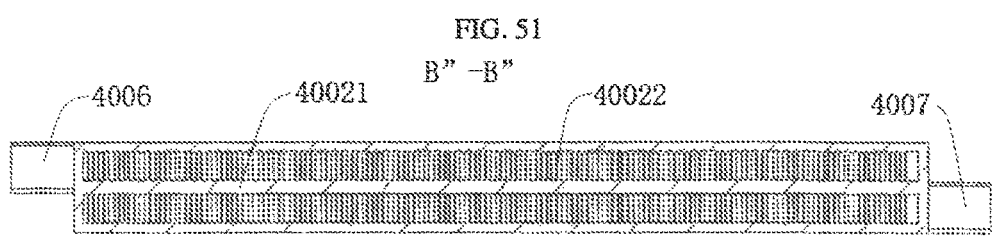
FIG. 52 is a cross-sectional view taken along B"-B" of FIG. 51.

In some embodiments, an outer side wall of the side frame 13*a* is provided with a first medium port 4006 and a second medium port 4007, and one of the first medium port 4006 and the second medium port 4007 is a medium inlet and the other one is a medium outlet. As shown in FIGS. 45 and 48, the first medium port 4006 and the second medium port 4007 are respectively provided on two oppositely arranged side walls of the side frame 13*a*, as shown in FIG. 48, the first medium port 4006 is provided in a lower area of a right side wall of the side frame 13*a*, and the second medium port 4007 is provided in an upper area of a left side wall of the side frame 13*a* (up, down, left, and right referred here only represent directions in the drawing, which do not limit actual installation directions). The two ends of the fixing member 2*a* are spaced apart from the inner side wall of the side frame 13*a*, and a heat exchange flow channel communicating from the first medium port 4006 to the second medium port 4007 is formed in the heat exchange member.

In this way, after the first medium port 4006 and the second medium port 4007 are communicated to the external pipelines, the heat exchange medium can flow in from the first medium port 4006 and flow to the second medium port 4007 through the heat exchange flow channel in the fin 40022, and the heat exchange medium can flow from a gap between the fixing member 2*a* and the side frame 13*a* to different fins 40022 and merge into the second medium port 4007, realizing circulation of the heat exchange medium to play a role of heat dissipation. The heat exchange medium can be water, hydraulic oil or other fluid medium.

In some embodiments, the first medium port 4006 is the medium inlet and the second medium port 4007 is the medium outlet, an inner surface of at least one of the upper cover 11*a* and the lower cover 12*a* is provided with a diversion plate 133*a*, the diversion plate 133*a* is located at an end of the heat exchange member close to the first medium port 4006, and the diversion plate 133*a* is configured to be inclined from the first medium port 4006 towards a direction close to the second medium port 4007. Thus, the diversion plate 133*a* can play a role of diversion in the cooling chamber 4005, such that the heat exchange medium at the first medium port 4006 can flow to each fin 40022 under an action of the diversion plate 133*a*, so as to ensure uniformity of the fin 40022.

As shown in FIG. 46 and FIG. 48, there are four diversion plates 133*a*, and the four diversion plates 133*a* are arranged to be respectively inclined at ends of the four fins 40022 from bottom to top in a direction away from the first medium port 4006, such that the heat exchange medium at the first medium port 4006 can be evenly distributed to the four fins 40022 under diversion of the four diversion plates 133*a*, thereby ensuring uniformity of heat dissipation of the mounting frame 3000 at each power module 10000, and improving the heat dissipation performance of the mounting frame 3000.

Referring to FIGS. 44-53, there is a cooling chamber 4005 in the mounting frame 3000, and the cooling medium is adapted to circulate in the cooling chamber 4005, to take away the heat generated when the power module 10000 is working, to prevent the power module 10000 from being overheated and damaged. The cooling chamber 4005 is arranged in the mounting frame 3000, and additional cooling components may be not provided, leading to the more compact structure of the inverter power assembly 20000.

Further, referring to FIG. 44, FIG. 49 and FIG. 52-FIG. 53, a partition plate 40021 is provided in the chamber of the cooling chamber 4005. The partition plate 40021 divides the cooling chamber 4005 into a first cooling sub-chamber 40054 and a second cooling sub-chamber 40055. The partition plate 40021 is separated from another inner side wall of the cooling chamber 4005 (such as a left side wall in FIG. 53), so that the first cooling sub-chamber 40054 and the second cooling sub-chamber 40055 are in communication with each other at a side of the cooling chamber 4005.

Further, referring to FIGS. 44-53, the mounting frame 3000 is provided with a first medium port 4006 in communication with the first cooling sub-chamber 40054 and a second medium port 4007 in communication with the second cooling sub-chamber 40055, one of the first medium port 4006 and the second medium port 4007 is a medium inlet, and the other is a medium outlet. For example, when the first medium port 4006 is the medium inlet and the second medium port 4007 is the medium outlet, the cooling medium flows into the first cooling sub-chamber 40054 through the first medium port 4006, then flows to the second medium port 4007 through the second cooling sub-chamber 40055, and finally flows out from the second medium port 4007.

Alternatively, the first medium port 4006, the first cooling sub-chamber 40054, the second cooling sub-chamber 40055, and the second medium port 4007 are connected in series to form a medium passage. The cooling medium circulates in the medium passage to take away the heat of the power module 10000.

Figure 53:
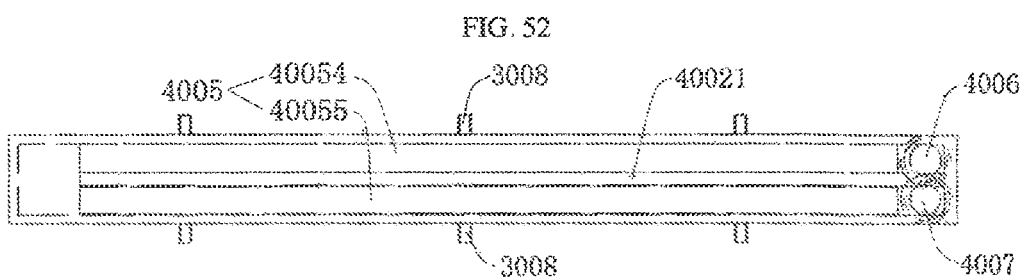
FIG. 53 is a view of a mounting frame of the third embodiment shown in FIG. 44 in a R direction.

In the embodiment shown in FIG. 53, the first cooling sub-chamber 40054 is located above the second cooling sub-chamber 40055, and in some unknown embodiments, the first cooling sub-chamber 40054 and the second cooling sub-chamber 40055 may also be arranged in the same plane.

Referring to FIG. 44 and FIG. 49-FIG. 52, a plurality of fins 40022 is provided in a chamber of the cooling chamber 4005, the plurality of the fins 40022 has one end connected to the partition plate 40021 and the other end connected to a chamber wall of the cooling chamber 4005, and a fin sub-chamber is formed between two adjacent ones of the fins 40022. The cooling medium circulates in the fin sub-chamber to take away the heat of the power module 10000. The fin sub-chamber has a relatively small cross-sectional area, which facilitates accelerating of the cooling medium.

Alternatively, the plurality of the fins 40022 are parallel to each other. Preferably, there is a consistent spacing between two adjacent fins 40022, which leads to a consistent cross-sectional areas of respective fin sub-chambers, thereby ensuring a consistent flow rate of the cooling medium.

Alternatively, the capacitor 3003 is located on a top or bottom of the mounting frame 3000. In the embodiments shown in FIGS. 40-43, the capacitor 3003 is located on the top of the mounting frame 3000.

Referring to FIG. 40-FIG. 43, the inverter power assembly 20000 can further include a first polar plate 3006 and a second polar plate 3007. The first polar plate 3006 and the second polar plate 3007 are arranged at an end of the power module 10000, and the power module 10000 and the capacitor 3003 are electrically connected to the first polar plate 3006 and the second polar plate 3007. In other words, the first polar plate 3006 and the second polar plate 3007 are components that electrically connect the power module 10000 with the capacitor 3003, and by providing the first polar plate 3006 and the second polar plate 3007, an indirect electrical connection between the power module 10000 and the capacitor 3003 is achieved. The first polar plate 3006 may be arranged at a side of the second polar plate 3007 facing away from the mounting frame 3000.

Further, as shown in FIG. 6 in combination, the power module 10000 has a first busbar 201 and a second busbar 202, the first busbar 201 is electrically connected to the first polar plate 3006, and the second busbar 202 is electrically connected to the second polar plate 3007.

A first polar piece 30061 is provided on the first polar plate 3006, the first polar piece 30061 extends towards the power module 10000, and the first polar piece 30061 is adapted to be electrically connected to the first busbar 201. A second polar piece 30071 is provided on the second polar plate 3007, the second polar piece 30071 extends towards the power module 10000, and the second polar piece 30071 is adapted to be electrically connected to the second busbar 202.

Further, the first busbar 201 has a first busbar adapter end plate 2012, and the first polar piece 30061 and the first busbar adapter end plate 2012 are fixedly connected by a first bolt 30062. The second busbar 202 has a second busbar adapter end plate 2022, and the second polar piece 30071 is fixedly connected to the second busbar adapter end plate 2022 by a second bolt 30072.

The inverter power assembly 20000 can further include a first terminal board 3017 and a second terminal board 3018. The capacitor 3003 has a first terminal 30031 and a second terminal 30032, the first terminal 30031 is adapted to be electrically connected to the first terminal board 3017, and the second terminal 30032 is adapted to be electrically connected to the second terminal board 3018. The first terminal 30031 and the second terminal 30032 of the capacitor 3003 are conductive parts, and other parts of the capacitor 3003 have insulating surfaces, to improve the safety of the capacitor 3003 in use. When the terminal is electrically connected to a corresponding terminal board, in some alternative embodiments, an end of the terminal can be directly attached to a conductive part on a surface of the terminal board, so as to achieve the electrical connection between the terminal and the corresponding terminal board; and in other alternative embodiments, the terminal board may be provided with a terminal hole, the terminal can pass through the terminal hole to be electrically connected to a hole wall of the terminal hole, so as to achieve the electrical connection between the terminal and the terminal board. Without doubt, the terminal and the corresponding terminal board can also be connected by a wire.

Further, the first polar plate 3006 is adapted to be electrically connected to the first terminal board 3017, and the second polar plate 3007 is adapted to be electrically connected to the second terminal board 3018.

Furthermore, the first terminal board 3017 is electrically connected to the first polar plate 3006 through the first polar piece 30061, and the second terminal board 3018 is electrically connected to the second polar plate 3007 through the second polar piece 30071.

Referring to FIGS. 40-43, the mounting frame 3000 has a first side surface facing the capacitor 3003, and a power module 10000 is provided on the first side surface; the first terminal board 3017 has a first terminal piece 30171, and the first terminal piece 30171, a first polar piece 30061 extending towards the first side surface, and a first busbar adapter end plate 2012 on the first side surface are fixedly connected by the first bolts 30062. The second terminal board 3018 has a second terminal piece 30181, and the second terminal piece 30181, a second polar piece 30071 extending towards the first side surface, and a second busbar adapter end plate 2022 on the first side surface are fixedly connected by the second bolts 30072.

Further, the mounting frame 3000 has a second side surface facing away from the capacitor 3003, and the power module 10000 is provided on the second side surface; the first polar piece 30061 extending towards the second side surface is fixedly connected to a first busbar adapter end plate 2012 on the second side surface by the first bolt 30062, and the second polar piece 30071 extending towards the second side surface is fixedly connected to a second busbar adapter end plate 2022 of the second side surface by the second bolt 30072.

In some unknown embodiments, it is possible that the power module 10000 may be provided only on the second side surface, whereas the power module 10000 is not provided on the first side surface. In this case, the first terminal piece 30171 is fixedly connected to the first polar piece 30061 extending towards the first side surface by the first bolt 30062. The second terminal board 3018 has a second terminal piece 30181 fixedly connected to the second polar piece 30071 extending towards the first side surface by a second bolt 30072. The first polar piece 30061 extending towards the second side surface is fixedly connected to the first busbar adapter end plate 2012 on the second side surface by the first bolt 30062. The second polar piece 30071 extending towards the second side surface is fixedly connected to the second busbar adapter end plate 2022 on the second side surface by the second bolt 30072.

The substrate 10 of the power module 10000 can be mounted on the mounting frame 3000, or the substrate 10 can be a part of the mounting frame 3000.

In the description of this specification, the description with reference to terms "an embodiment", "some embodiments", "examples", "specific examples" or "some examples" etc. means that specific features, structures, materials or characteristics described in conjunction with the embodiments or the examples are included in at least one embodiment or example of the present disclosure. In this specification, schematic representations of the above terms do not necessarily refer to the same embodiment or example. Moreover, the described specific features, structures, materials, or characteristics may be combined in any one or more embodiments or examples in a suitable manner. In addition, those skilled in the art can join and combine different embodiments or examples described in this specification.

Although the embodiments of the present disclosure have been shown and described above, it can be understood that the above embodiments are exemplary and cannot be construed as limiting the present disclosure, and those of ordinary skill in the art can make variations, modifications, substitutions, and modifications to the above embodiments within the scope of the present disclosure.

What is claimed is:

1. An inverter power assembly comprising
a mounting frame;
at least a power module mounted on the mounting frame; and
at least a capacitor electrically connected to the power module;
wherein the mounting frame comprises a mounting underframe and at least one mounting branch-arm vertically arranged on the mounting underframe, and wherein the power module is mounted along a side surface of the mounting branch-arm, and
wherein the mounting branch-arm and the mounting underframe are provided therein with cooling chambers that are in communication with each other, and wherein the cooling chambers comprise an underframe cooling chamber located in the mounting underframe and a branch-arm cooling chamber located in the mounting branch-arm, the branch-arm cooling chamber being in communication with the underframe cooling chamber, the mounting underframe is provided with a first medium port and a second medium port that are in communication with the underframe cooling chamber, one of the first medium port and the second medium port is a medium inlet, and the other is a medium outlet,
wherein the mounting frame further comprises a capacitor support element having one end fixed on the top of the mounting branch-arm and the opposite end adapted to support the capacitor.

2. The inverter power assembly according to claim 1, wherein a partition plate is arranged in the branch-arm cooling chamber, the partition plate divides the branch-arm cooling chamber into a branch-arm inlet chamber and a branch-arm outlet chamber, and the partition plate is separated from an inner top wall of the branch-arm cooling chamber, so that the branch-arm inlet chamber and the branch-arm outlet chamber are in communication with each other at top of the branch-arm cooling chamber, and wherein the first medium port, the underframe cooling chamber, the branch-arm inlet chamber, the branch-arm outlet chamber, and the second medium port are connected in series to form a medium passage.

3. An inverter power assembly comprising
a mounting frame;
at least a power module mounted on the mounting frame; and
at least a capacitor electrically connected to the power module;
wherein the mounting frame comprises a mounting underframe and at least one mounting branch-arm vertically arranged on the mounting underframe, and wherein the power module is mounted along the side surface of the mounting branch-arm,
wherein the mounting frame further comprises a mounting upper-frame arranged on top of the mounting branch-arm and adapted to support the capacitor, and the power module is located along the side surface of the branch-arm between the mounting upper-frame and the mounting underframe, and
wherein the mounting upper-frame, the mounting branch-arm and the mounting underframe are provided therein with cooling chambers that are in communication with each other.

4. The inverter power assembly according to claim 3, wherein the cooling chambers comprise an underframe cooling chamber located in the mounting underframe, an upper-frame cooling chamber located in the mounting upper-frame, and a branch-arm cooling chamber located in the mounting branch-arm, the mounting underframe is provided with a first medium port in communication with the underframe cooling chamber, the mounting upper-frame is provided with a second medium port in communication with the upper-frame cooling chamber, one of the first medium port and the second medium port is a medium inlet, and the other is a medium outlet, and wherein the second medium port, the upper-frame cooling chamber, the branch-arm cooling chamber, the underframe cooling chamber, and the first medium port are connected in serial to form a medium passage.

5. The inverter power assembly according to claim 1, wherein the mounting underframe comprises a first underframe and a second underframe, and the mounting branch-arm is set up on the first underframe and the second underframe, and wherein cooling chambers in communication with each other are provided in the mounting branch-arm, the first underframe and the second underframe, the first underframe is provided with a first medium port, the second underframe is provided with a second medium port, one of the first medium port and the second medium port is a medium inlet, and the other is a medium outlet.

6. The inverter power assembly according to claim 1, wherein one of the mounting frame and the power module is provided with a positioning protrusion, and the other is provided with a positioning recess adapted to position and engaged with the positioning protrusion.

7. The inverter power assembly according to claim 1, further comprising a first polar plate and a second polar plate, the first polar plate and the second polar plate are arranged at an end of the power module, and both the power module and the capacitor are electrically connected to the first polar plate and the second polar plate, and wherein the power module has a first busbar and a second busbar, the first busbar is electrically connected to the first polar plate, and the second busbar is electrically connected to the second polar plate.

8. The inverter power assembly according to claim 1, wherein the power module comprises: a substrate, wherein a first side of the substrate has a first side surface, and the substrate is mounted on the mounting frame or is a part of the mounting frame;
a tablet structure located at the first side of the substrate;
a plurality of stacked busbars, the stacked busbars are parallel to the first side of the substrate; and
a power structure pressed against the first side surface by the tablet structure and having a plurality of pins each connected to a corresponding busbar and electrically insulated from the remaining busbars.

9. An inverter power assembly comprising
a mounting frame;
a power module mounted on the mounting frame; and a capacitor electrically connected to the power module;

wherein the mounting frame is configured as a flat mounting frame, and at least one side surface of two reversely arranged side surfaces of the mounting frame is mounted with the power module, wherein a cooling chamber is provided in the mounting frame, said two reversely arranged side surfaces are side surfaces having the largest area of the mounting frame, and wherein the mounting frame comprises a housing, wherein the cooling chamber is formed in the housing, and the housing is provided with a connecting hole; and a fixing member, wherein the fixing member is installed in the cooling chamber, the fixing member is provided with a fixing hole arranged directly opposite to the connecting hole, and the connecting member is adapted to pass through the connecting hole to fit to the fixing hole in order to fix the power module to the housing.

10. The inverter power assembly according to claim 9, wherein a heat exchange member is provided in the cooling chamber, the heat exchange member comprises at least one fin, and the at least one fin and the fixing member are arranged in the cooling chamber, the number of the fixing member is at least one, and the at least one fixing member and the at least one fin are distributed alternatively.

11. The inverter power assembly according to claim 9, wherein the housing comprises an upper cover, a lower cover and a side frame, the upper cover and the lower cover are respectively used to close upper and lower ends of the side frame to define the cooling chamber, and the connecting hole includes an upper connecting hole provided on the upper cover, and a lower connecting hole provided on the lower cover.

12. The inverter power assembly according to claim 11, wherein the fixing hole is configured as a through hole and/or a blind hole penetrating in the thickness direction of the fixing member, the connecting member includes an upper connecting member, and the upper connecting member penetrates the upper connecting hole and the fixing hole to fix a first power module to the housing.

13. The inverter power assembly according to claim 11, wherein the connecting member further comprises a lower connecting member, and the lower connecting member penetrates the lower connecting hole and the fixing hole to fix a second power module to the housing.

14. The inverter power assembly according to claim 11, wherein the fixing hole comprises an upper fixing hole provided on an upper surface of the fixing member and/or a lower fixing hole provided on a lower surface of the fixing member, and the upper fixing hole and/or the lower fixing hole are configured as blind holes; wherein the connecting member includes an upper connecting member and/or a lower connecting member, the upper connecting member penetrates the upper connecting hole and the upper fixing hole to fix a first power module to the housing, and the lower connecting member penetrates the lower connecting hole and the lower fixing hole to fix a second power module to the housing.

15. The inverter power assembly according to claim 11, wherein an outer side wall of the side frame is provided with a first medium port and a second medium port, one of the first medium port and the second medium port is a medium inlet and the other one is a medium outlet, two ends of the fixing member are spaced apart from an inner side wall of the side frame, and the heat exchange member is formed therein a heat exchange flow channel communicating from the first medium port to the second medium port.

16. The inverter power assembly according to claim 9, wherein a partition plate is provided in a chamber of the cooling chamber, the partition plate divides the cooling chamber into a first cooling sub-chamber and a second cooling sub-chamber, and the partition plate is separated from another inner side wall of the cooling chamber, so that the first cooling sub-chamber and the second cooling sub-chamber are in communication with each other at a side of the cooling chamber, and wherein the mounting frame is provided with a first medium port in communication with the first cooling sub-chamber and a second medium port in communication with the second cooling sub-chamber, one of the first medium port and the second medium port is a medium inlet, and the other is a medium outlet.

17. The inverter power assembly according to claim 16, wherein the first medium port, the first cooling sub-chamber, the second cooling sub-chamber, and the second medium port are connected in serials to form a medium passage.

* * * * *